United States Patent
Utagawa et al.

(10) Patent No.: US 8,212,718 B2
(45) Date of Patent: Jul. 3, 2012

(54) MICROWAVE/MILLIMETER WAVE SENSOR APPARATUS

(75) Inventors: Hitoshi Utagawa, Koganei (JP); Toshiaki Matsui, Koganei (JP)

(73) Assignee: National Institute of Information and Communications Technology, Koganei-shi (JP)

( * ) Notice: Subject to any disclaimer, the term of this patent is extended or adjusted under 35 U.S.C. 154(b) by 356 days.

(21) Appl. No.: 12/594,433

(22) PCT Filed: Mar. 31, 2008

(86) PCT No.: PCT/JP2008/056834
§ 371 (c)(1),
(2), (4) Date: Dec. 23, 2009

(87) PCT Pub. No.: WO2008/120826
PCT Pub. Date: Oct. 9, 2008

(65) Prior Publication Data
US 2010/0117891 A1 May 13, 2010

(30) Foreign Application Priority Data
Apr. 2, 2007 (JP) .................................. 2007-096545

(51) Int. Cl.
*G01S 13/04* (2006.01)
*G01S 7/03* (2006.01)
*G01S 13/00* (2006.01)

(52) U.S. Cl. ................ 342/195; 331/107 R; 331/108 R; 331/115; 331/132; 342/27; 342/28; 342/82; 342/89; 342/175

(58) Field of Classification Search ..................... 342/21, 342/22, 27, 28, 175, 192–197, 82, 89, 104, 342/109, 188, 200–204; 331/107 R, 108 R, 331/115, 132, 133, 134, 154, 46, 56, 96; 330/53, 56; 343/700 R, 753
See application file for complete search history.

(56) References Cited

U.S. PATENT DOCUMENTS 3,160,826 A * 12/1964 Marcatili ........................ 330/56
3,231,832 A * 1/1966 Coerver ........................ 331/115
(Continued)

FOREIGN PATENT DOCUMENTS
CN 1672292 9/2005
(Continued)

OTHER PUBLICATIONS

U.S. Appl. No. 13/121,063, filed Jun. 13, 2011, Utagawa, et al.
(Continued)

*Primary Examiner* — Bernarr Gregory
(74) *Attorney, Agent, or Firm* — Oblon, Spivak, McClelland, Maier & Neustadt, L.L.P.

(57) ABSTRACT

A microwave/millimeter wave sensor apparatus including a planar radiation type oscillator substrate having an inner-layer GND interposed between a front surface side dielectric substrate and a rear surface side dielectric substrate and a pair of conductor patches in an axis-symmetric manner on the side of the front surface layer. A gate and drain of a microwave transistor are respectively connected to the conductor patches to supply power to the gate and the drain of the microwave transistor through a gate-side RF choke circuit and a drain-side RF choke circuit. An impedance line satisfying an oscillation condition is connected to a source and a transmit RF signal in an RF zone as a planar radiation type oscillator is transmitted and a receive RF signal as reflected waves is received from a measured object, thus obtaining an IF signal as the sensing information through homodyne mixing.

16 Claims, 49 Drawing Sheets

U.S. PATENT DOCUMENTS

| | | | |
|---|---|---|---|
| 3,416,098 A * | 12/1968 | Vane | 331/96 |
| 3,416,099 A * | 12/1968 | Vane | 331/96 |
| 3,443,244 A * | 5/1969 | Cook | 331/96 |
| 3,474,351 A * | 10/1969 | Cook et al. | 331/107 R |
| 3,533,016 A * | 10/1970 | Grace | 331/96 |
| 3,562,665 A * | 2/1971 | Larrabee | 331/96 |
| 3,596,204 A * | 7/1971 | Vane | 331/107 R |
| 3,603,896 A * | 9/1971 | Havens | 331/96 |
| 3,605,034 A * | 9/1971 | Rucker et al. | 330/56 |
| 3,621,463 A * | 11/1971 | Olson, Jr. | 331/107 R |
| 3,624,550 A * | 11/1971 | Vane | 331/96 |
| 3,644,843 A * | 2/1972 | Sigmon | 331/107 R |
| 3,659,293 A * | 4/1972 | Gupta | 342/175 |
| 3,691,556 A * | 9/1972 | Bloice | 342/27 |
| 3,704,429 A * | 11/1972 | Sigmon | 331/107 R |
| 3,735,286 A * | 5/1973 | Vane | 331/107 R |
| 3,750,165 A * | 7/1973 | Bailey et al. | 342/28 |
| 3,858,123 A * | 12/1974 | Ohta et al. | 331/96 |
| 3,883,822 A * | 5/1975 | Basset | 331/107 R |
| 3,896,435 A * | 7/1975 | Constant | 342/109 |
| 3,913,035 A * | 10/1975 | Havens | 331/96 |
| 4,009,444 A * | 2/1977 | Farkas et al. | 342/202 |
| 4,021,755 A * | 5/1977 | Svensson | 331/96 |
| 4,044,357 A * | 8/1977 | Goldie | 342/200 |
| 4,053,854 A * | 10/1977 | Havens | 331/107 R |
| 4,066,979 A * | 1/1978 | Diamand et al. | 331/107 R |
| 4,075,578 A * | 2/1978 | Dydyk | 331/107 R |
| 4,083,016 A * | 4/1978 | Zangrando et al. | 331/107 R |
| 4,097,823 A * | 6/1978 | Jerinic et al. | 342/202 |
| 4,328,470 A * | 5/1982 | Bumgardner | 342/175 |
| 4,333,076 A * | 6/1982 | Cachier | 342/188 |
| 4,467,284 A * | 8/1984 | Farkas | 342/204 |
| 4,745,374 A * | 5/1988 | Nishizawa et al. | 331/107 R |
| 5,511,238 A * | 4/1996 | Bayraktaroglu | 342/175 |
| 5,600,253 A * | 2/1997 | Cohen et al. | 342/27 |
| 5,774,091 A * | 6/1998 | McEwan | 342/200 |
| 6,094,158 A * | 7/2000 | Williams | 342/175 |
| 6,577,270 B2 * | 6/2003 | Kanechika et al. | 342/200 |
| 6,597,309 B1 * | 7/2003 | Panton et al. | 342/82 |
| 6,606,077 B2 * | 8/2003 | Ebling et al. | 343/753 |
| 7,310,061 B2 * | 12/2007 | Nagasaku et al. | 342/175 |
| 7,355,484 B2 * | 4/2008 | Kato et al. | 342/200 |
| 7,760,038 B2 * | 7/2010 | Lee et al. | 331/96 |
| 2003/0006941 A1 | 1/2003 | Ebling et al. | |
| 2006/0139206 A1 | 6/2006 | Nagasaku et al. | |
| 2009/0253370 A1 | 10/2009 | Matsui et al. | |

FOREIGN PATENT DOCUMENTS

| | | |
|---|---|---|
| JP | 7 120546 | 5/1995 |
| JP | 10 284946 | 10/1998 |
| JP | 2000 111636 | 4/2000 |
| JP | 2005 534231 | 11/2005 |
| JP | 2006 74395 | 3/2006 |
| JP | 2006 184144 | 7/2006 |

OTHER PUBLICATIONS

U.S. Appl. No. 13/123,338, filed Jul. 5, 2011, Utagawa, et al.
U.S. Appl. No. 13/123,115, filed Jul. 12, 2011, Utagawa, et al.
U.S. Appl. No. 13/123,135, filed Apr. 7, 2011, Utagawa, et al.
Isomura, T. et al., "5.8GHz Band Multi-Shot Planar Radiating Oscillator", The Institute of Electronics, Information and Communication Engineers, vol. 2000, No. 1, p. 80 (Mar. 28-31, 2000).
Kelly, M.J. et al., "HBT Active Antenna As a Self-Oscillating Doppler sensor", IEE Proc-Microw Antennas Propag, vol. 147, No. 1, pp. 43-47 (Feb. 2000).
Montiel, C.M. et al., "A Self-Mixing Active Antenna for Communication and Vehicle Identification Applications", IEEE MTT-S Digest, TU4C-5 pp. 333-336 (1996).
Flynt, R.A., et al., "Low Cost and Compact Active Integrated Antenna Transceiver for System Applications", IEEE Transactions on Microwave Theory and Techniques, vol. 44, No. 10, pp. 1642-1649 (Oct. 1996).
Isomura, T. et al., "5.8GHz Band Multi-Shot Planar Radiating Oscillator", The Institute of Electronics, Information and Communication Engineers, vol. 2000, No. 1, p. 80, Mar. 28-31, 2000, (with partial English translation).
Office Action issued on Feb. 24, 2012, in counterpart Chinese Patent Application No. 200880017641.0 (5 pages).

* cited by examiner

MICROWAVE/MILLIMETER WAVE SENSOR APPARATUS

TECHNICAL FIELD OF THE INVENTION

The present invention relates to a microwave/millimeter wave sensor apparatus that emits a microwave/millimeter wave band signal onto a measured object, and receives reflected waves from the measured object, thereby detecting the information about the measured object (or performing operation detection, velocity detection, existence detection, and location detection, for example).

BACKGROUND OF THE INVENTION

A conventional microwave/millimeter wave sensor apparatus is formed by connecting individual functional circuits, such as a transistor oscillating circuit or a GUNN diode oscillating circuit, a diode mixer circuit, an antenna, a coupler, a divider, and a transmission-reception separating circulator, with the use of a transmission line such as a microstrip line. Such a conventional microwave/millimeter wave sensor apparatus normally uses an oscillation signal of the oscillating circuit as a transmit RF signal, and withdraws part of the oscillation signal at the divider circuit and uses the withdrawn signal as a mixer circuit local signal. With the mixer functioning as a homodyne downconverter, this microwave/millimeter wave sensor apparatus is a homodyne sensor type apparatus that converts a receive RF signal to an IF signal.

In such a microwave/millimeter wave sensor apparatus formed by connecting individual functional circuits, there is a limit to high-density integration of circuits. Particularly, in millimeter wave bands, the loss due to the connecting portions between the functional circuits and the loss due to the transmission line become main causes of circuit performance degradation. To counter this problem, homodyne sensors and homodyne downconverters each having an oscillating circuit, a mixer circuit, an antenna, and the like integrated into one structure have been suggested.

For example, Non-patent Literature 1, "C. M. Montiel, 'A self-mixing active antenna for communication and vehicle identification applications', MTT-S Digest, 1996", discloses a structure in which a GUNN diode to be used as an oscillating device and a mixing device is mounted directly inside a round conductor patch, and an IF signal is withdrawn from a bias Tee circuit equipped with a DC block capacitor connected to the round conductor patch.

Non-patent Literature 2, "Robert A. Flynt, 'Low Cost and Compact Active Integrated Antenna Transceiver for System Application', MTT-10 vol. 44, October, 1996", discloses a structure in which a FET to be used as an oscillating device is placed at the center of two half-round conductor patches capacitatively coupled to each other by a chip capacitor, and a Schottky barrier diode to be used as a mixing device is mounted directly inside the drain-side conductor patch.

Non-Patent Literature 3, "M. J. Kelly, 'HBT active antenna as a self-oscillating Doppler sensor', IEE Proc., Microw. Antennas Properg., vol. 147, No. 1, February, 2000", discloses a structure in which a regular microstrip line transistor oscillating circuit for 50-ohm load designed independently of a conventional rectangular conductor patch antenna is connected on the same plane to the feeding point of the rectangular conductor patch antenna of 50 ohms in feed impedance, the transistor is used as an oscillating device and a mixing device, a receive RF signal is input to a portion between the collector and the emitter from the conventional rectangular conductor patch antenna, a 20-ohm resistor is placed between the drain-side RF choke of the transistor and a direct current source, and an IF signal is withdrawn as a voltage from a terminal on the choke side of the resistor.

In the structure having a GUNN diode mounted directly inside the round conductor patch as disclosed in Non-patent Literature 1, however, the DC-RF conversion efficiency of the GUNN diode is much lower than that of a transistor, though there is no power loss due to the transmission line. As a result, the power consumption becomes larger, and a stable operation cannot be expected unless a structure having a high heat radiation rate is used. Also, the GUNN diode cannot achieve higher RF-IF conversion gain than a transistor. Therefore, the GUNN diode is disadvantageous in terms of detection sensitivity. Although a planar conductor patch radiation structure is used in the invention disclosed in Non-patent Literature 1, this conventional art cannot provide a sensor apparatus that has a simple structure, is less expensive, and has high power efficiency.

In a structure in which a FET to be used as an oscillating device is placed at the center of two half-round conductor patches capacitatively coupled to each other by a chip capacitor, and a Schottky barrier diode to be used as a mixing device is mounted directly inside the drain-side conductor patch as disclosed in Non-patent Literature 1, a plurality of RF-band components are placed in the conductor patches, resulting in a complicated structure. Moreover, capacitative coupling by a chip capacitor can be realized hardly in millimeter wave bands. Since a Schottky barrier diode is used for mixing, higher RF-IF conversion gain than that of a transistor cannot be expected, and this structure is disadvantageous in terms of detection sensitivity.

In a structure in which a microstrip line transistor oscillating circuit designed for 50Ω load is merely connected on the same plane to the feeding point of a rectangular conductor patch antenna designed for 50Ω feeding as disclosed in Non-patent Literature 3, inevitable coupling is caused between the rectangular patch antenna and the microstrip line conductor of the oscillating circuit. As a result, the conductor pattern of the oscillating circuit affects the radiation output, the radiation pattern, and the oscillation frequency characteristics. Having such a drawback, the invention disclosed in Non-patent Literature 3 is not easily put into practice. Moreover, the invention disclosed in Non-patent Literature 3 is a structure in which a regular microstrip line rectangular patch antenna of 50 ohms in input impedance is connected to a regular microstrip line oscillating circuit of 50 ohms in output impedance, and the antenna and the oscillating circuit do not exist in an integrated manner. Particularly, in millimeter wave bands, the power loss due to the microstrip line portion forming the feedback circuit or the like for oscillation becomes larger, and therefore, this conventional art is disadvantageous in terms of efficiency.

In view of the above circumstances, the present invention aims to provide a microwave/millimeter wave sensor apparatus that can acquire highly-sensitive sensing information (IF signals for performing operation detection, velocity detection, existence detection, location detection, and the like), while being a simple structure, being inexpensive, and having high power efficiency.

SUMMARY OF THE INVENTION

To achieve the above objects, a microwave/millimeter wave sensor apparatus as a first aspect of the present invention is characterized in that: a radiation type oscillator is formed by integrating a three-electrode high-frequency amplifying device to generate negative resistance at resonating cavities, and share an antenna function to emit electromagnetic wave to space; oscillated radiation wave of the radiation type oscillator is a transmit RF signal, and reflected wave from a measured object reflecting the transmit RF signal is a receive RF signal; the radiation type oscillator receives the receive RF signal, and obtains an IF signal through homodyne mixing performed by the radiation type oscillator; and a signal analysis processing unit analyzes and processes the IF signal amplified by amplification gain from DC to IF bands of the three-electrode high-frequency amplifying device oscillating in an RF band, thereby sensing the measured object.

A microwave/millimeter wave sensor apparatus as a second aspect of the present invention is the same as the first aspect, and is characterized in that: the three electrodes of the three-electrode high-frequency amplifying device of the radiation type oscillator are a controlled-current entering electrode, a controlled-current exiting electrode, and a control electrode; an RF choke circuit that allows direct-current bias voltage and IF signals to pass, and blocks RF signals is connected to the controlled-current entering electrode of the three-electrode high-frequency amplifying device; and an IF-band loading unit is inserted between the RF choke circuit and a power supply path of a direct current source, so as to obtain the IF signal from between the IF-band loading unit and the RF choke circuit.

A microwave/millimeter wave sensor apparatus as a third aspect of the present invention is the same as the first aspect, and is characterized in that: the three electrodes of the three-electrode high-frequency amplifying device of the radiation type oscillator are a controlled-current entering electrode, a controlled-current exiting electrode, and a control electrode; an RF choke circuit that allows direct-current bias voltage and IF signals to pass, and blocks RF signals is connected to the controlled-current exiting electrode of the three-electrode high-frequency amplifying device; and an IF-band loading unit is inserted between the RF choke circuit and a power supply path of a direct current source, so as to obtain the IF signal from between the IF-band loading unit and the RF choke circuit.

A microwave/millimeter wave sensor apparatus as a fourth aspect of the present invention is the same as one of the first through the third aspects, and is characterized in that resonating cavities for oscillation stabilization are formed in the radiation type oscillator, and electromagnetic coupling is caused between the resonating cavities for oscillation stabilization and the radiation type oscillator.

A microwave/millimeter wave sensor apparatus as a fifth aspect of the present invention is the same as one of the first through the fourth aspects, and is characterized in that a horn structure that may improve the radiation directivity of a transmit RF signal is provided on the radiation face side of the radiation type oscillator.

A microwave/millimeter wave sensor apparatus as a sixth aspect of the present invention is the same as one of the first through the fifth aspects, and is characterized by comprising a frequency selective filtering unit that is placed at an appropriate distance from the radiation face of the radiation type oscillator, and selectively filters radio waves of predetermined frequency.

A microwave/millimeter wave sensor apparatus as a seventh aspect of the present invention is the same as one of the first through the sixth aspects, and is characterized in that: a housing that has a ground conductor face on which the radiation type oscillator can be mounted is provided, and a partially transmissive reflecting face is placed on the radiation face side at a distance equivalent to the electric length of $\lambda/2$ wavelength or an integral multiple of the $\lambda/2$ wavelength from the ground conductor face of the housing; and the partially transmissive reflecting face and the ground conductor face that face each other form a beam radiation type resonator.

A microwave/millimeter wave sensor apparatus as an eighth aspect of the present invention is the same as one of the first through the sixth aspects, and is characterized in that: a beam radiation type resonator that is formed with two partially transmissive reflecting face placed to face each other is provided on the radiation face side of the radiation type oscillator; and, where R1 represents the reflectivity of one of the reflecting faces, R2 represents the reflectivity of the other one of the reflecting faces, and R1 is greater than R2, the R2 face side having the lower reflectivity is placed to face the radiation face side, so as to cause electromagnetic coupling between the beam radiation type resonator and the radiation type oscillator.

A microwave/millimeter wave sensor apparatus as a ninth aspect of the present invention is the same as one of the first through the eighth aspects, and is characterized in that a direct-current bias value to be supplied to the three-electrode high-frequency amplifying device of the radiation type oscillator is varied so as to change oscillation frequency or oscillation amplitude.

A microwave/millimeter wave sensor apparatus as a tenth aspect of the present invention is the same as one of the first through the eighth aspects, and is characterized in that an impedance varying unit formed with a variable capacitance device is provided at resonating cavities that determine the oscillation frequency of the transmit RF signal, and the oscillation frequency is varied with an external signal applied to the variable capacitance device.

A microwave/millimeter wave sensor apparatus as an eleventh aspect of the present invention is the same as one of the first through the eighth aspects, and is characterized in that an external injection lock signal is allowed to be supplied to the radiation type oscillator, thereby stabilizing the oscillation frequency.

A microwave/millimeter wave sensor apparatus as a twelfth aspect of the present invention is the same as the eleventh aspect, and is characterized in that the frequency of the external injection lock signal is changed so as to change the oscillation frequency of the transmit RF signal.

A microwave/millimeter wave sensor apparatus as a thirteenth aspect of the present invention is characterized in that: a radiation type oscillator is formed by integrating a three-electrode high-frequency amplifying device to generate negative resistance at resonating cavities, and share an antenna function to emit electromagnetic wave to space; a harmonic selecting unit that selectively transmits desired harmonic of an oscillation RF signal emitted from the radiation face of the radiation type oscillator is provided; the desired harmonic of the oscillation RF signal is a transmission harmonic signal, and reflected wave from a measured object reflecting the transmission harmonic signal is a reception harmonic signal; the radiation type oscillator receives the reception harmonic signal, and obtains an IF signal through homodyne harmonic mixing performed by the radiation type oscillator; and a signal analysis processing unit analyzes and processes the IF signal amplified by amplification gain from DC to IF bands of the three-electrode high-frequency amplifying device oscillating in an RF band, thereby sensing the measured object.

A microwave/millimeter wave sensor apparatus as a fourteenth aspect of the present invention is the same as the thirteenth aspect, and is characterized in that the harmonic selecting unit is placed at an appropriate distance from the radiation face side of the radiation type oscillator, and serves as a frequency selective circuit pattern face that selectively filters radio waves of predetermined frequency.

A microwave/millimeter wave sensor apparatus as a fifteenth aspect of the present invention is the same as the thirteenth aspect, and is characterized in that a beam radiation type resonator formed with two partially transmissive reflecting faces facing each other is placed at an appropriate distance from the radiation face side of the radiation type oscillator, and the harmonic selecting unit adjusts the resonance frequency of the beam radiation type resonator to desired harmonic frequency.

A microwave/millimeter wave sensor apparatus as a sixteenth aspect of the present invention is the same as the thirteenth aspect, and is characterized in that the harmonic selecting unit is a waveguide filter that selectively passes and emits desired harmonic.

According to the first aspect of the present invention, a radiation type oscillator is formed by integrating a three-electrode high-frequency amplifying device to generate negative resistance at resonating cavities, and share an antenna function to emit electromagnetic wave to space. The oscillated radiation wave of the radiation type oscillator is a transmit RF signal, and the reflected wave from a measured object reflecting the transmit RF signal is a receive RF signal. The radiation type oscillator receives the receive RF signal, and obtains an IF signal through homodyne mixing performed by the radiation type oscillator. A signal analysis processing unit analyzes and processes the IF signal amplified by amplification gain from DC to IF bands of the three-electrode high-frequency amplifying device oscillating in an RF band, thereby sensing the measured object. With this structure, a high RF-IF conversion efficiency is achieved by utilizing not only the high-efficiency radiation characteristics and high-efficiency reception characteristics inherent to the radiation type oscillator, but also the amplification gain of the three-electrode high-frequency amplifying device in the IF band. Thus, this aspect of the present invention can embody a microwave/millimeter wave sensor apparatus that can acquire highly-sensitive sensing information (IF signals for performing operation detection, velocity detection, existence detection, location detection, and the like), while maintaining a simple structure, lower costs, and high power efficiency.

According to the second aspect of the present invention, the three electrodes of the three-electrode high-frequency amplifying device of the radiation type oscillator are a controlled-current entering electrode, a controlled-current exiting electrode, and a control electrode. An RF choke circuit that allows direct-current bias voltage and IF signals to pass, and blocks RF signals is connected to the controlled-current entering electrode of the three-electrode high-frequency amplifying device. An IF-band loading unit is inserted between the RF choke circuit and a power supply path of a direct current source, so as to obtain the IF signal from between the IF-band loading unit and the RF choke circuit. In this structure, the high-frequency transistor performs an IF-band amplifying operation while performing an RF-band oscillating operation, and entire high RF-IF conversion efficiency can be achieved. Thus, this aspect of the present invention can embody a microwave/millimeter wave sensor apparatus that can acquire highly-sensitive sensing information (IF signals for performing operation detection, velocity detection, existence detection, location detection, and the like), while maintaining a simple structure, lower costs, and high power efficiency. In other words, the microwave/millimeter wave sensor apparatus as the second aspect of the present invention is characterized by obtaining the high RF-IF conversion efficiency from the high-efficiency reception characteristics and the high RF-IF conversion efficiency from the IF amplification with the use of a single sensor device, and achieving a synergistic effect. In this microwave/millimeter wave sensor apparatus, the respective functions of an RF transmission antenna, an RF reception antenna, an RF oscillator, an RF mixer, and an IF amplifier exist in an integrated manner, and are not merely connected to one another in a cramped space. Accordingly, a sensor apparatus having an advantageous structure in microwave/millimeter wave bands can be provided.

According to the third aspect of the present invention, the three electrodes of the three-electrode high-frequency amplifying device of the radiation type oscillator are a controlled-current entering electrode, a controlled-current exiting electrode, and a control electrode. An RF choke circuit that allows direct-current bias voltage and IF signals to pass, and blocks RF signals is connected to the controlled-current exiting electrode of the three-electrode high-frequency amplifying device. An IF-band loading unit is inserted between the RF choke circuit and a power supply path of a direct current source, so as to obtain the IF signal from between the IF-band loading unit and the RF choke circuit. In this structure, the high-frequency transistor performs an IF-band amplifying operation while performing an RF-band oscillating operation, and entire high RF-IF conversion efficiency can be achieved. Thus, this aspect of the present invention can embody a microwave/millimeter wave sensor apparatus that can acquire highly-sensitive sensing information (IF signals for performing operation detection, velocity detection, existence detection, location detection, and the like), while maintaining a simple structure, lower costs, and high power efficiency. In other words, the microwave/millimeter wave sensor apparatus as the third aspect of the present invention is characterized by obtaining the high RF-IF conversion efficiency from the high-efficiency reception characteristics and the high RF-IF conversion efficiency from the IF amplification with the use of a single sensor device, and achieving a synergistic effect. In this microwave/millimeter wave sensor apparatus, the respective functions of an RF transmission antenna, an RF reception antenna, an RF oscillator, an RF mixer, and an IF amplifier exist in an integrated manner, and are not merely connected to one another in a cramped space. Accordingly, a sensor apparatus having an advantageous structure in microwave/millimeter wave bands can be provided.

According to the fourth aspect of the present invention, resonating cavities for oscillation stabilization are formed in the radiation type oscillator, so that electromagnetic coupling is caused between the resonating cavities for oscillation stabilization and the radiation type oscillator. With this arrangement, the oscillation frequency of the radiation type oscillator can be stabilized.

According to the fifth aspect of the present invention, a horn structure that may improve the radiation directivity of a transmit RF signal is provided on the radiation face side of the radiation type oscillator. With this arrangement, the radiation beam can be sharpened while a certain opening is maintained, and higher detection sensitivity can be achieved.

According to sixth aspect of the present invention, the microwave/millimeter wave sensor apparatus includes a frequency selective filtering unit that is placed at an appropriate distance from the radiation face of the radiation type oscillator, and selectively filters radio waves of predetermined frequency. With this structure, emission of unnecessary signals can be prevented.

According to the seventh aspect of the present invention, a housing that has a ground conductor face on which the radiation type oscillator can be mounted is provided, and a partially transmissive reflecting face is placed on the radiation face side at a distance equivalent to the electric length of λ/2 wavelength or an integral multiple of the λ/2 wavelength from the ground conductor face of the housing. The partially transmissive reflecting face and the ground conductor face that face each other form a beam radiation type resonator. With this arrangement, the oscillation RF signal of the radiation type oscillator is stabilized, and signals that are other than the resonance frequency are not emitted. Accordingly, unnecessary emission can be prevented. Also, unnecessary external wave that is other than the resonance frequency is not input. Thus, false operations can be prevented.

According to the eighth aspect of the present invention, a beam radiation type resonator that is formed with two partially transmissive reflecting face placed to face each other is provided on the radiation face side of the radiation type oscillator. Where R1 represents the reflectivity of one of the reflecting faces, R2 represents the reflectivity of the other one of the reflecting faces. And in the case of R1 being greater than R2, the R2 face side having the lower reflectivity is placed to face the radiation face side, so as to cause electromagnetic coupling between the beam radiation type resonator and the radiation type oscillator. With this arrangement, the oscillation RF signal of the radiation type oscillator is stabilized, and signals that are other than the resonance frequency are not emitted. Accordingly, unnecessary emission can be prevented. Also, unnecessary external wave that is other than the resonance frequency is not input. Thus, false operations can be prevented.

According to the ninth aspect of the present invention, a direct-current bias value to be supplied to the three-electrode high-frequency amplifying device of the radiation type oscillator is varied so as to change oscillation frequency or oscillation amplitude. With this arrangement, FM-CW sensor operations, pulse sensor operations, and the like can be performed, and the location information about the measured object and the like can be detected.

According to the tenth aspect of the present invention, an impedance varying unit formed with a variable capacitance device is provided at resonating cavities that determine the oscillation frequency of the transmit RF signal, and the oscillation frequency is varied with an external signal applied to the variable capacitance device. With this arrangement, FM-CW sensor operations and the like can be performed, and the location information about the measured object and the like can be detected.

According to the eleventh aspect of the present invention, an external injection lock signal is allowed to be supplied to the radiation type oscillator, thereby stabilizing the oscillation frequency. With this arrangement, oscillation of the radiation type oscillator is locked by the external injection lock signal. Thus, the oscillation frequency can be stabilized.

According to the twelfth aspect of the present invention, the frequency of the external injection lock signal is changed so as to change the oscillation frequency of the transmit RF signal. With this arrangement, FM-CW sensor operations and the like can be performed, and the location information about the measured object and the like can be detected.

According to the thirteenth aspect of the present invention, a radiation type oscillator is formed by integrating a three-electrode high-frequency amplifying device to generate negative resistance at resonating cavities, and share an antenna function to emit electromagnetic wave to space. A harmonic selecting unit that selectively transmits desired harmonic of an oscillation RF signal emitted from the radiation face of the radiation type oscillator is provided. The desired harmonic of the oscillation RF signal is a transmission harmonic signal, and the reflected wave from a measured object reflecting the transmission harmonic signal is a reception harmonic signal. The radiation type oscillator receives the reception harmonic signal, and obtains an IF signal through homodyne harmonic mixing performed by the radiation type oscillator. A signal analysis processing unit analyzes and processes the IF signal amplified by amplification gain from DC to IF bands of the three-electrode high-frequency amplifying device oscillating in an RF band, thereby sensing the measured object. In this manner, a sensor apparatus of relatively high frequency can also be embodied even if a radiation type oscillator is formed by using a low-cost, low-performance three-electrode high-frequency amplifying device that has its maximum operating frequency (fmax) at low frequency.

According to the fourteenth aspect of the present invention, the harmonic selecting unit is placed at an appropriate distance from the radiation face side of the radiation type oscillator, and serves as a frequency selective circuit pattern face that selectively filters radio waves of predetermined frequency. Thus, a harmonic selecting unit can be formed with a simple structure.

According to the fifteenth aspect of the present invention, a beam radiation type resonator formed with two partially transmissive reflecting faces facing each other is placed at an appropriate distance from the radiation face side of the radiation type oscillator, and the harmonic selecting unit adjusts the resonance frequency of the beam radiation type resonator to desired harmonic frequency. Thus, a harmonic selecting unit can be formed with a simple structure.

According to the sixteenth aspect of the present invention, the harmonic selecting unit is a waveguide filter that selectively passes and emits desired harmonic. With this arrangement, the radiation beam can be sharpened while a certain opening is maintained at the waveguide outlet, and higher detection sensitivity can be achieved.

BRIEF DESCRIPTION OF THE DRAWING

FIG. 24A is a front view of the example structure; and FIG. 24B is a cross-sectional view of the example structure, taken along the line A-A' of FIG. 24A;

FIG. 25A is a front view of the example structure; and FIG. 25B is a cross-sectional view of the example structure, taken along the line A-A' of FIG. 25A;

FIG. 26A is a front view of the example structure; and FIG. 26B is a cross-sectional view of the example structure, taken along the line A-A' of FIG. 26A;

FIG. 27A is a front view of the example structure; and FIG. 27B is a cross-sectional view of the example structure, taken along the line A-A' of FIG. 27A;

FIG. 28A is a front view of the example structure; and FIG. 28B is a cross-sectional view of the example structure, taken along the line A-A' of FIG. 28A;

FIG. 29A is a front view of the example structure; and FIG. 29B is a cross-sectional view of the example structure, taken along the line A-A' of FIG. 29A;

FIG. 30A is a front view of the example structure; and FIG. 30B is a cross-sectional view of the example structure, taken along the line A-A' of FIG. 30A;

FIG. 31A is a front view of the example structure; and FIG. 31B is a cross-sectional view of the example structure, taken along the line A-A' of FIG. 31A;

FIG. 32A is a front view of the example structure; and FIG. 32B is a cross-sectional view of the example structure, taken along the line A-A' of FIG. 32A;

FIG. 33A is a front view of the example structure; and FIG. 33B is a cross-sectional view of the example structure, taken along the line A-A' of FIG. 33A;

FIG. 34A is a front view of the example structure; and FIG. 34B is a cross-sectional view of the example structure, taken along the line A-A' of FIG. 34A;

FIG. 35A is a front view of the example structure; and FIG. 35B is a cross-sectional view of the example structure, taken along the line A-A' of FIG. 35A;

FIG. 38A is a front view of the microwave/millimeter wave sensor apparatus; and FIG. 38B is a cross-sectional view of the microwave/millimeter wave sensor apparatus, taken along the line A-A' of FIG. 38A;

FIG. 39A is a front view of the microwave/millimeter wave sensor apparatus; and FIG. 39B is a cross-sectional view of the microwave/millimeter wave sensor apparatus, taken along the line A-A' of FIG. 39A;

FIG. 40A is a front view of the microwave/millimeter wave sensor apparatus; and FIG. 40B is a cross-sectional view of the microwave/millimeter wave sensor apparatus, taken along the line A-A' of FIG. 40A;

FIG. 41A is a front view of the microwave/millimeter wave sensor apparatus; and FIG. 41B is a cross-sectional view of the microwave/millimeter wave sensor apparatus, taken along the line A-A' of FIG. 41A;

BEST MODE FOR CARRYING OUT THE INVENTION

The following is a description of embodiments of microwave/millimeter wave sensor apparatuses according to the present invention, with reference to the accompanying drawings.

(First Embodiment)

Figure 1A:
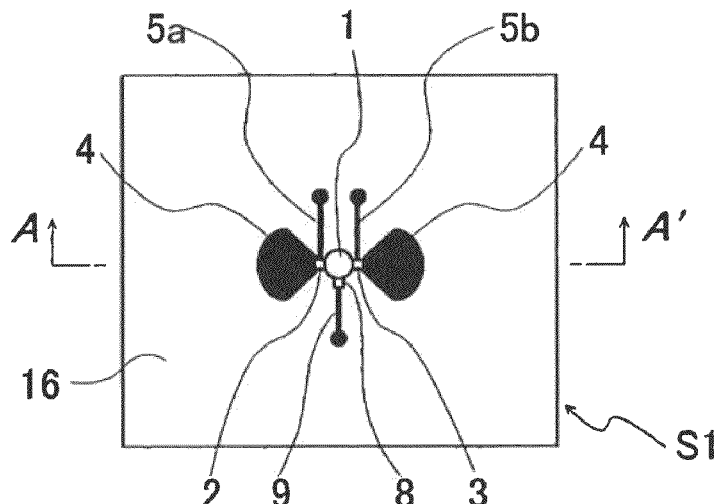
FIG. 1A, FIG. 1B, and FIG. 1C are schematic views of a microwave/millimeter wave sensor apparatus according to a first embodiment of the present invention.
Figure 1B:
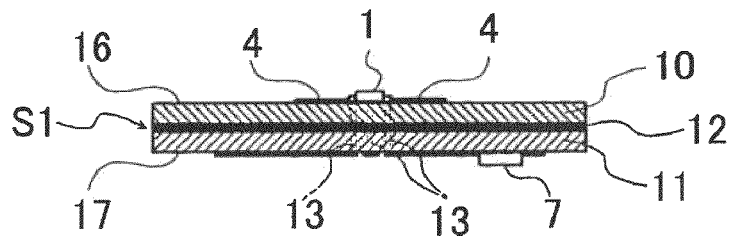
Figure 1C:
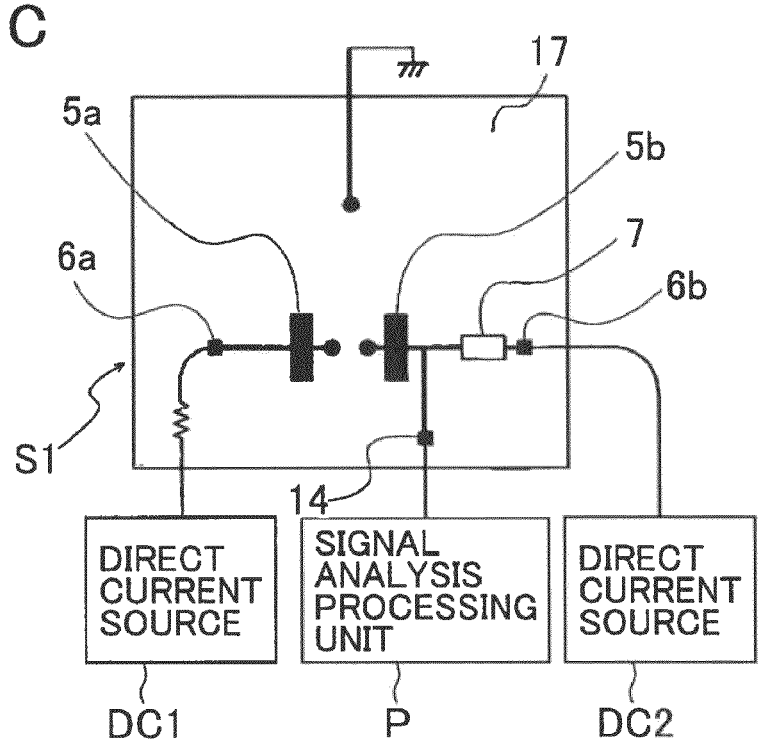

FIG. 1A, FIG. 1B, and FIG. 1C schematically show the structure of a microwave/millimeter wave sensor apparatus according to a first embodiment. FIG. 1A is a front view of a radiation type oscillator substrate S1. FIG. 1B is a cross-sectional view of the radiation type oscillator substrate S1, taken along the line A-A' of FIG. 1A. FIG. 1C is a rear view of the radiation type oscillator substrate S1. The radiation type oscillator substrate S1 is a three-layer substrate structure that has an inner-layer GND 12 as a ground conductor layer interposed between a front surface side dielectric substrate 10 and a rear surface side dielectric substrate 11. Direct current is supplied from direct current sources DC1 and DC2 to a high-frequency transistor 1 of the radiation type oscillator substrate S1, and sensing signals (IF signals) acquired from the radiation type oscillator substrate S1 are processed at a signal analysis processing unit P.

More specifically, the radiation type oscillator substrate S1 functions as a "radiation type oscillator that integrates a three-electrode high-frequency amplifying device so as to generate negative resistance at resonating cavities, and causes the amplifying device to share the antenna function to emit electromagnetic waves to space". An oscillation radiation wave of the radiation type oscillator is a transmit RF signal, and the wave reflected by the measured object of the transmit RF signal is a receive RF signal. The radiation type oscillator receives the receive RF signal, and obtains an IF signal by performing homodyne mixing. The IF signal amplified by amplification gain from DC to IF bands in the three-electrode high-frequency amplifying device oscillating in the RF band is analyzed and processed by the signal analysis processing unit P that is the signal analysis processing unit of the claims.

Through the analysis and processing, the measured object can be sensed. The signal analysis processing unit P performs an A/D conversion of the input IF signal, desired signal processing such as a FFT calculation, and a signal analysis. In accordance with sensed information (through operation detection, velocity detection, existence detection, position detection, and the like) obtained by the microwave/millimeter wave sensor, the content of processing and the analysis method may be arbitrarily set. The three-electrode high-frequency amplifying device is a device that realizes the amplifying function by controlling the higher current with a low voltage or current. The three-electrode high-frequency amplifying device includes a single transistor device or a device formed with a plurality of single transistor, and further includes not only parts that can be regarded as individual parts but also parts embedded in a semiconductor wafer through a semiconductor process. The control electrode in the three-electrode high-frequency amplifying device is the electrode that applies a controlled voltage and introduces or removes a controlled current. The electrode is equivalent to the gate and the base. A controlled-current entering electrode is the electrode into which the controlled current flows, and a controlled-current exiting electrode is the electrode from which the controlled current flows out. Depending on whether the device structure is of an N-type or a P-type, one of the controlled-current entering electrode and the controlled-current exiting electrode is equivalent to the drain and the collector, and the other one is equivalent to the source and the emitter.

On the side of the front surface layer 16 of the front surface side dielectric substrate 10 of the radiation type oscillator substrate S1, a pair of conductor patches 4 are provided in an axis-symmetric manner so as to form a radiation face, and a gate 2 as the control electrode and a drain 3 as the controlled-current entering electrode that are provided at the high-frequency transistor 1 as the three-electrode high-frequency amplifying device placed between the pair of conductor patches 4 are connected to the conductor patches 4, respectively. A gate-side RF choke circuit 5a for supplying a gate voltage is connected to the gate 2 of the high-frequency transistor 1, and a drain-side RF choke circuit 5b for supplying a drain voltage is connected to the drain 3 of the high-frequency transistor 1. An impedance line 9 that satisfies an oscillation condition is connected to a source 8 as the controlled-current exiting electrode of the high-frequency transistor 1. The gate-side RF choke circuit 5a for supplying a gate voltage and the drain-side RF choke circuit 5b for supplying a drain voltage are formed integrally with a conductor line formed on the side of a rear surface layer 17 of the rear surface side dielectric substrate 10 of the radiation type oscillator substrate S1 via through hole portions 13.

On the side of the rear surface layer 17 of the radiation type oscillator substrate S1, there are a direct-current gate voltage supply terminal 6a that is connected to the direct current source DC1 to supply a direct-current gate voltage to the gate-side RF choke circuit 5a provided for supplying a gate voltage, a direct-current drain voltage supply terminal 6b that is connected to the direct current source DC2 to supply a direct-current drain voltage to the drain-side RF choke circuit 5b provided for supplying a drain voltage, a resistor 7 as an IF-band loading unit that is connected in series between the direct-current drain voltage supply terminal 6b and the drain-side RF choke circuit 5b, and an IF output terminal 14 that acquires an IF signal voltage from between the resistor 7 and the drain-side RF choke circuit 5b.

Figure 2:
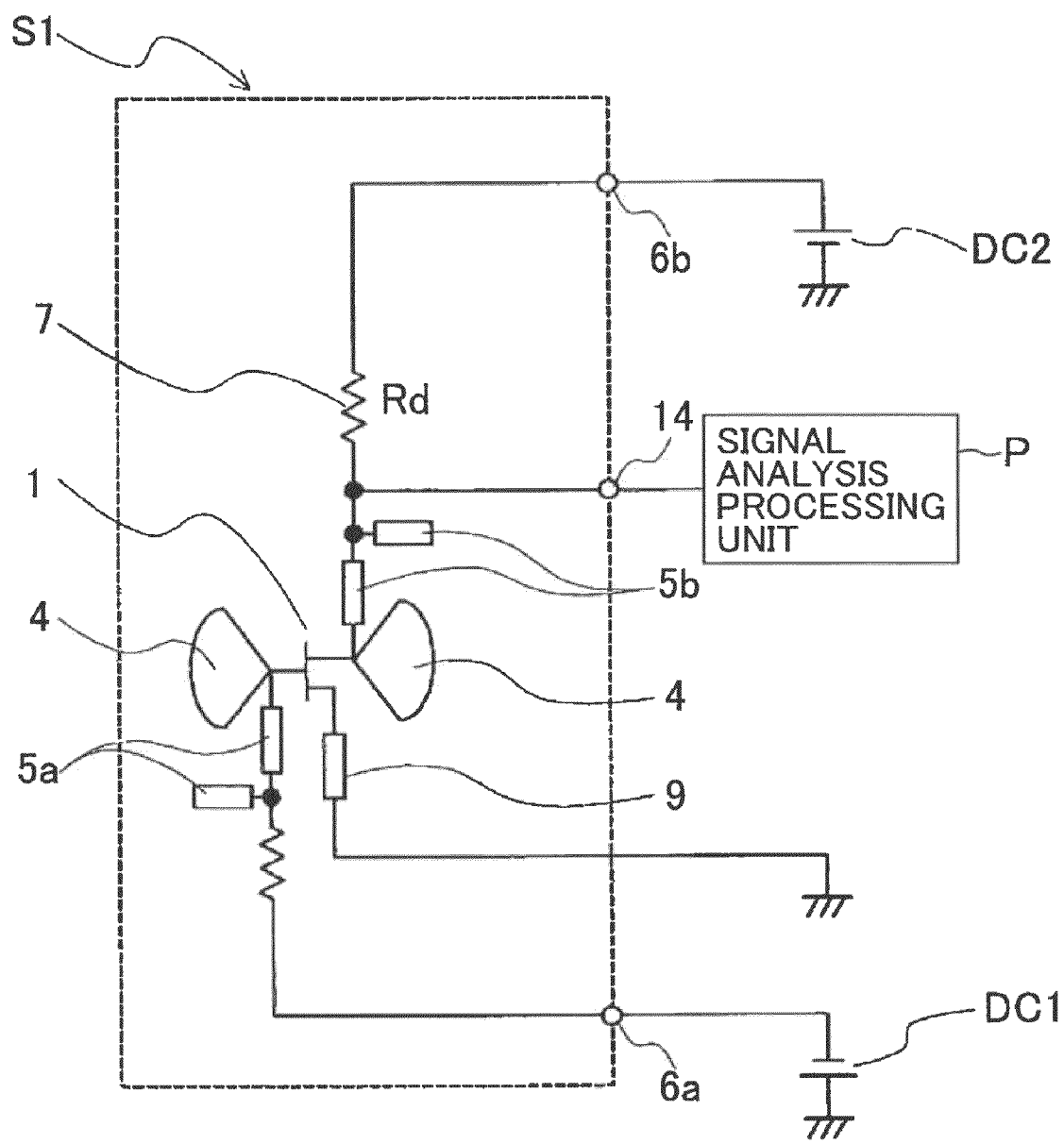
FIG. 2 is a circuit structure diagram of the microwave/millimeter wave sensor apparatus according to the first embodiment of the present invention.

FIG. 2 is a schematic circuit diagram showing the structure of the circuit mounted on the radiation type oscillator substrate S1. In FIG. 2, the same components as those in FIG. 1 are denoted by the same reference numerals as those in FIG. 1. In the radiation type oscillator substrate S1 having a three-layer substrate structure, the front surface layer 16, the inner layer GND 12, and the front surface side dielectric substrate 10 form an RF circuit unit of the radiation type oscillator, and the inner layer GND 12, the rear surface layer 17, and the rear surface side dielectric substrate 11 form an RF choke circuit and an IF circuit.

The conductor patches 4 not only function as resonators, transmission antennas, and reception antennas, but also form a feedback circuit. The radiation type oscillator that generates and emits transmit RF signals of the RF band of the wavelength λ is realized by setting the areas and shapes of the conductor patches 4 and supplying a direct current to the high-frequency transistor.

Figure 3:
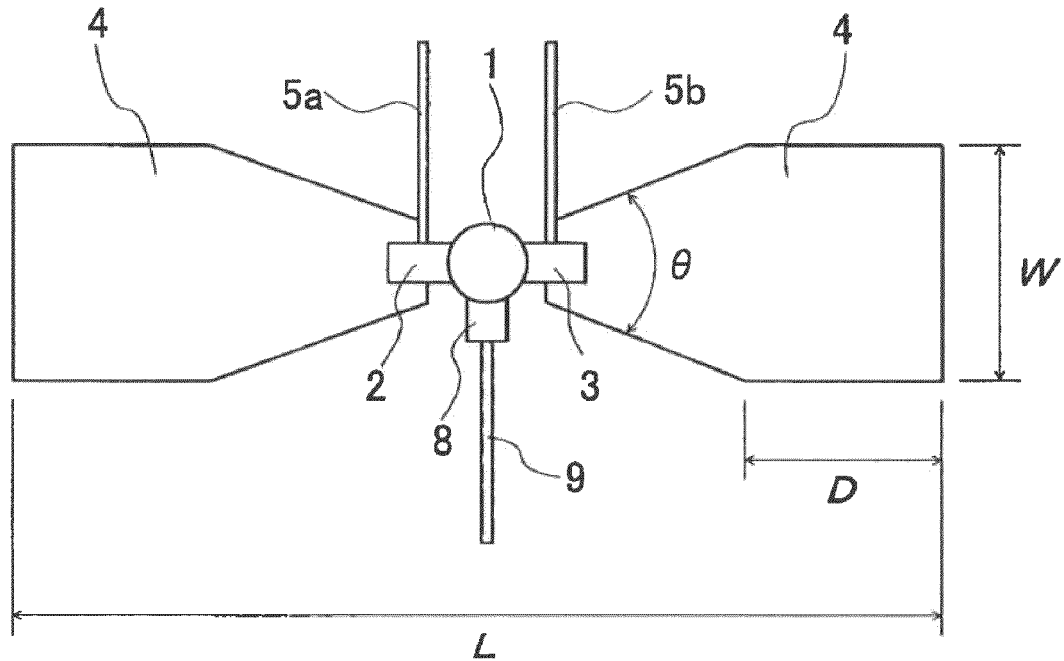
FIG. 3 illustrates the structures of the conductor patches and the microwave transistor in the planar radiation type oscillator.

FIG. 3 illustrates the pair of axis-symmetric conductor patches 4. Each of the conductor patches 4 has a peaked portion that is connected to the gate 2 or the drain 3 of the high-frequency transistor 1 and has uniform inclination angles. The peaked portions are placed close to each other. The length of each parallel portion that excludes the peaked portion and has a width W is represented by D, and the total length of the pair of conductor patches 4 from one end to the other is represented by L.

In each of the conductor patches 4 having the above structure, the coupling strength between the high-frequency transistor 1 and the resonators can be adjusted by controlling the spread angle θ of the peaked portion connected to the gate 2 or the drain 3 of the high-frequency transistor 1. Also, a certain degree of freedom in selecting various conditions necessary for setting oscillation conditions can be obtained by appropriately selecting the total length L, the width W, and the length D of each parallel portion. Although not shown in the drawings, the distance h between the front surface layer 16 on which the conductor patches 4 are placed and the inner layer GND 12 (substantially the thickness of the front surface side dielectric substrate 10) is set in the range of 1/15 to 1/5 of the oscillation wavelength λ. In this manner, a stable oscillated state can be maintained. The structures of the conductor patches 4 are not specifically limited, and the conductor patches 4 may have any kinds of structures, as long as resonating cavities suitable for oscillation RF signals can be formed with the front surface side dielectric substrate 10 and the inner layer GND 12. Modifications of the resonating cavities will be described later.

To operate the microwave/millimeter wave sensor apparatus according to the first embodiment, a direct-current voltage is first applied between the direct-current drain voltage supply terminal 6a and the GND, so as to cause oscillation in the RF band. Since radio waves are emitted because of the oscillation, the radio waves are emitted as a transmit RF signal onto a measured object. Accordingly, the high-efficiency radiation characteristics inherent to a radiation type oscillator that has antennas and an oscillating circuit in an integrated fashion are also high-efficiency reception characteristics, and a receive RF signal that is the wave reflected from the measured object is input and applied between the gate 2 and the drain 3 of the high-frequency transistor 1 with low loss. The receive RF signal input to the high-frequency transistor 1 that is oscillating causes an IF signal to be generated through homodyne mixing with an oscillation RF signal.

A reception IF signal voltage is a Doppler beat signal when the measured object is moving, and is a DC signal with zero beat detecting standing wave when the measured object is in a stopped state.

The IF signal generated from between the gate 2 and the drain 3 or from between the gate 2 and the source 8 of the high-frequency transistor 1 causes a change in the drain current of the high-frequency transistor 1. As a result, an amplified IF signal voltage is generated at the RF choke side terminal 6b of the resistor 7 that are interposed in series between the drain-side RF choke circuit 5b and the direct current source DC2.

Here, the high-frequency transistor 1 is a field effect transistor (FET) such as an IG-FET (Insulated Gate FET) including a MOS-FET, a HEMT (High Electron Mobility Transistor), or a MESFET (Metal-Semiconductor FET), or a bipolar junction transistor (BJT) such as a HBT (Hetero-junction Bipolar Transistor). The high-frequency transistor 1 is a transistor that has negative resistance that satisfies an oscillation condition in the RF band, and at the same time, has amplification gain in the IF band. In other words, having greater RF-band amplification gain than a diode, the high-frequency transistor 1 is capable of causing highly-sensitive RF reception characteristics. Also, having amplification gain from DC to IF bands, the high-frequency transistor 1 is capable of amplifying an IF signal generated by mixing. In this manner, the microwave/millimeter wave sensor apparatus according to this embodiment can be realized by simultaneously using the amplification gain in the RF band and the DC to IF bands of the high-frequency transistor 1.

For example, where the transconductor value in the IF band of the high-frequency transistor 1 that is oscillating is g[S], the voltage amplification factor Av is g×Rd>1, when the impedance value Rd of the resistor 7 is greater than $1/g[\Omega]$. Accordingly, amplification is performed in the IF band, and high RF-IF conversion efficiency can be achieved.

However, in a case where the resistor 7 is placed between the drain-side RF choke circuit 5b and the direct current source DC2, high resistance needs to be used to increase the voltage amplification factor, and the drain voltage drops due to the high resistance. Therefore, the voltage to be supplied to the direct current source DC2 needs to be made higher. However, if the resistor 7 has a very high resistance value, the power consumption in the resistor becomes remarkable, and the high-efficiency characteristics of the radiation type oscillator cannot be utilized. Where a conventional small-signal high-frequency transistor is used, the drain voltage is in the range of 1 to 3[V], the drain current is in the range of 5 to 20 [mA], and the transconductor value is several tens of millisiemenses (mS). Even with the consistency with a 50Ω circuit being taken into consideration, a realistic resistance value should be 10 to 5 k[Ω]. For example, if a resistor of 10 k[Ω] is used in a case where the drain voltage is 2[V] and the drain current is 15 [mA], the source voltage is estimated as 152[V] (=2[V]+(10 k[Ω]×15 [mA])), and a high voltage of 100[V] or more becomes necessary, which causes difficulties in practice. Also, the value of the effective load resistance Reff is a combined resistance value of the resistor 7 and a drain resistor ro connected in parallel, due to the drain resistor ro of the high-frequency transistor. Therefore, the value of the effective load resistance Reff only approximates the resistance value of the drain resistor ro, no matter how high the resistance value of the resistor 7 is made.

To counter this problem, a constant current circuit having a smaller voltage drop than the resistor is used as the IF-band loading unit, so that the high impedance of the constant current source can be utilized. Accordingly, increases in the voltage drop and power consumption due to high resistance can be prevented, and the voltage amplification factor in the IF band can be made higher.

Figure 4:
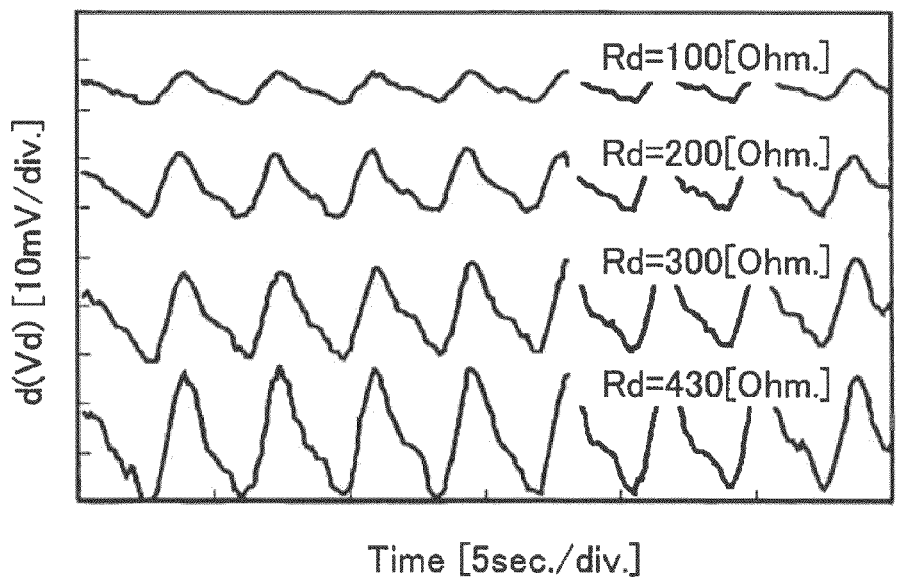
FIG. 4 shows the characteristic changes of output voltages measured where the resistance for acquiring IF signals is varied.

FIG. 4 shows the IF signal voltage characteristics of the IF output terminal 14 measured while the resistance value Rd of the resistor 7 is varied in a radiation type oscillator that is produced as a test sample. The results are obtained where the RF oscillation frequency is 10.35 GHz, and the measured object is brought toward the radiation face of the radiation type oscillator substrate S1 at 4 [mm/sec]. With the measurement of parameter being the resistance value Rd of the resistor 7, the IF output voltage amplitude and the resistance value are almost proportional to each other, as can be seen from FIG. 4.

As described above, in the first embodiment of a microwave/millimeter wave sensor apparatus according to the present invention, a radiation face is formed by providing the pair of conductor patches 4 in an axis-symmetric manner on the side of the front surface layer 16 of the three-layer substrate that has the conductive ground conductor layer 12 interposed between the front surface side dielectric substrate 10 and the rear surface side dielectric substrate 11. The gate 2 and the drain 3 of the high-frequency transistor 1 as a three-electrode high-frequency amplifying device placed between the pair of conductor patches 4 are connected to the respective conductor patches 4. The source 8 of the high-frequency transistor 1 is grounded via the impedance line 9 that satisfies an oscillation condition in the radiation type oscillator substrate S1. The radiation type oscillator formed with the radiation type oscillator substrate S1 and the direct current sources DC1 and DC2 supplying power to the high-frequency transistor 1 of the radiation type oscillator substrate S1 can embody the "radiation type oscillator that integrates a three-electrode high-frequency amplifying device so as to generate negative resistance at resonating cavities, and causes the amplifying device to share the antenna function to emit electromagnetic waves to space". Also, the high-efficiency radiation characteristics and high-efficiency reception characteristics inherent to a radiation type oscillator in the RF band are obtained. Further, the resistor 7 is provided as the IF-band load between the drain-side choke circuit 5b and the direct current source DC2, and the high-frequency transistor 1 performs the RF-band oscillating operation and an IF-band amplifying operation at the same time. Accordingly, entire higher RF-IF conversion efficiency is achieved. Thus, a microwave/millimeter wave sensor apparatus that can obtain highly-sensitive sensed information (the IF signals for performing operation detection, velocity detection, existence detection, position detection, and the like) can be realized, while simple structure, lower costs, and high power efficiency are also achieved.

In other words, this microwave/millimeter wave sensor apparatus is characterized by realizing high RF-IF conversion efficiency through the high-efficiency reception characteristics and high RF-IF conversion efficiency through IF amplification with a single sensor device, and achieving a synergistic effect. In this microwave/millimeter wave sensor apparatus, the functions of an RF transmission antenna, an RF reception antenna, an RF oscillator, an RF mixer, and an IF amplifier exist in an integrated manner, and are not merely connected to one another in a cramped space. Accordingly, a sensor apparatus having an advantageous structure in microwave/millimeter wave bands can be provided.

The function of an RF choke circuit is to prevent RF signals from leaking toward the direct current source side. Even if RF signals leak to the direct current source side, the IF signals for obtaining sensed information can be acquired, as long as the three-electrode high-frequency amplifying device has higher negative resistance than the loss caused by the leakage. Accordingly, a microwave/millimeter wave sensor apparatus can be realized with a radiation type oscillator that does not have an RF choke circuit. Also, there is no need to use a radiation type oscillator substrate having a three-layer substrate structure, so as to form an RF choke circuit.

Also, a microwave/millimeter wave sensor apparatus according to the present invention may be embodied by a HMIC (Hybrid Microwave Integrated Circuit) or a MMIC (Monolithic Microwave Integrated Circuit). Alternatively, a microwave/millimeter wave sensor apparatus may be embodied by a three-dimensional integrated circuit using LTCC (Low Temperature Co-fired Ceramics) or the like.

Although the first embodiment of a microwave/millimeter wave sensor apparatus according to the present invention has been described, the present invention is not limited to the structure of this embodiment, and all microwave/millimeter wave sensor apparatuses that can be formed without departing from the scope of the invention are included in the claimed invention. In the following, the other embodiments will be described.

(Second Embodiment)

Figure 5:
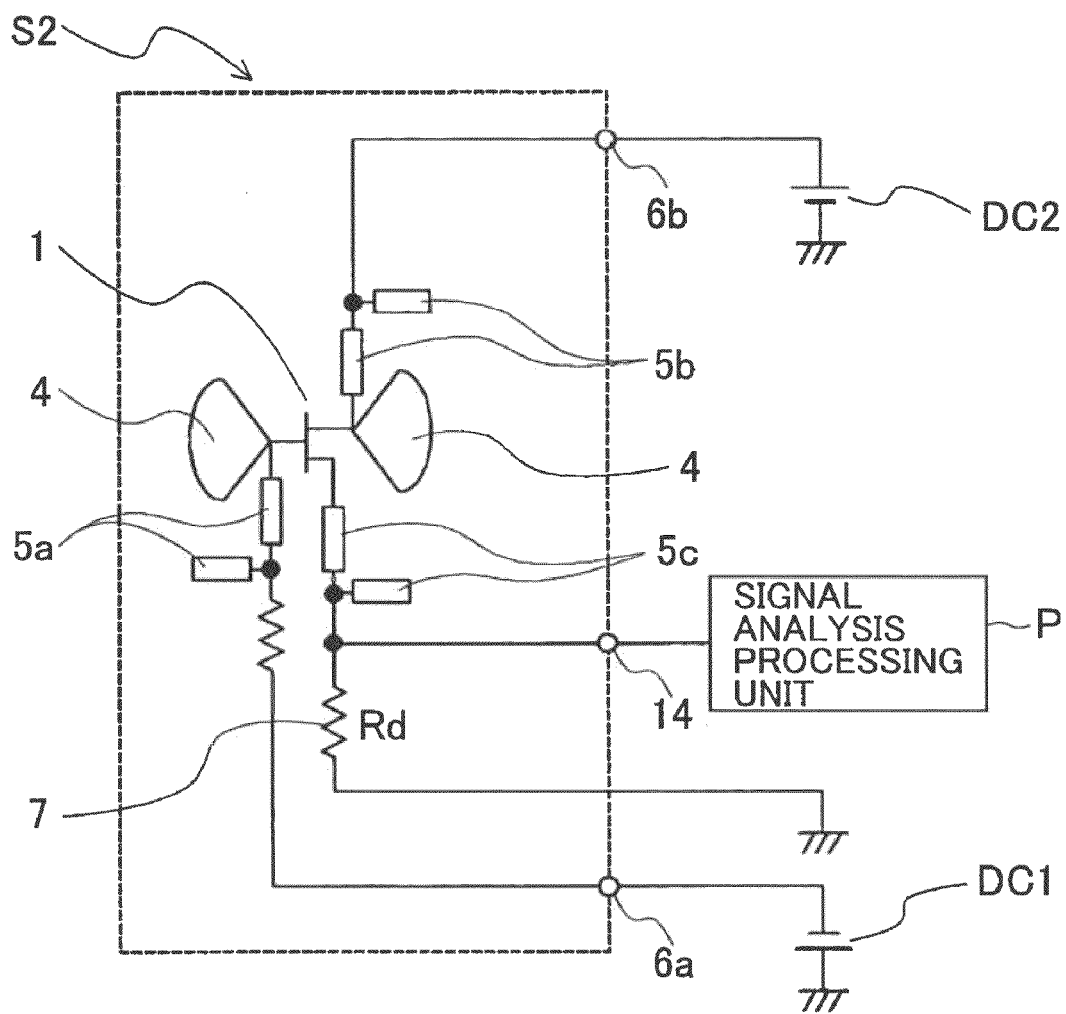
FIG. 5 is a circuit structure diagram of a microwave/millimeter wave sensor apparatus according to a second embodiment.

FIG. 5 is a circuit structure diagram of a microwave/millimeter wave sensor apparatus according to a second embodiment. Direct current is supplied from the direct current sources DC1 and DC2 to a radiation type oscillator substrate S2, and a signal analysis processing unit P analyzes and processes sensing signals (IF signals) acquired from the radiation type oscillator substrate S2. The microwave/millimeter wave sensor apparatus of this embodiment is the same as the microwave/millimeter wave sensor apparatus of the first embodiment, except for the IF signal acquiring position. The same components as those of the microwave/millimeter wave sensor apparatus of the first embodiment are denoted by the same reference numerals as those used in the first embodiment, and explanation of them is not repeated here.

In the radiation type oscillator substrate S2, a source-side RF choke circuit 5c is connected to the source 8 of the high-frequency transistor 1. The resistor 7 as the IF-band loading unit is interposed in series between the source-side RF choke circuit 5c and the ground conductor, and an IF signal is obtained from between the resistor 7 and the source-side RF choke circuit 5c. In the present invention, an IF signal voltage is obtained from a drain current change in the high-frequency transistor 1 due to an IF signal, as described above. Accordingly, an IF signal voltage can be obtained from a source current change that is substantially the same as a drain current change.

(Third Embodiment)

Figure 6:
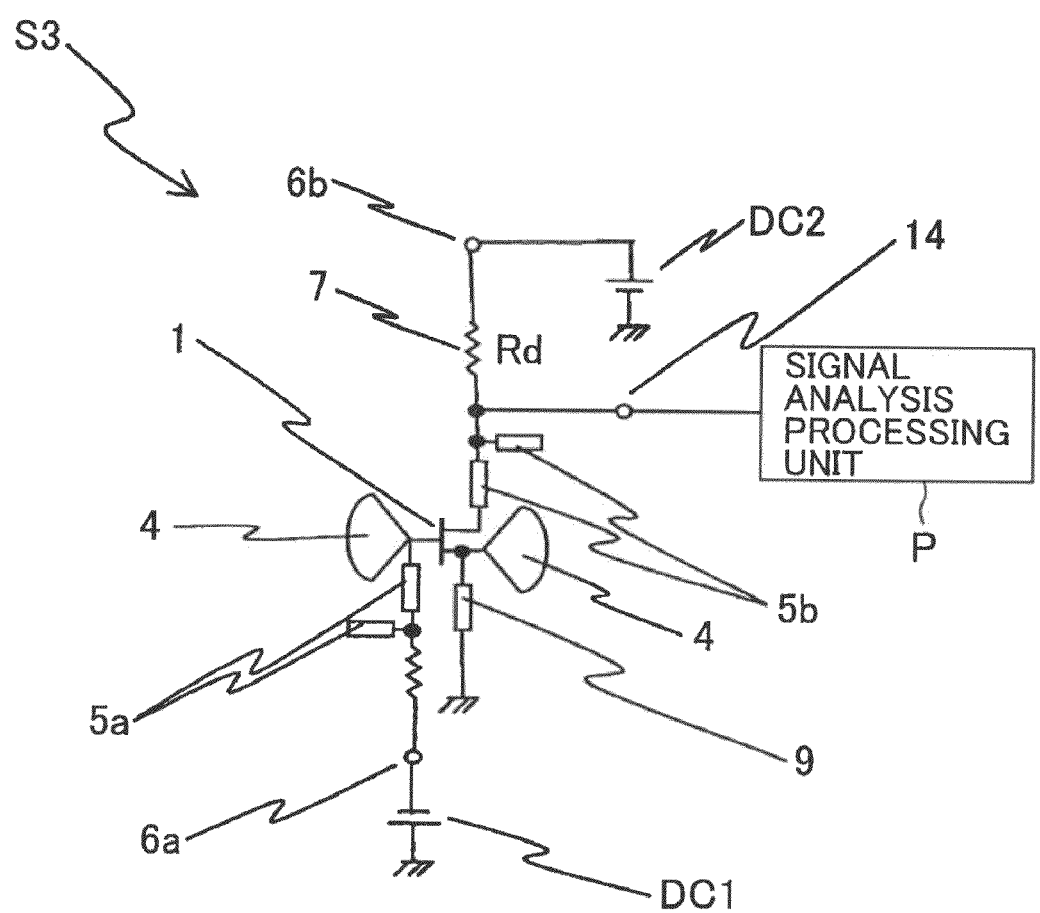
FIG. 6 is a circuit structure diagram of a microwave/millimeter wave sensor apparatus according to a third embodiment.

FIG. 6 is a circuit structure diagram of a microwave/millimeter wave sensor apparatus according to a third embodiment. Direct current is supplied from the direct current sources DC1 and DC2 to a radiation type oscillator substrate S3, and a signal analysis processing unit P analyzes and processes sensing signals (IF signals) acquired from the radiation type oscillator substrate S3. The microwave/millimeter wave sensor apparatus of this embodiment is the same as the microwave/millimeter wave sensor apparatus of the first embodiment, except for the mounting locations of the conductor patches 4. The same components as those of the microwave/millimeter wave sensor apparatus of the first embodiment are denoted by the same reference numerals as those used in the first embodiment, and explanation of them is not repeated here.

Figure 7:
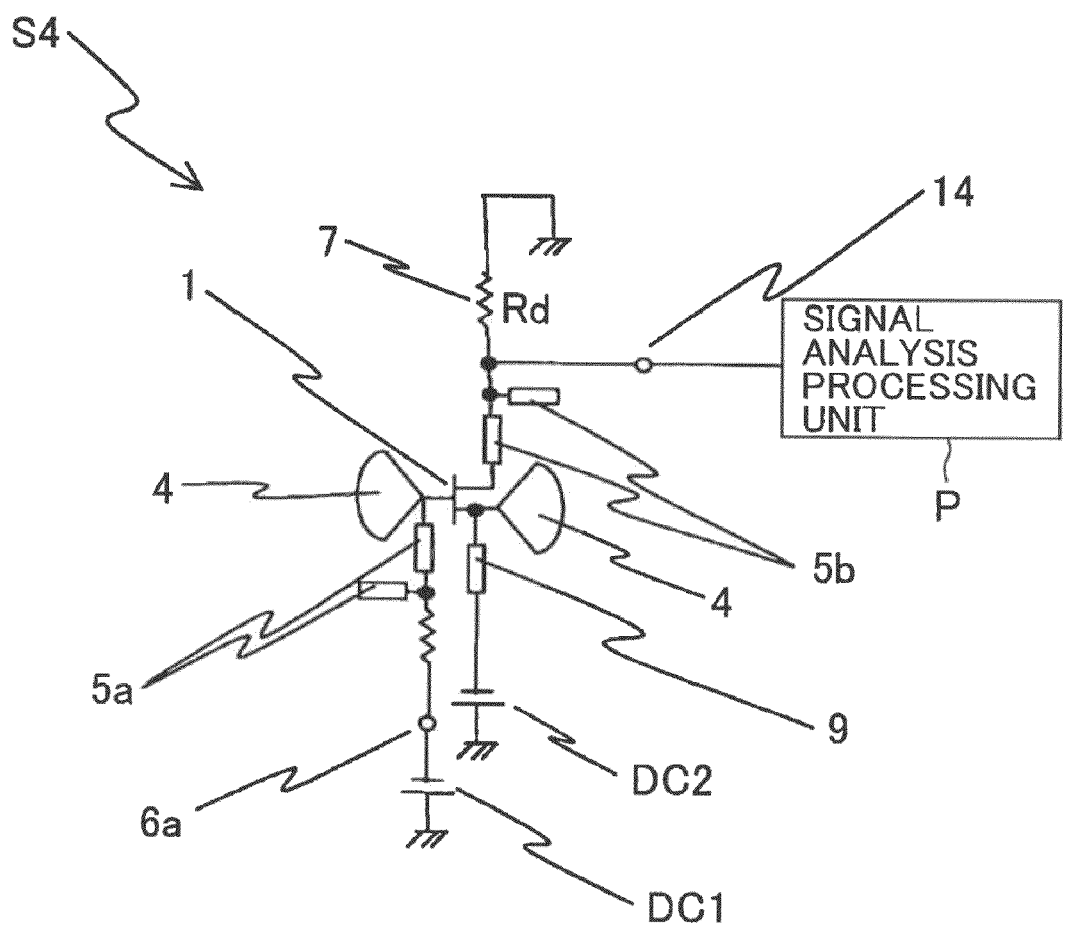
FIG. 7 is a circuit structure diagram of a microwave/millimeter wave sensor apparatus according to a fourth embodiment.

In the radiation type oscillator substrate S3, the conductor patches 4 are attached to the gate and source of the high-frequency transistor 1. Since the conductor patches 4 connected to the gate and source of the high-frequency transistor 1 function as a feedback circuit having functions of both resonators and radiators, a radiation type oscillator can be formed, and the same sensor as the microwave/millimeter wave sensor apparatus of the first embodiment is obtained.
(Fourth Embodiment)
FIG. 7 is a circuit structure diagram of a microwave/millimeter wave sensor apparatus according to a fourth embodiment. Direct current is supplied from the direct current sources DC1 and DC2 to a radiation type oscillator substrate S4, and a signal analysis processing unit P analyzes and processes sensing signals (IF signals) acquired from the radiation type oscillator substrate S4. The microwave/millimeter wave sensor apparatus of this embodiment is the same as the microwave/millimeter wave sensor apparatus of the first embodiment, except for the polarity of the direct current source DC2 and the grounding position. The same components as those of the microwave/millimeter wave sensor apparatus of the foregoing embodiments are denoted by the same reference numerals as those used in the foregoing embodiments, and explanation of them is not repeated here.

Figure 8:
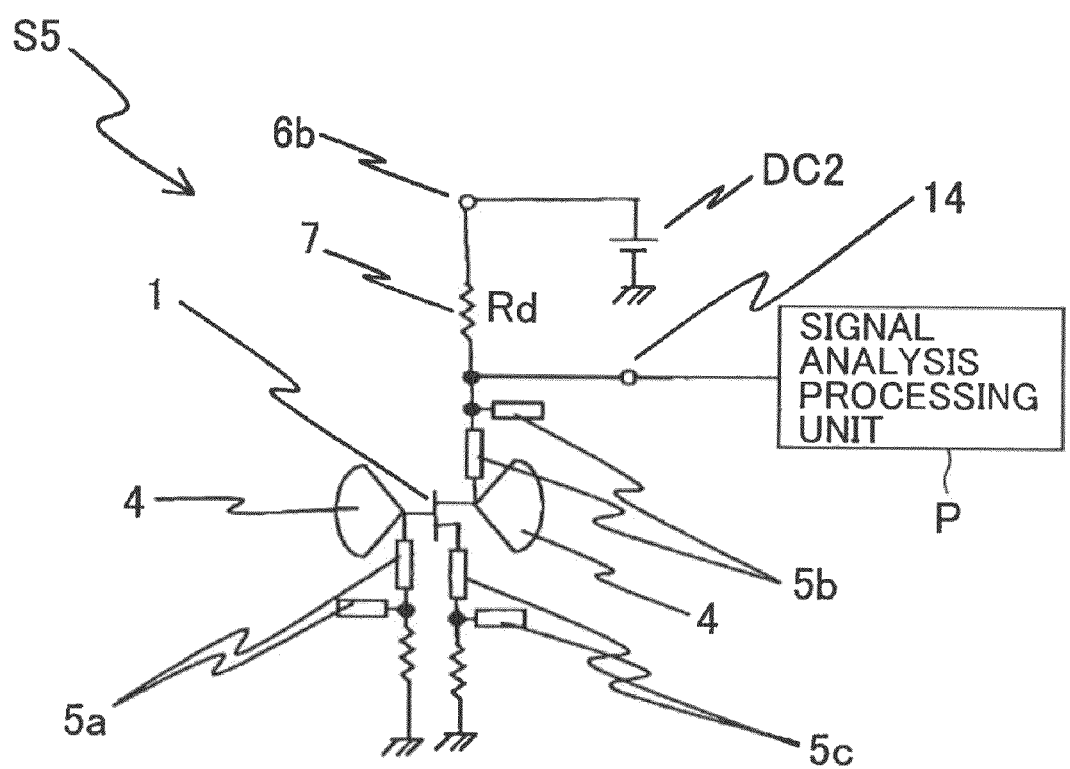
FIG. 8 is a circuit structure diagram of a microwave/millimeter wave sensor apparatus according to a fifth embodiment.
Figure 9:
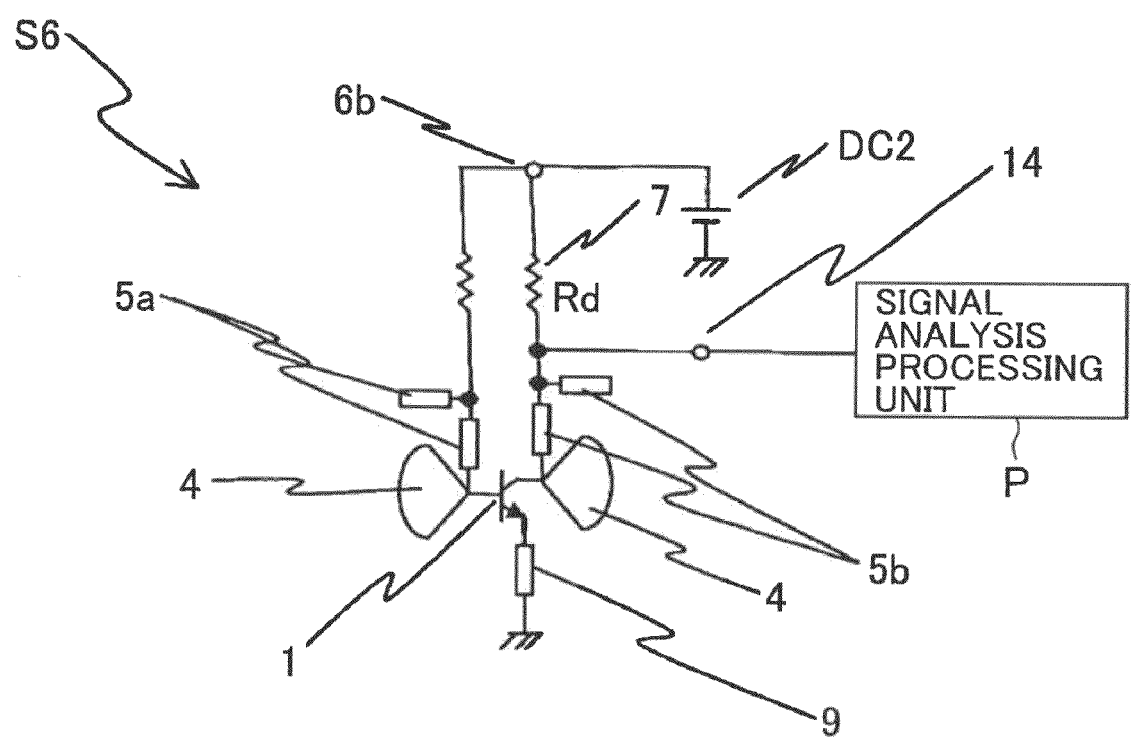
FIG. 9 is a circuit structure diagram of a microwave/millimeter wave sensor apparatus according to a sixth embodiment.
Figure 10:
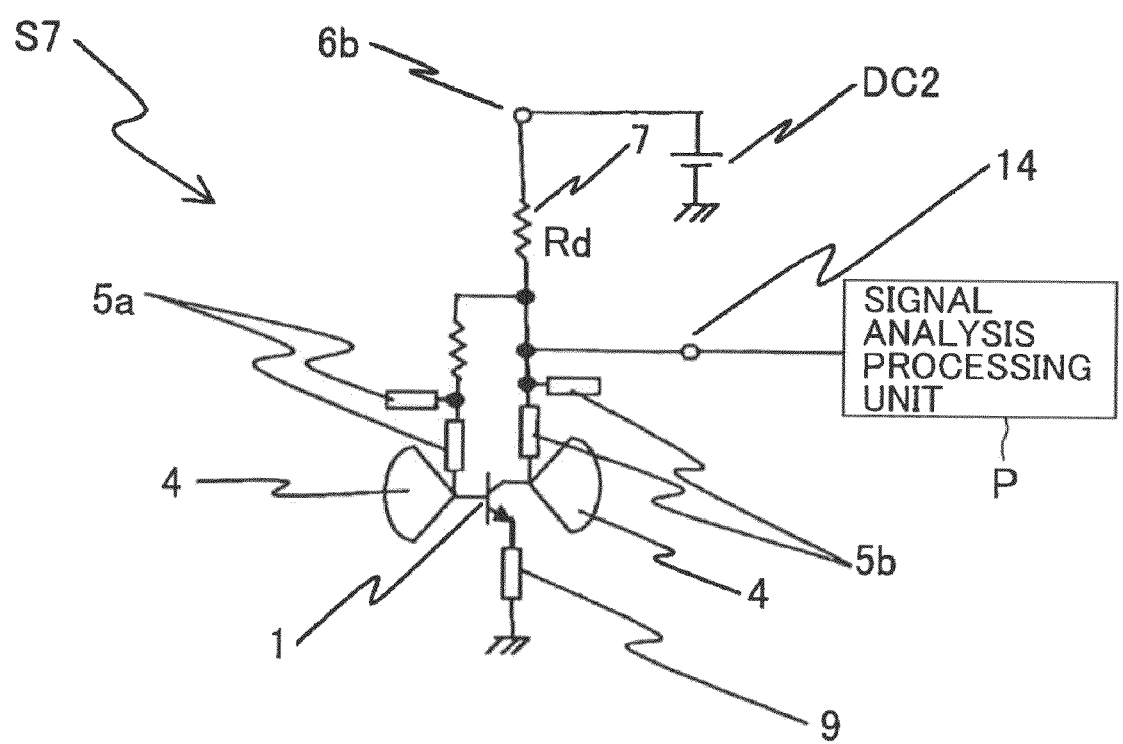
FIG. 10 is a circuit structure diagram of a microwave/millimeter wave sensor apparatus according to a seventh embodiment.
Figure 11:
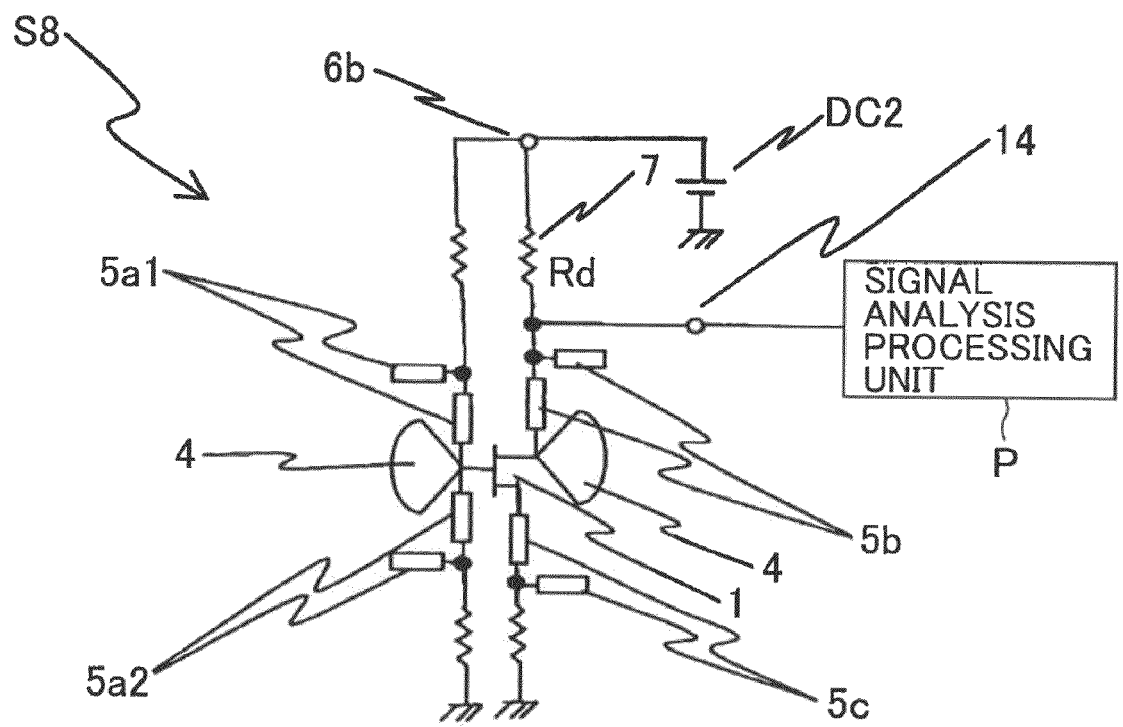
FIG. 11 is a circuit structure diagram of a microwave/millimeter wave sensor apparatus according to an eighth embodiment.
Figure 12:
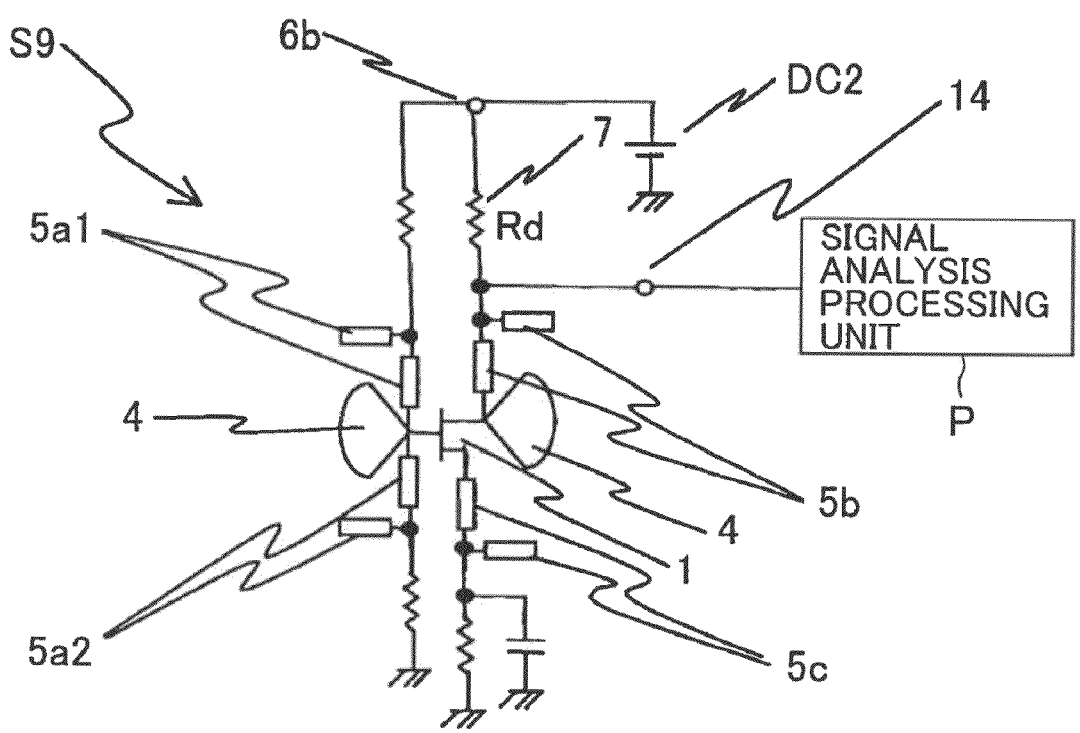
FIG. 12 is a circuit structure diagram of a microwave/millimeter wave sensor apparatus according to a ninth embodiment.

In the radiation type oscillator substrate S4, the connected side of the resistor 7 as the IF-band loading unit is set as the ground potential side, and the direct current source DC2 of a negative voltage is connected to the source side. Only with the reference potential being changed in the radiation type oscillator substrate S4, the same sensor as the microwave/millimeter wave oscillating apparatus of the first embodiment is obtained. In a case where the high-frequency transistor 1 is a field effect transistor or a bipolar junction transistor, the difference between the N-type and the P-type in a field effect transistor or the difference between the NPN type and the PNP type in a bipolar junction transistor is that the polarity of the electrode potential is simply switched between the positive polarity and the negative polarity.
(Fifth Embodiment)
FIG. 8 is a circuit structure diagram of a microwave/millimeter wave sensor apparatus according to a fifth embodiment. Direct current is supplied only from the direct current source DC2 to a radiation type oscillator substrate S5, and a signal analysis processing unit P analyzes and processes sensing signals (IF signals) acquired from the radiation type oscillator substrate S5. In the microwave/millimeter wave sensor apparatus of this embodiment, a depression-type field effect transistor is used as the high-frequency transistor 1, and the self-bias circuit structure of a depression-type field effect transistor is employed. The same components as those of the microwave/millimeter wave sensor apparatus of the foregoing embodiments are denoted by the same reference numerals as those used in the foregoing embodiments, and explanation of them is not repeated here.
(Sixth Embodiment)
FIG. 9 is a circuit structure diagram of a microwave/millimeter wave sensor apparatus according to a sixth embodiment. Direct current is supplied only from the direct current source DC2 to a radiation type oscillator substrate S6, and a signal analysis processing unit P analyzes and processes sensing signals (IF signals) acquired from the radiation type oscillator substrate S6. In the microwave/millimeter wave sensor apparatus of this embodiment, a bipolar junction transistor is used as the high-frequency transistor 1, and the self-bias circuit structure of a bipolar junction transistor is employed. The same components as those of the microwave/millimeter wave sensor apparatus of the foregoing embodiments are denoted by the same reference numerals as those used in the foregoing embodiments, and explanation of them is not repeated here.
(Seventh Embodiment)
FIG. 10 is a circuit structure diagram of a microwave/millimeter wave sensor apparatus according to a seventh embodiment. Direct current is supplied only from the direct current source DC2 to a radiation type oscillator substrate S7, and a signal analysis processing unit P analyzes and processes sensing signals (IF signals) acquired from the radiation type oscillator substrate S7. In the microwave/millimeter wave sensor apparatus of this embodiment, a bipolar junction transistor is used as the high-frequency transistor 1, and the self-bias circuit structure of a bipolar junction transistor is employed. The radiation type oscillator substrate S7 differs from the radiation type oscillator substrate S6 of the sixth embodiment in that the power supply branches to the gate-side RF choke circuit 5a after the voltage drop by the resistor 7. The same components as those of the microwave/millimeter wave sensor apparatus of the foregoing embodiments are denoted by the same reference numerals as those used in the foregoing embodiments, and explanation of them is not repeated here.
(Eighth Embodiment)
FIG. 11 is a circuit structure diagram of a microwave/millimeter wave sensor apparatus according to an eighth embodiment. Direct current is supplied only from the direct current source DC2 to a radiation type oscillator substrate S8, and a signal analysis processing unit P analyzes and processes sensing signals (IF signals) acquired from the radiation type oscillator substrate S8. In the microwave/millimeter wave sensor apparatus of this embodiment, a voltage-dividing self-bias circuit structure is employed, and the gate is connected between a first gate-side RF choke circuit 5a1 and a second gate-side RF choke circuit 5a2. The same components as those of the microwave/millimeter wave sensor apparatus of the foregoing embodiments are denoted by the same reference numerals as those used in the foregoing embodiments, and explanation of them is not repeated here.
(Ninth Embodiment)
FIG. 12 is a circuit structure diagram of a microwave/millimeter wave sensor apparatus according to a ninth embodiment. Direct current is supplied only from the direct current source DC2 to a radiation type oscillator substrate S9, and a signal analysis processing unit P analyzes and processes sensing signals (IF signals) acquired from the radiation type oscillator substrate S9. In the microwave/millimeter wave sensor apparatus of this embodiment, a voltage-dividing self-bias circuit structure of a source resistance bypass type is employed, and a capacitor is connected in parallel to the source-side grounded resistor. The same components as those of the microwave/millimeter wave sensor apparatus of the foregoing embodiments are denoted by the same reference numerals as those used in the foregoing embodiments, and explanation of them is not repeated here.

In each of the microwave/millimeter wave sensor apparatuses according to the fourth embodiment through the ninth embodiment, a biasing method different from the fixed biasing method employed in the microwave/millimeter wave sensor apparatus according to the first embodiment is used. However, there are various direct-current biasing methods other than that, and an appropriate biasing method may be used depending on the desired oscillation condition in the RF band, the desired gain condition in the IF band, the desired feedback condition in the IF band, the type of the high-frequency transistor such as a depression type or an enhancement type, and the like. To utilize the temperature characteristics of a thermistor, a posistor, or a PN junction forward direction voltage Vf, such a thermosensor is placed in a direct-current bias circuit, so as to compensate for the temperature in the characteristics of this sensor apparatus by an environmental temperature. In this manner, the sensor characteristics may be improved.

(Tenth Embodiment)

Figure 13:
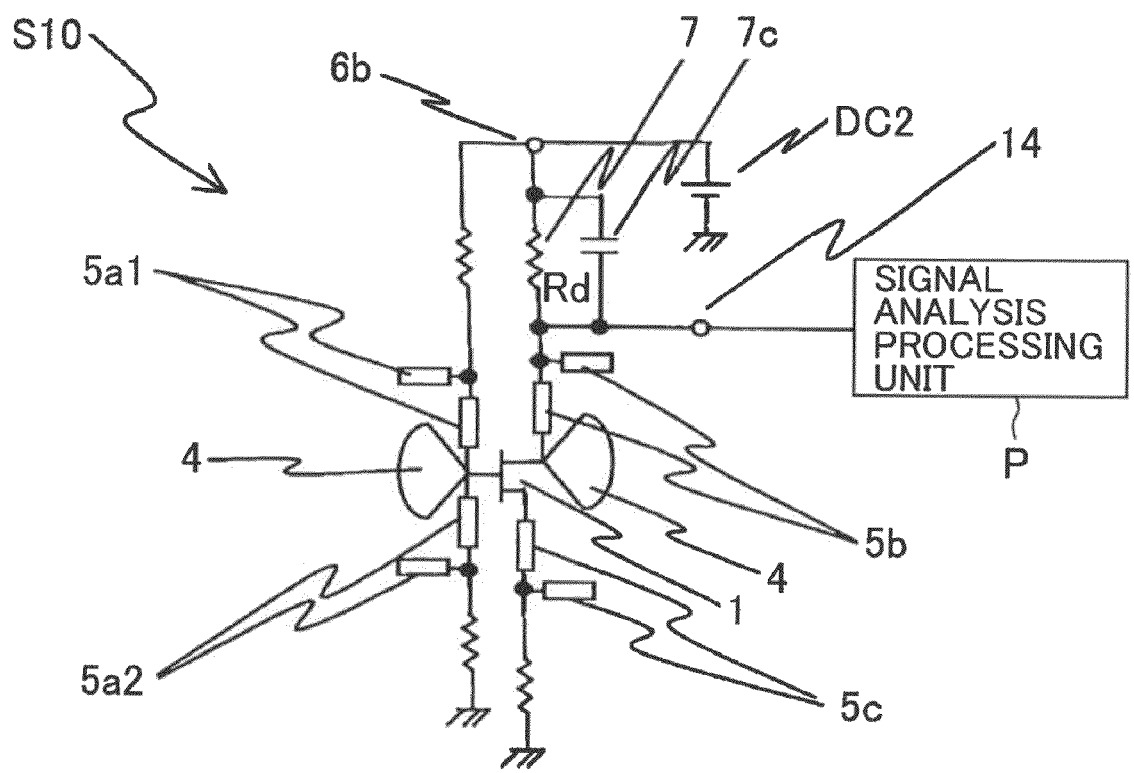
FIG. 13 is a circuit structure diagram of a microwave/millimeter wave sensor apparatus according to a tenth embodiment.

FIG. 13 is a circuit structure diagram of a microwave/millimeter wave sensor apparatus according to a tenth embodiment. Direct current is supplied only from the direct current source DC2 to a radiation type oscillator substrate S10, and a signal analysis processing unit P analyzes and processes sensing signals (IF signals) acquired from the radiation type oscillator substrate S10. In the microwave/millimeter wave sensor apparatus of this embodiment, a voltage-dividing self-bias circuit structure of a drain load bypass type is employed. This circuit structure is the same as the voltage-dividing (series-feedback) self-bias circuit structure employed in the eighth embodiment, except that a capacitor 7c is connected in parallel to the resistor 7 as the IF-band loading unit. The same components as those of the microwave/millimeter wave sensor apparatus of the foregoing embodiments are denoted by the same reference numerals as those used in the foregoing embodiments, and explanation of them is not repeated here.

In the radiation type oscillator substrate S10, the capacitance value of the capacitor 7c is appropriately set, so that the IF signal amplifying function can have low-pass amplifying (high-pass attenuating) frequency characteristics. Accordingly, noise and signals in unnecessary bands can be attenuated, and the sensor characteristics can be effectively improved. For example, in a case where the resistance value of the resistor 7 is 100[Ω], and the IF signal is a signal in a DC to 1 kHz band, high-pass attenuating characteristics with the cutoff frequency fc being $1/(2\pi \times 1.5 \times 10-6 \times 100)$, which is almost equal to 1 kHz, are obtained by setting the capacitance value of the capacitor 7c at 1.5 [μF]. Accordingly, noise and signals in unnecessary bands of 1 kHz and higher can be attenuated.

(Eleventh Embodiment)

Figure 14:
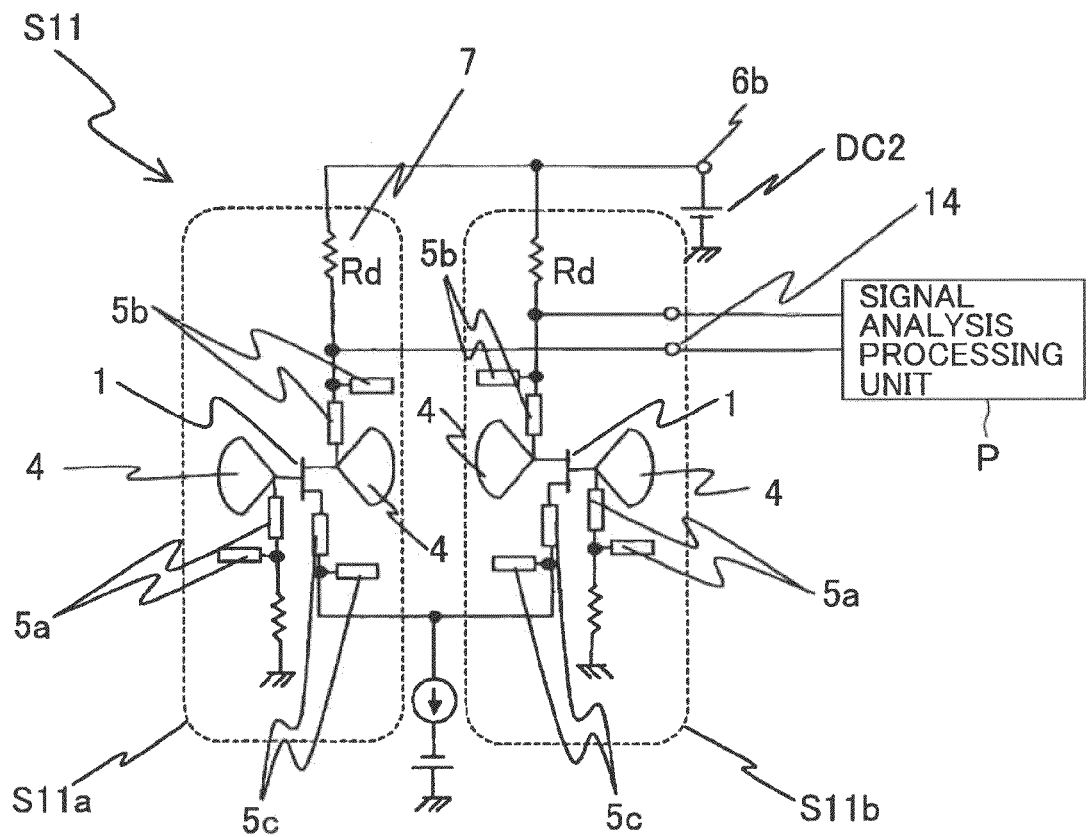
FIG. 14 is a circuit structure diagram of a microwave/millimeter wave sensor apparatus according to an eleventh embodiment.

FIG. 14 is a circuit structure diagram of a microwave/millimeter wave sensor apparatus according to an eleventh embodiment. A radiation type oscillator substrate S11 includes a first radiation type oscillator S11a and a second radiation type oscillator S11b that have the same structures as each other. The sources of the high-frequency transistors 1 of the first and second radiation type oscillators S11a and S11b are connected to each other. With this arrangement, biasing is performed so that the sum of the source currents of the two high-frequency transistors 1 becomes constant, and a differential amplifying operation is performed in the IF band. The same components as those of the microwave/millimeter wave sensor apparatus of the foregoing embodiments are denoted by the same reference numerals as those used in the foregoing embodiments, and explanation of them is not repeated here.

In the radiation type oscillator substrate S11, the temperature drift that is particularly problematic during direct-current amplifying operations can be advantageously reduced, since the first radiation type oscillator S11a and the second radiation type oscillator S11b have differential structures. Also, electromagnetic coupling is spatially caused between an oscillation RF signal of the first radiation type oscillator S11a and an oscillation RF signal of the second radiation type oscillator S11b, and a synchronized state is created. The distance between the first radiation type oscillator S11a and the second radiation type oscillator S11b is appropriately set. With this arrangement, the information about the phase difference between the receive RF signals (the waves reflected from the measured object) entering the first radiation type oscillator S11a and the second radiation type oscillator S11b can be acquired from IF signals. Alternatively, one of the first radiation type oscillator S11a and the second radiation type oscillator S11b may not have the conductor patches, and may not oscillate. With appropriate bias being applied, the other one of the first radiation type oscillator S11a and the second radiation type oscillator S11b may be used as a sensor apparatus.

(Twelfth Embodiment)

Figure 15:
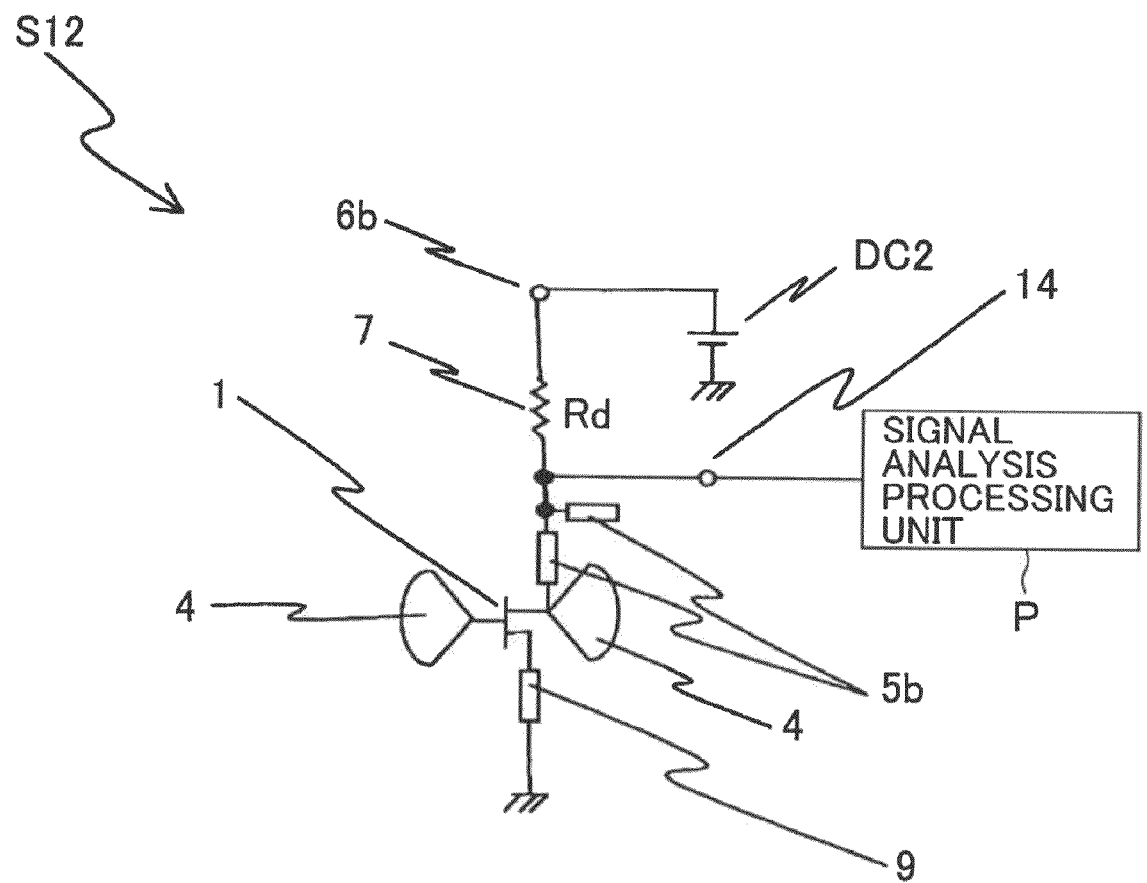
FIG. 15 is a circuit structure diagram of a microwave/millimeter wave sensor apparatus according to a twelfth embodiment.

FIG. 15 is a circuit structure diagram of a microwave/millimeter wave sensor apparatus according to a twelfth embodiment. In a radiation type oscillator substrate S12, an RF choke circuit is not connected to but only a conductor patch 4 is connected to the gate of the high-frequency transistor 1, and a gate-side bias circuit is eliminated by the self-bias of the high-frequency transistor 1 that is oscillating. The same components as those of the microwave/millimeter wave sensor apparatus of the foregoing embodiments are denoted by the same reference numerals as those used in the foregoing embodiments, and explanation of them is not repeated here.

(Thirteenth Embodiment)

Figure 16:
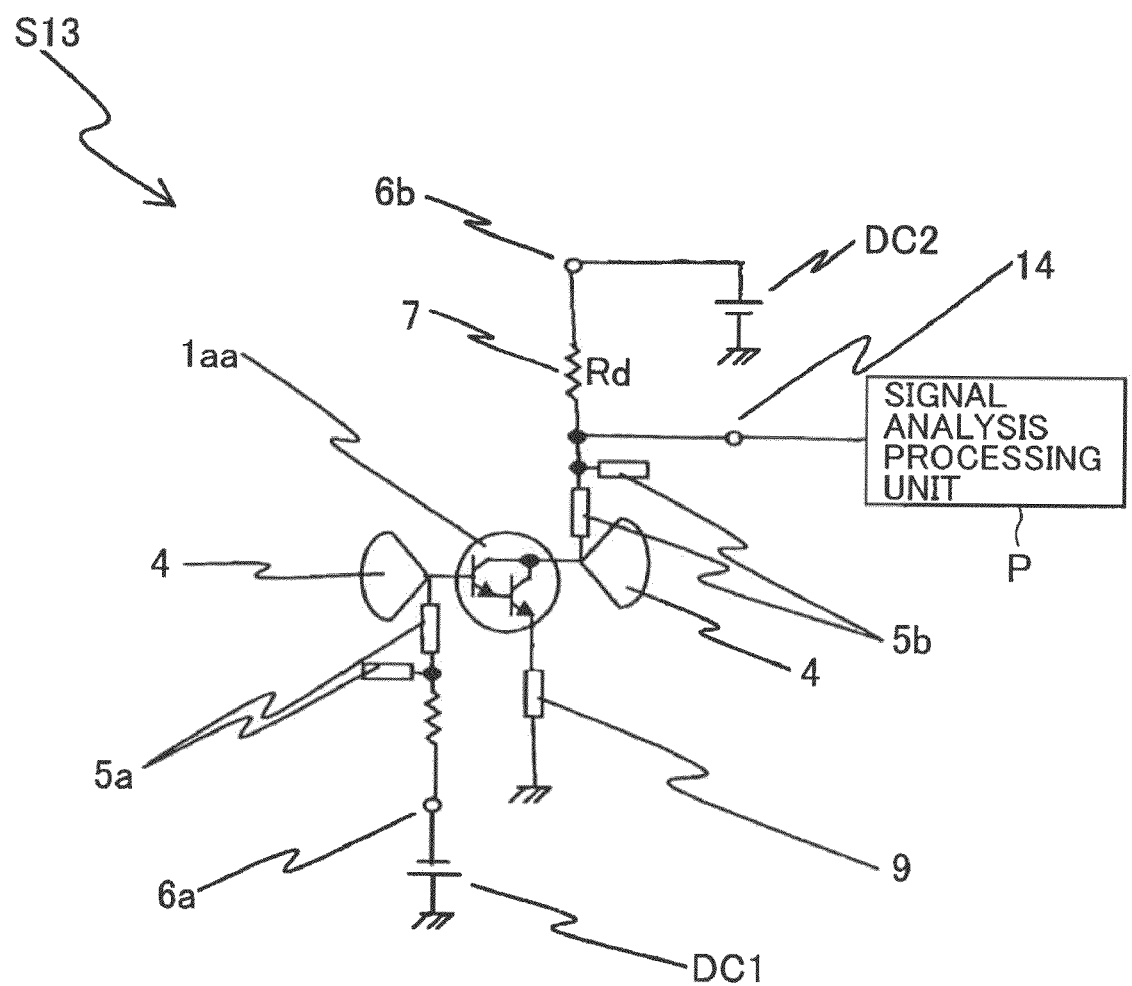
FIG. 16 is a circuit structure diagram of a microwave/millimeter wave sensor apparatus according to a thirteenth embodiment.

FIG. 16 is a circuit structure diagram of a microwave/millimeter wave sensor apparatus according to a thirteenth embodiment. In a radiation type oscillator substrate S13, a three-electrode high-frequency amplifying device 1aa formed with a plurality of transistors is used, instead of the high-frequency transistor 1. This three-electrode high-frequency amplifying device 1aa is an example of a Darlington connection bipolar transistor. The same components as those of the microwave/millimeter wave sensor apparatus of the foregoing embodiments are denoted by the same reference numerals as those used in the foregoing embodiments, and explanation of them is not repeated here.

(Fourteenth Embodiment)

Figure 17:
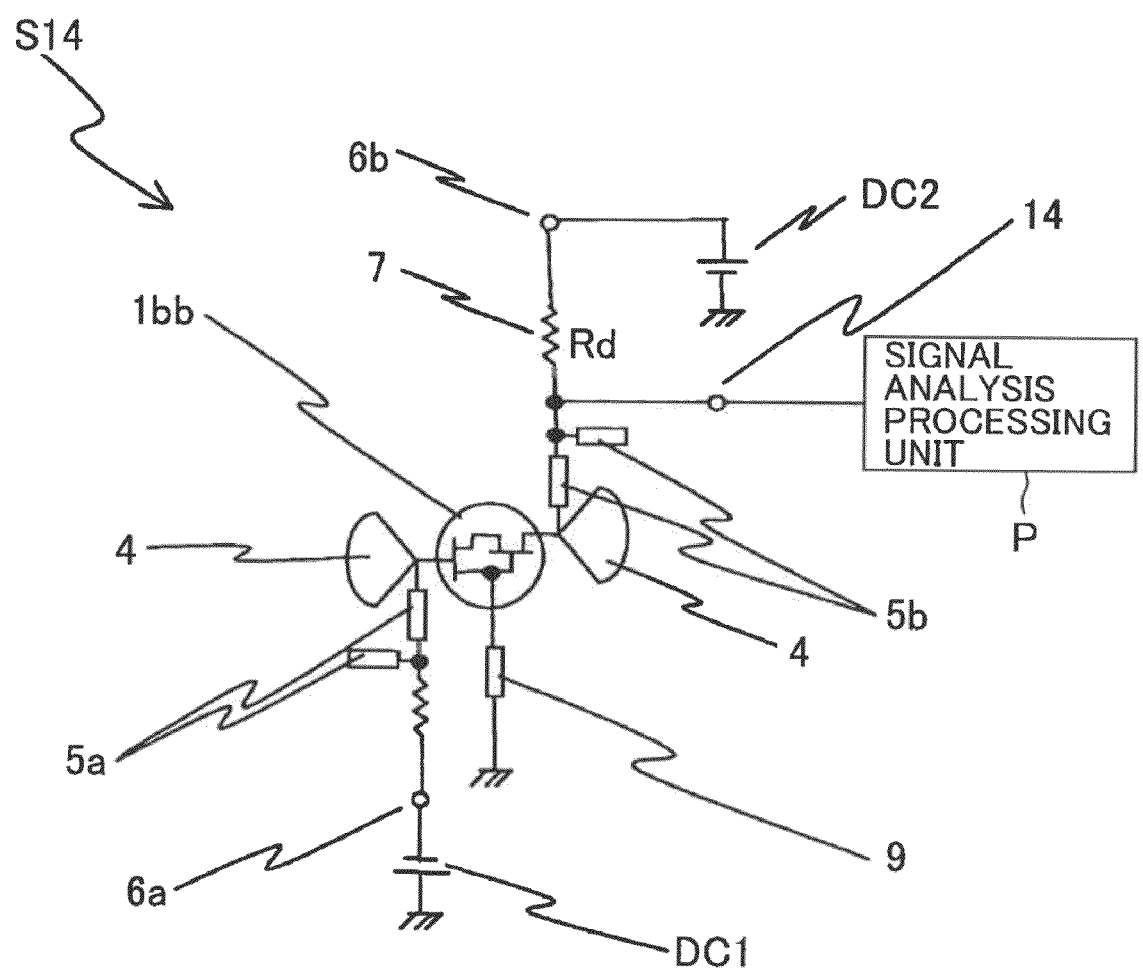
FIG. 17 is a circuit structure diagram of a microwave/millimeter wave sensor apparatus according to a fourteenth embodiment.

FIG. 17 is a circuit structure diagram of a microwave/millimeter wave sensor apparatus according to a fourteenth embodiment. In a radiation type oscillator substrate S14, a three-electrode high-frequency amplifying device 1bb formed with a plurality of transistors is used, instead of the high-frequency transistor 1. This three-electrode high-frequency amplifying device 1bb is an example of a cascode connection field effect transistor. The same components as those of the microwave/millimeter wave sensor apparatus of the foregoing embodiments are denoted by the same reference numerals as those used in the foregoing embodiments, and explanation of them is not repeated here.

(Fifteenth Embodiment)

Figure 18:
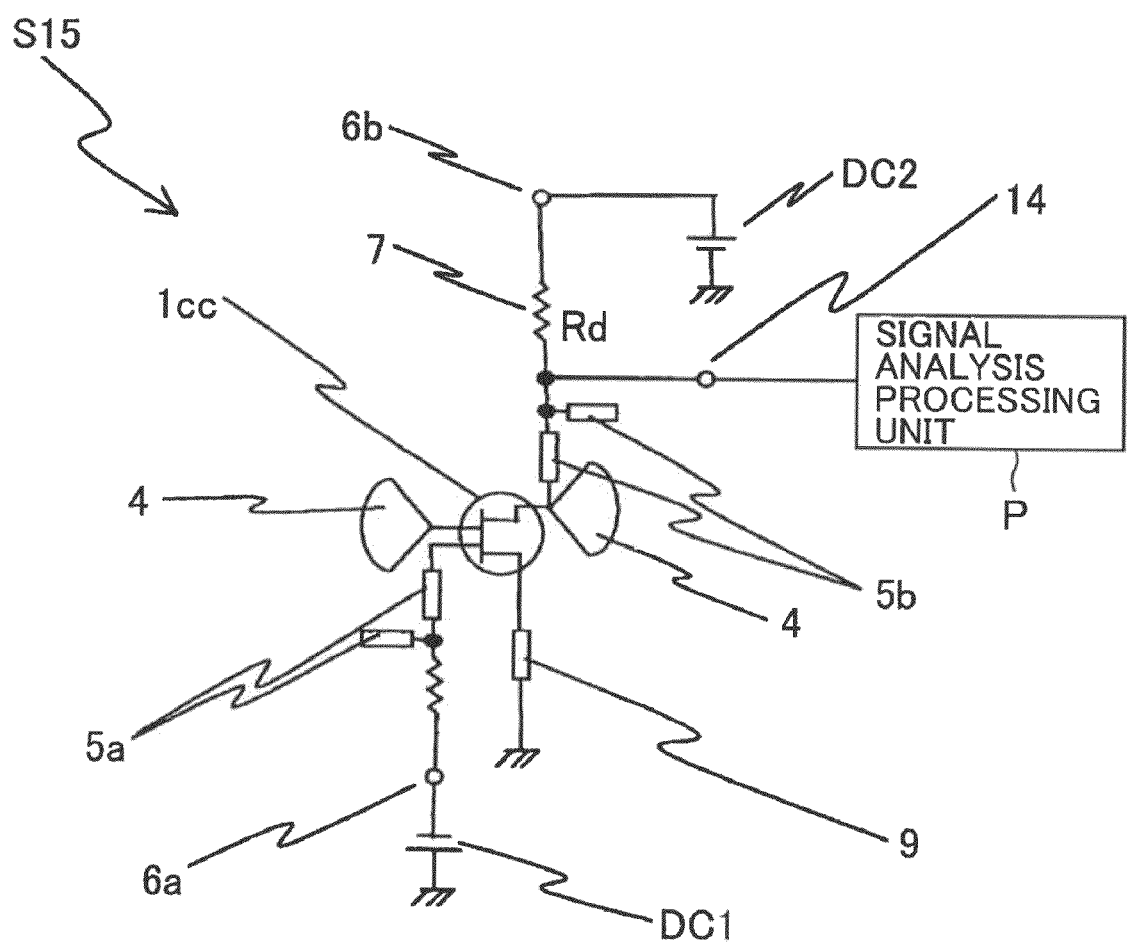
FIG. 18 is a circuit structure diagram of a microwave/millimeter wave sensor apparatus according to a fifteenth embodiment.

FIG. 18 is a circuit structure diagram of a microwave/millimeter wave sensor apparatus according to a fifteenth embodiment. In a radiation type oscillator substrate S15, a dual-gate field effect transistor 1cc is used, instead of the high-frequency transistor 1. The dual-gate field effect transistor 1cc has four terminals, and two of the four terminals are gates that are equivalent to control terminals. Accordingly, this dual-gate field effect transistor 1cc can also be used as a three-electrode high-frequency amplifying device. The same components as those of the microwave/millimeter wave sensor apparatus of the foregoing embodiments are denoted by the same reference numerals as those used in the foregoing embodiments, and explanation of them is not repeated here.

In each of the microwave/millimeter wave sensor apparatuses according to the thirteenth through the fifteenth embodiments, a Darlington connection bipolar transistor, a cascode connection field effect transistor, or a dual-gate field effect transistor is used as an example of a three-electrode high-frequency amplifying device formed with a plurality of transistors. However, the present invention is not limited to those structures, and any three-electrode amplifier circuit device that has the negative resistance satisfying an oscillation condition in the RF band and has amplification gain from DC to IF bands can be applied to the present invention.

(Sixteenth Embodiment)

Figure 19:
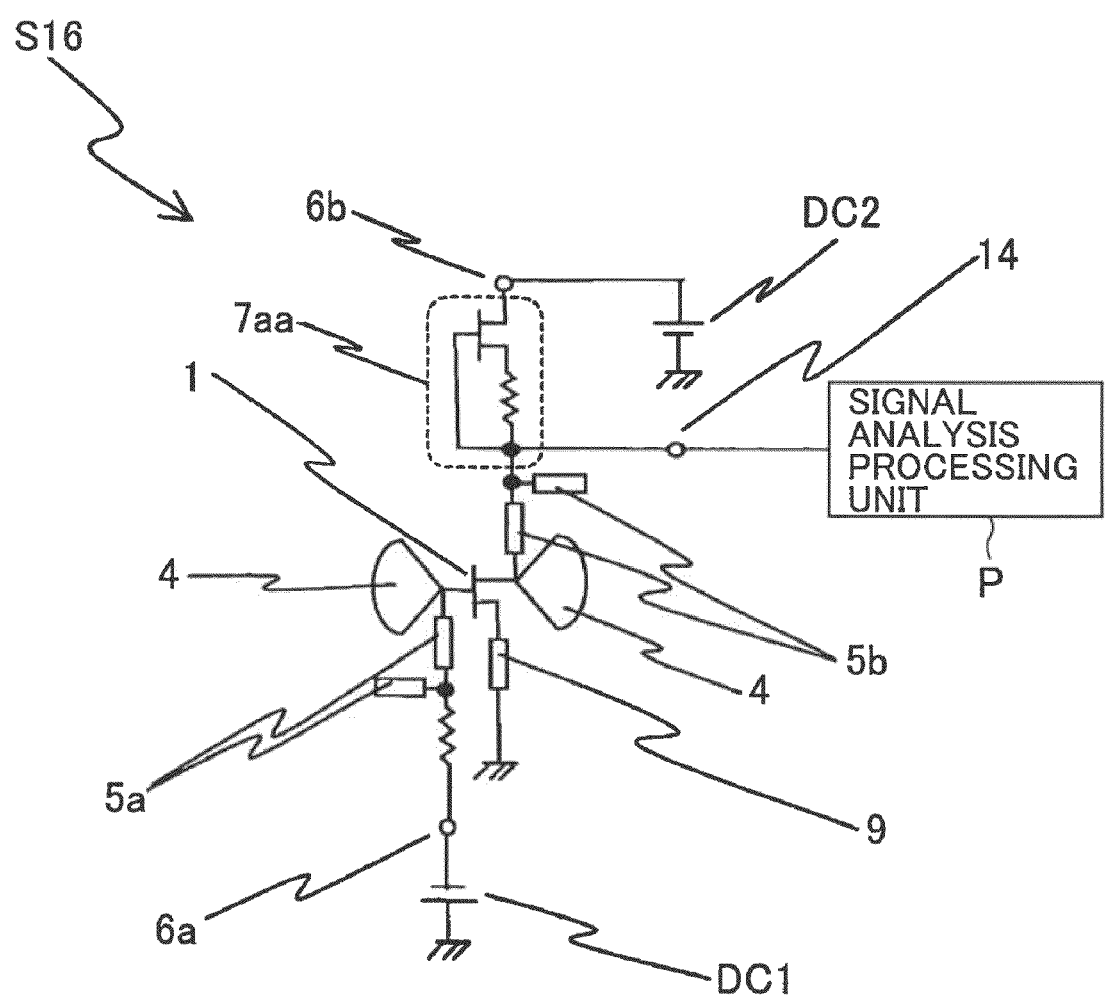
FIG. 19 is a circuit structure diagram of a microwave/millimeter wave sensor apparatus according to a sixteenth embodiment.

FIG. 19 is a circuit structure diagram of a microwave/millimeter wave sensor apparatus according to a sixteenth embodiment. In a radiation type oscillator substrate S16, a constant current circuit 7aa is used, instead of the resistor 7 as the IF-band loading unit. This constant current circuit 7aa is a circuit structure that utilizes the constant current characteristics of a field effect transistor. The same components as those of the microwave/millimeter wave sensor apparatus of the foregoing embodiments are denoted by the same reference numerals as those used in the foregoing embodiments, and explanation of them is not repeated here.

(Seventeenth Embodiment)

Figure 20:
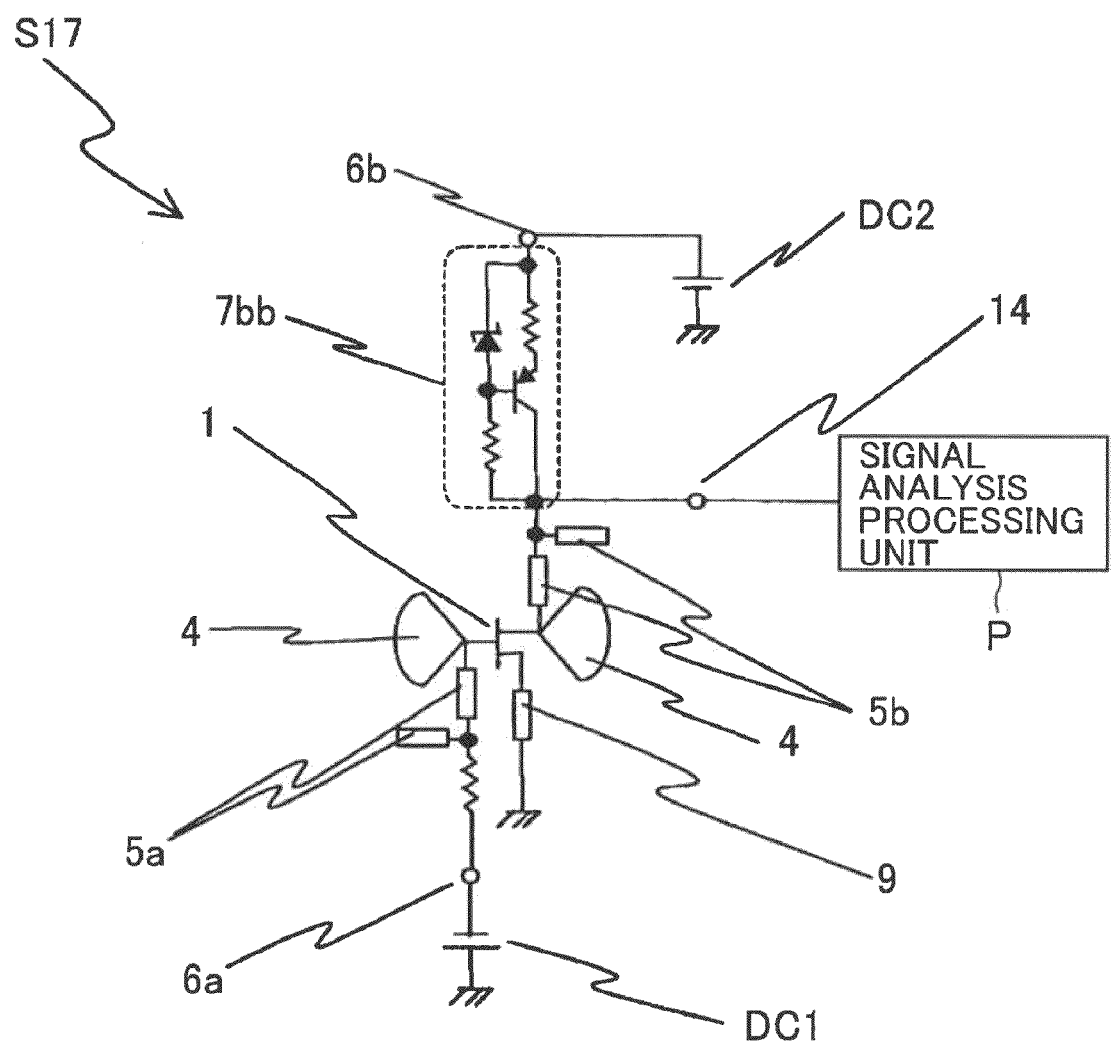
FIG. 20 is a circuit structure diagram of a microwave/millimeter wave sensor apparatus according to a seventeenth embodiment.

FIG. 20 is a circuit structure diagram of a microwave/millimeter wave sensor apparatus according to a seventeenth embodiment. In a radiation type oscillator substrate S17, a constant current circuit 7bb is used, instead of the resistor 7 as the IF-band loading unit. This constant current circuit 7bb is a circuit structure that utilizes a transistor and a constant voltage diode. The same components as those of the microwave/millimeter wave sensor apparatus of the foregoing embodiments are denoted by the same reference numerals as those used in the foregoing embodiments, and explanation of them is not repeated here.

(Eighteenth Embodiment)

Figure 21:
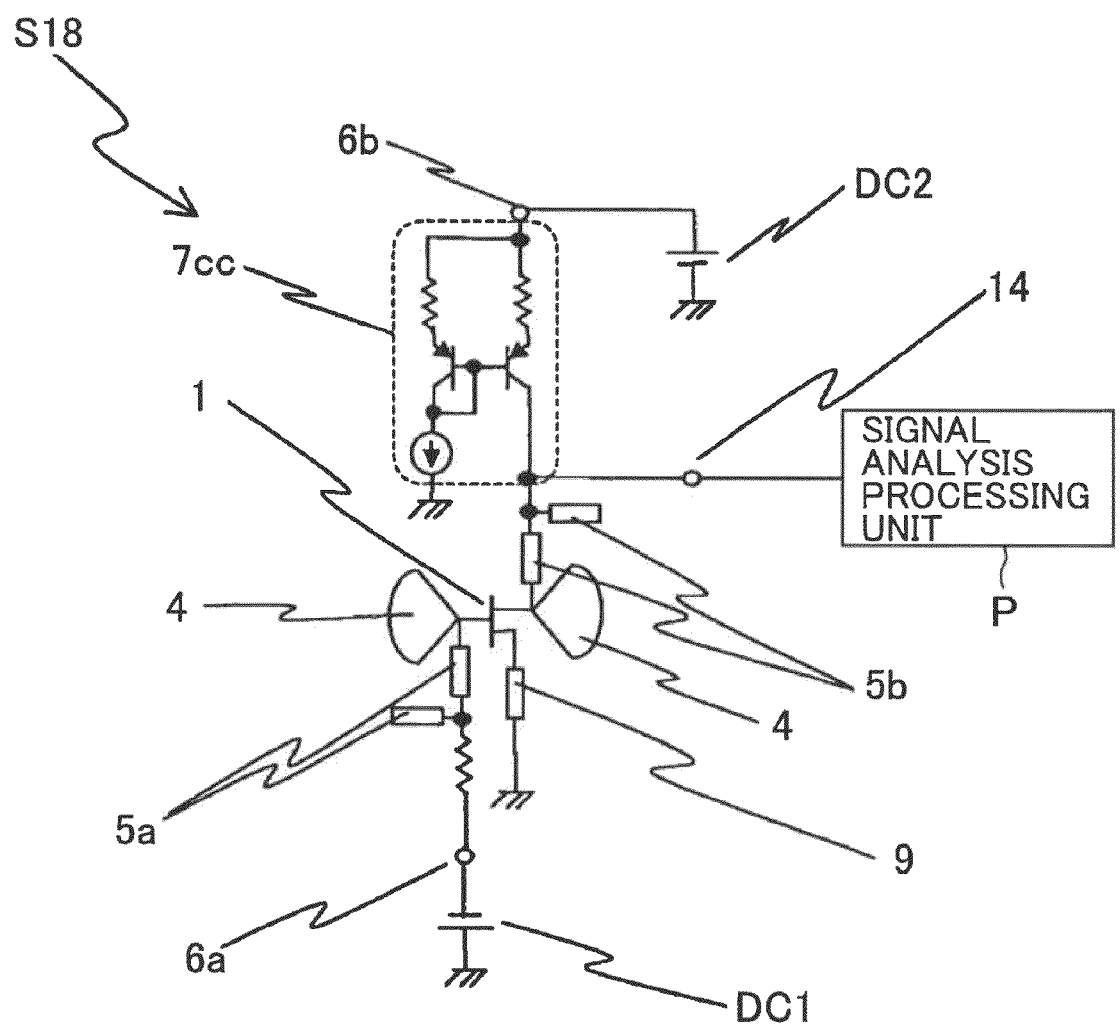
FIG. 21 is a circuit structure diagram of a microwave/millimeter wave sensor apparatus according to an eighteenth embodiment.

FIG. 21 is a circuit structure diagram of a microwave/millimeter wave sensor apparatus according to an eighteenth embodiment. In a radiation type oscillator substrate S18, a constant current circuit 7cc is used, instead of the resistor 7 as the IF-band loading unit. This constant current circuit 7cc is a current mirror circuit structure formed with a transistor. The same components as those of the microwave/millimeter wave sensor apparatus of the foregoing embodiments are denoted by the same reference numerals as those used in the foregoing embodiments, and explanation of them is not repeated here.

(Nineteenth Embodiment)

Figure 22:
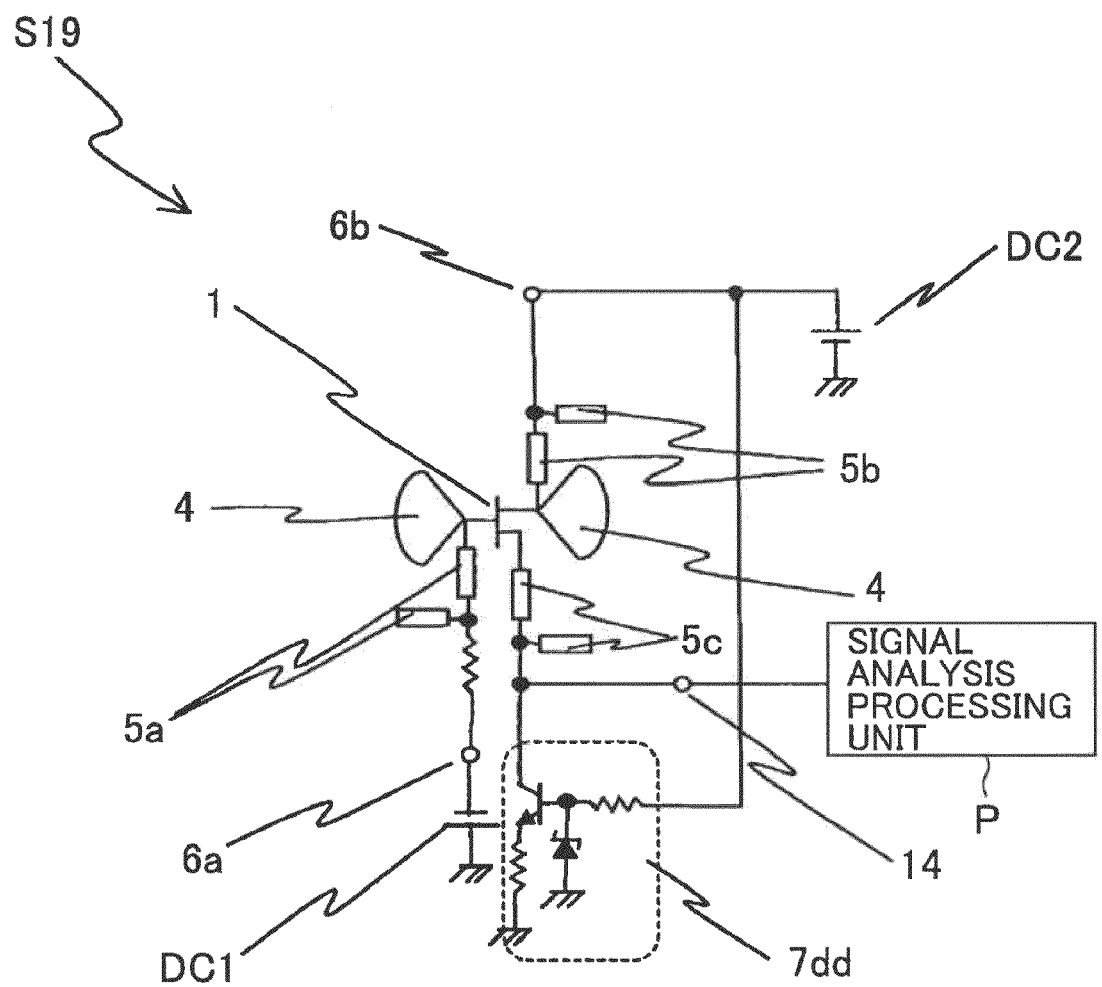
FIG. 22 is a circuit structure diagram of a microwave/millimeter wave sensor apparatus according to a nineteenth embodiment.

FIG. 22 is a circuit structure diagram of a microwave/millimeter wave sensor apparatus according to a nineteenth embodiment. In a radiation type oscillator substrate S19, a constant current circuit 7dd is used, instead of the resistor 7 as the IF-band loading unit. This constant current circuit 7dd is a circuit structure that is the same as the constant current circuit 7bb of the seventeenth embodiment, except for being of a suction type instead of the discharging type. The same components as those of the microwave/millimeter wave sensor apparatus of the foregoing embodiments are denoted by the same reference numerals as those used in the foregoing embodiments, and explanation of them is not repeated here.

(Twentieth Embodiment)

Figure 23:
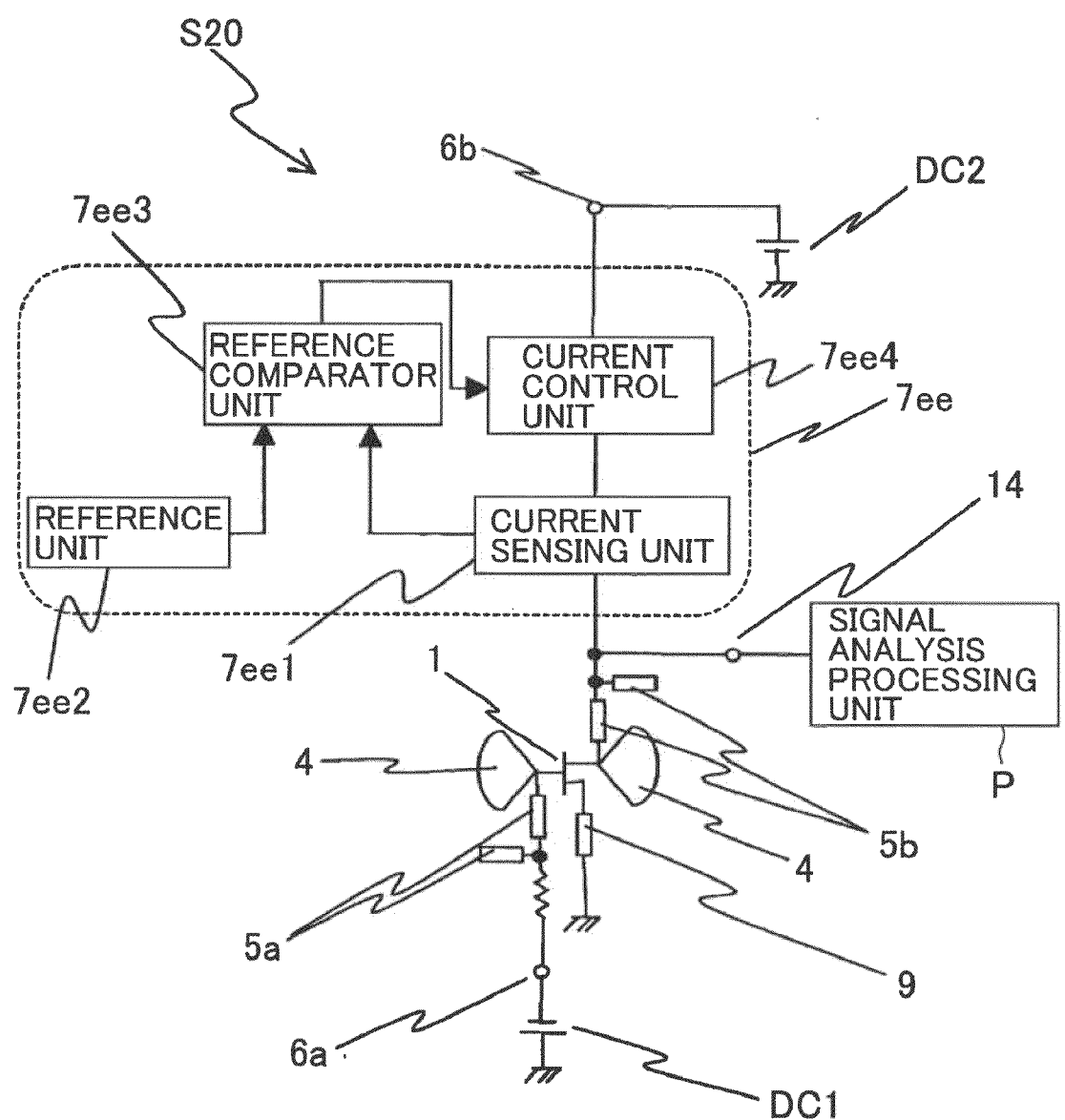
FIG. 23 is a circuit structure diagram of a microwave/millimeter wave sensor apparatus according to a twentieth embodiment.

FIG. 23 is a circuit structure diagram of a microwave/millimeter wave sensor apparatus according to a twentieth embodiment. In a radiation type oscillator substrate S20, a constant current circuit lee is used, instead of the resistor 7 as the IF-band loading unit. This constant current circuit lee includes: a current sensing unit 7ee1 that senses a current amount; a reference unit 7ee2 that outputs a control reference value; a reference comparator unit 7ee3 that compares the sensed value supplied from the current sensing unit 7ee1 with the reference value supplied from the reference unit 7ee2, and outputs the difference; and a current control unit 7ee4 that controls the current to approximate the control reference value, based on the difference information supplied from the reference comparator unit 7ee3. Various circuit structures may be used as the respective components. For example, the current sensing unit 7ee1 may be a resistor with a small resistance value, the reference unit 7ee2 may be a reference constant voltage source, the reference comparator unit 7ee3 may be a voltage error amplifier formed with an operational amplifier, and the current control unit 7ee4 may be a transistor. With this arrangement, the potential drop caused by the current flowing into the resistor is compared with the reference voltage source voltage, and current control is performed. Accordingly, a constant current operation can be realized with a simple circuit structure. The same components as those of the microwave/millimeter wave sensor apparatus of the foregoing embodiments are denoted by the same reference numerals as those used in the foregoing embodiments, and explanation of them is not repeated here.

In each of the microwave/millimeter wave sensor apparatuses according to the sixteenth through the twentieth embodiments, a constant current circuit is used as the IF-band loading unit. However, the present invention is not limited to that, and a loading unit that can obtain desired impedance in the IF band may utilize the IF-band amplification gain of the high-frequency transistor. Where the frequency of an IF signal is relatively high, an inductor (such as a coil) with an inductance value that can obtain high impedance at the frequency may be used as the IF-band loading unit. Alternatively, a thermosensor may be placed in the IF-band loading unit, so as to compensate for the temperature in the characteristics of this sensor apparatus with an environmental temperature.

In each of the microwave/millimeter wave sensor apparatus according to the above embodiments, the pair of conductor patches 4 each having a fan-like shape are mounted on a radiation type oscillator substrate. However, the shapes of the conductor patches forming the resonating cavities are not particularly limited, and the two conductor patches are not necessarily placed in an axis-symmetric manner. In the following, modifications of resonating cavities that can be used in the present invention will be described.

Figure 24A:
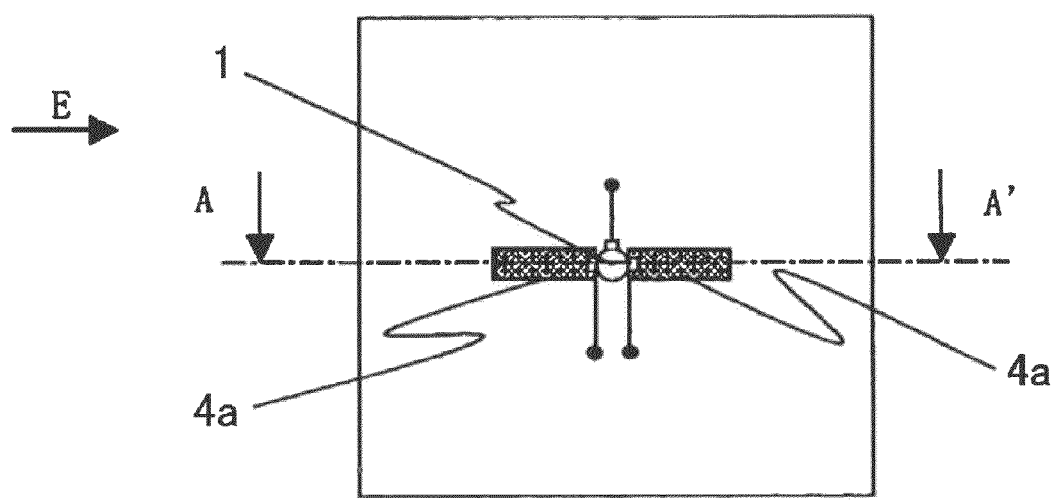
FIG. 24A and FIG. 24B are schematic views of a first example structure including resonating cavities that can be used in the present invention.
Figure 24B:
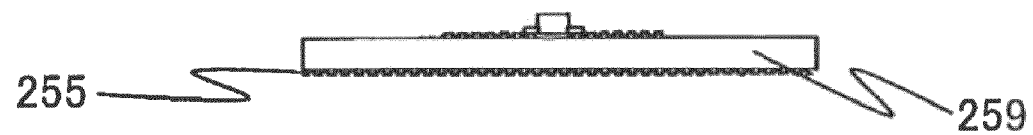
Figure 25A:
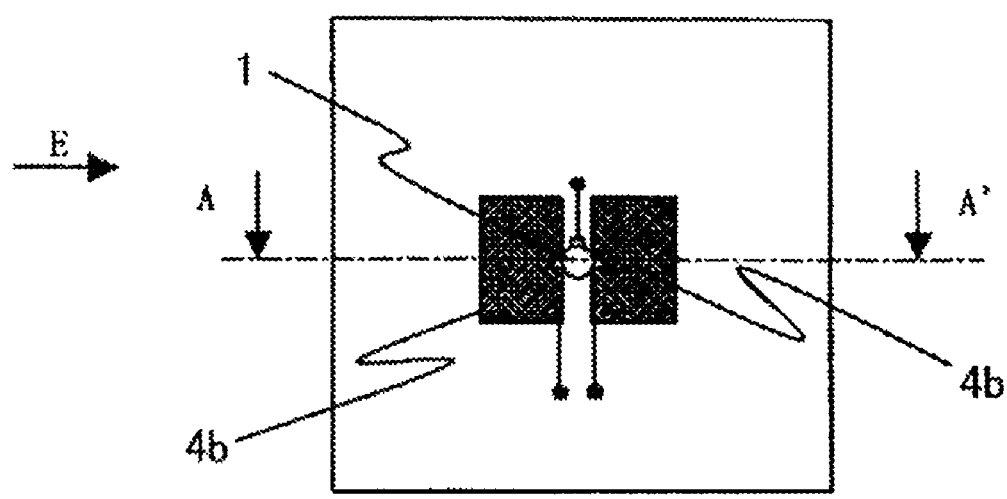
FIG. 25A and FIG. 25B are schematic views of a second example structure including resonating cavities that can be used in the present invention.
Figure 25B:
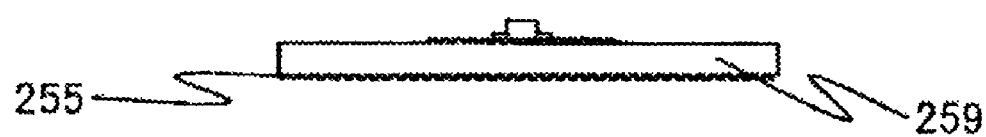
Figure 26A:
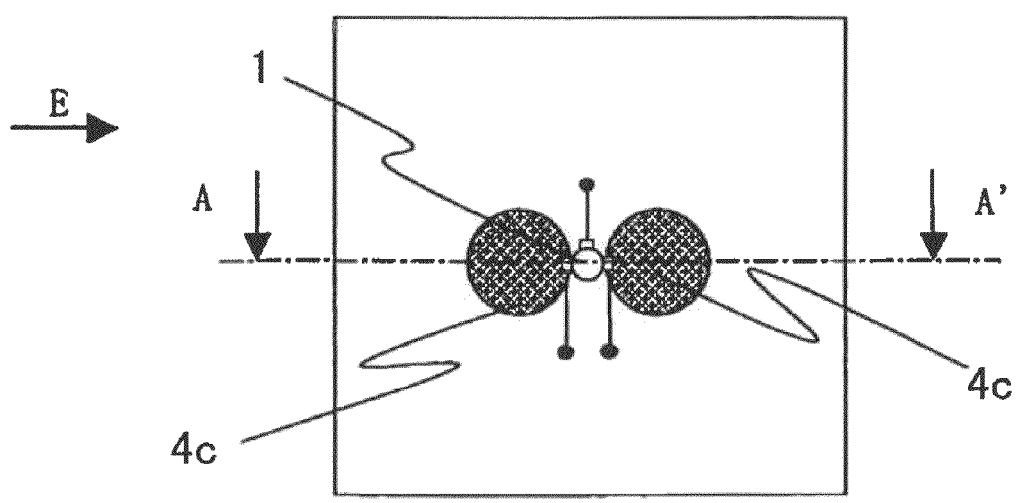
FIG. 26A and FIG. 26B are schematic views of a third example structure including resonating cavities that can be used in the present invention.
Figure 26B:
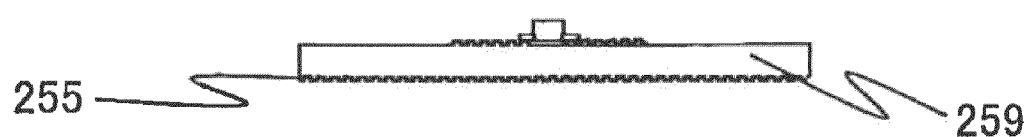
Figure 27A:
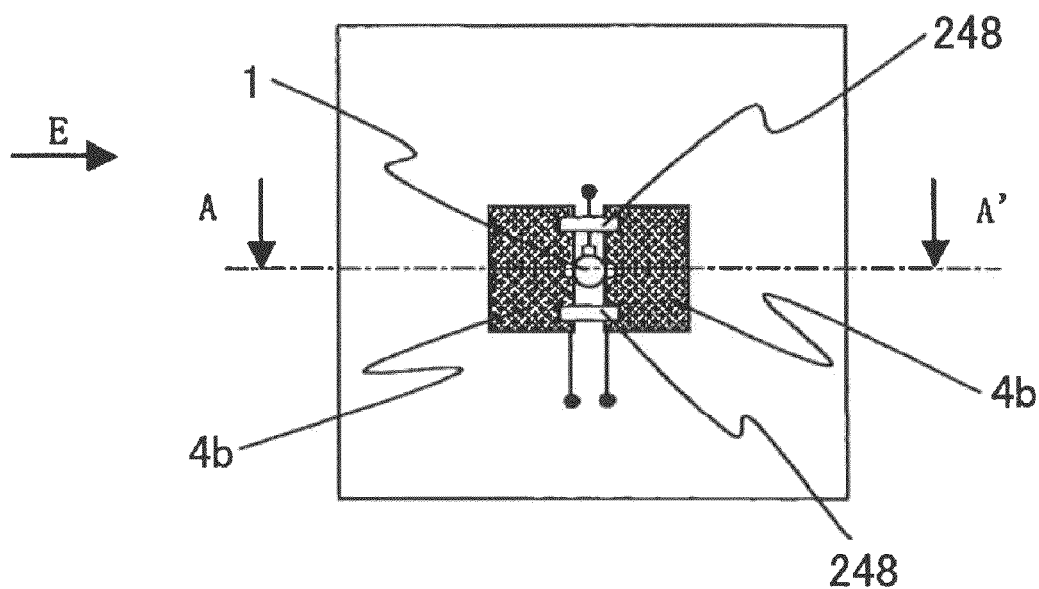
FIG. 27A and FIG. 27B are schematic views of a fourth example structure including resonating cavities that can be used in the present invention.
Figure 27B:
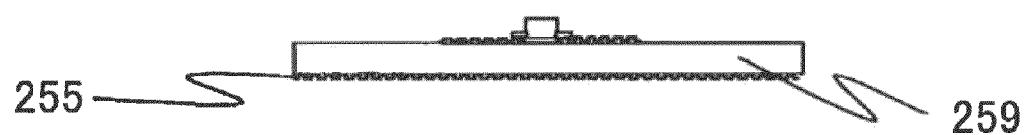

FIG. 24A and FIG. 24B schematically show the structure of a first modification in which a pair of rectangular conductor patches 4a are provided in an axis-symmetric manner. FIG. 25A and FIG. 25B schematically show the structure of a second modification in which a pair of rectangular conductor patches 4b are provided in an axis-symmetric manner. FIG. 26A and FIG. 26B schematically show the structure of a third modification in which a pair of round conductor patches 4c are provided in an axis-symmetric manner. Other than those conductor patches, it is possible to use conductor patches having polygonal shapes such as triangular shapes, oval shapes, fan-like shapes, and the like. In FIG. 24A, FIG. 25A, and FIG. 26A, the direction of the electric field is represented by the arrow E, so as to indicate the principal polarization plane. As in the above modifications, the direction of the electric field is represented by the arrow E in the schematic views of fourth through twelfth modifications of the structure of the resonating cavities described below. For each of the conductor patches 4a through 4c, a GND conductor face 255 is equivalent to the inner layer GND 12. For each of the conductor patches 4a through 4c, a dielectric substrate 259 is equivalent to the front surface side dielectric substrate 10. The conductor patches 4a through 4c, the GND conductor face 255, and the dielectric substrate 259 form resonating cavities and part of the feedback circuit for oscillating operations. However, if the feedback can be properly obtained, there is no need to provide the dielectric substrate 259 and the GND conductor face 255. For example, in a case where conductor patches are formed through sheet-metal processing, and there is a mechanism for holding the conductor patch sheets, the dielectric substrate 259 may be hollow. As in a fourth modification shown in FIG. 27A and FIG. 27B, feedback components 248 such as chip capacitors for facilitating the above feedback may be mounted on the conductor patches 4b. Since the radiation is performed in the two plane directions of the conductor patch sheets when the GND conductor face 255 does not exist, this structure can function as a sensor that senses a wider angle range than in a case where the GND conductor face 255 exists, utilizing the two-plane radiation.

Figure 28A:
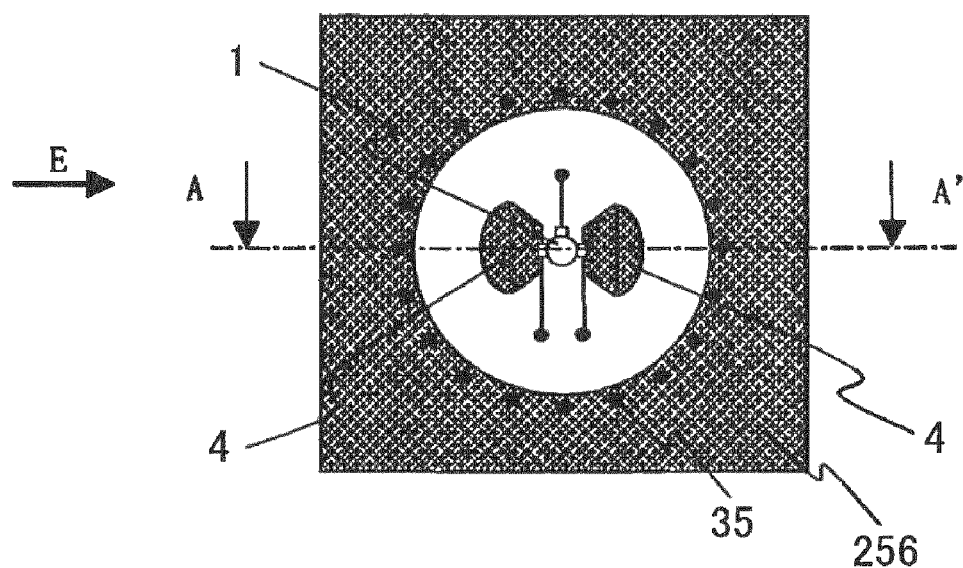
FIG. 28A and FIG. 28B are schematic views of a fifth example structure including resonating cavities that can be used in the present invention.
Figure 28B:
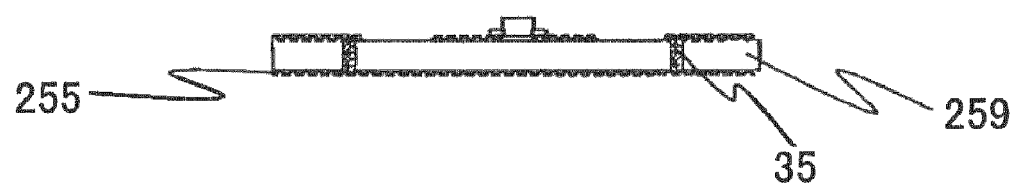

A fifth modification shown in FIG. 28A and FIG. 28B is an example in which a GND conductor face 256 and through holes 35 connecting the GND conductor face 256 to the GND conductor face 255 are formed around the conductor patches 4 having fan-like shapes, and signal transmission through the inside of the dielectric substrate 259 and signal leakage from the end of the substrate are prevented. Thus, leakage loss is avoided. By properly setting the size and shape of the GND conductor face 256, the signal energy of the loss to be caused by signal transmission in the dielectric substrate 259 can be used as the original radiation energy, instead of the signal being transmitted in the dielectric substrate 259.

Figure 29A:
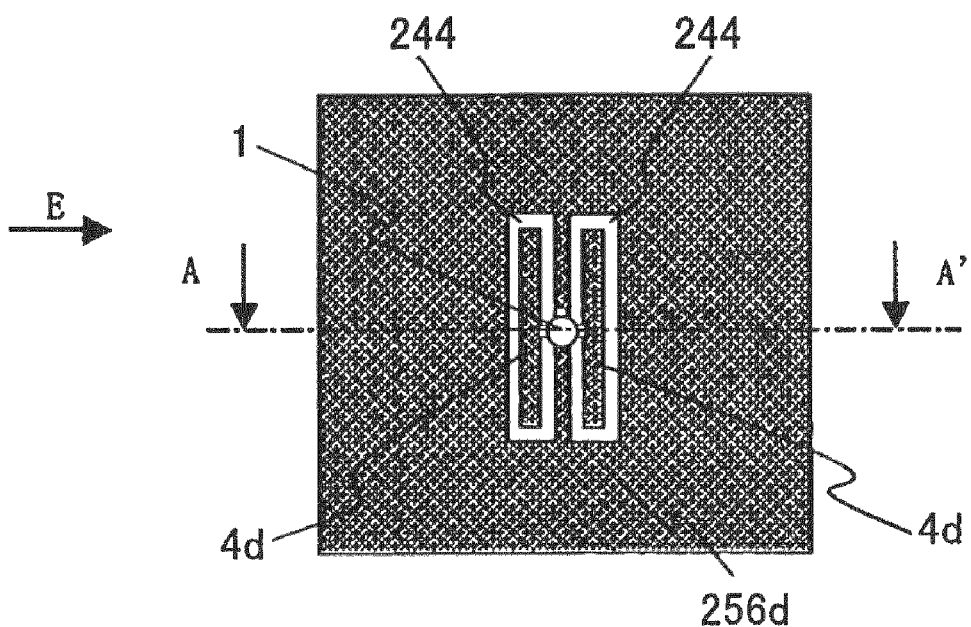
FIG. 29A and FIG. 29B are schematic views of a sixth example structure including resonating cavities that can be used in the present invention.
Figure 29B:
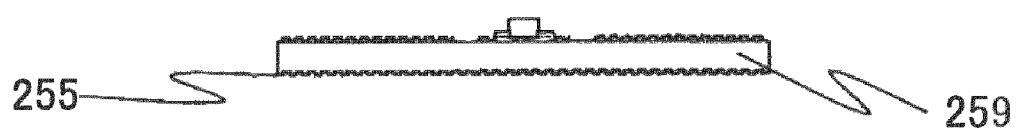

FIG. 29A and FIG. 29B show a sixth modification in which resonating cavities for oscillation are formed with rectangular conductor patches 4d and a ground conductor face 256d that is placed to keep appropriate spaces 244 from the conductor patches 4d.

Figure 30A:
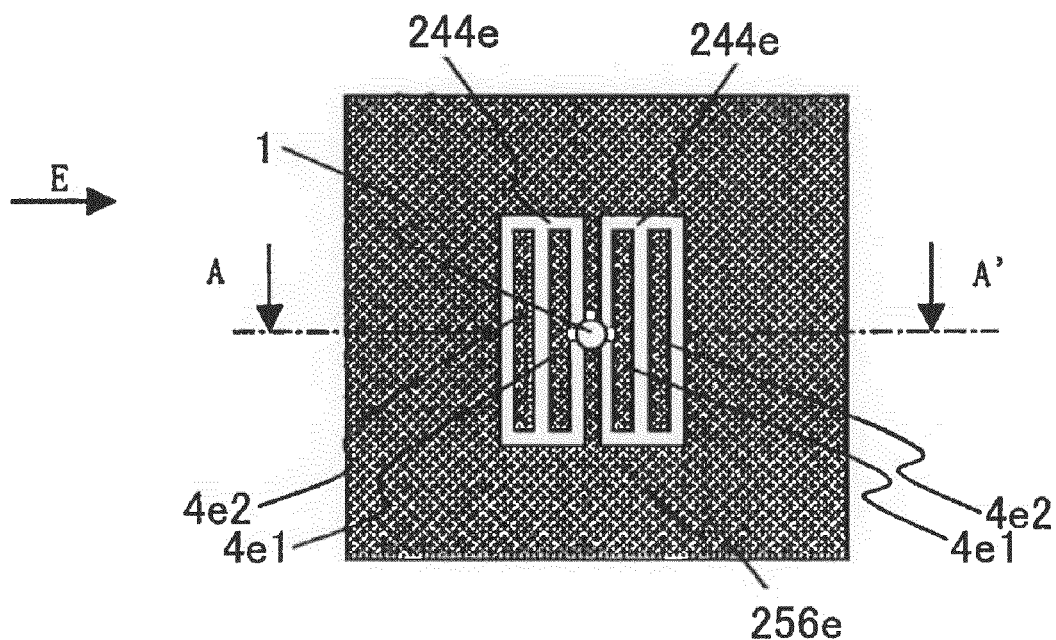
FIG. 30A and FIG. 30B are schematic views of a seventh example structure including resonating cavities that can be used in the present invention.
Figure 30B:
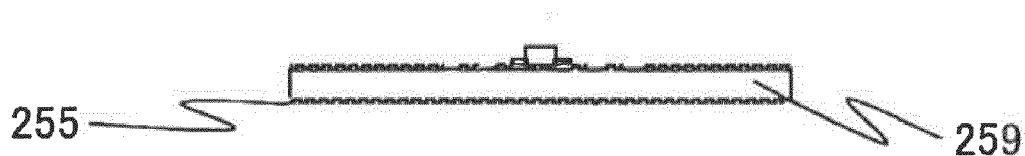

FIG. 30A and FIG. 30B show a seventh modification in which resonating cavities for oscillation are formed by providing rectangular conductor patches 4e2 near rectangular conductor patches 4e1 connected to the high-frequency transistor 1. The conductor patches 4e2 are not connected to the high-frequency transistor 1. The conductor patches 4e1, the conductor patches 4e2, and a ground conductor face 256e are separated from one another by spaces 244e.

Figure 31A:
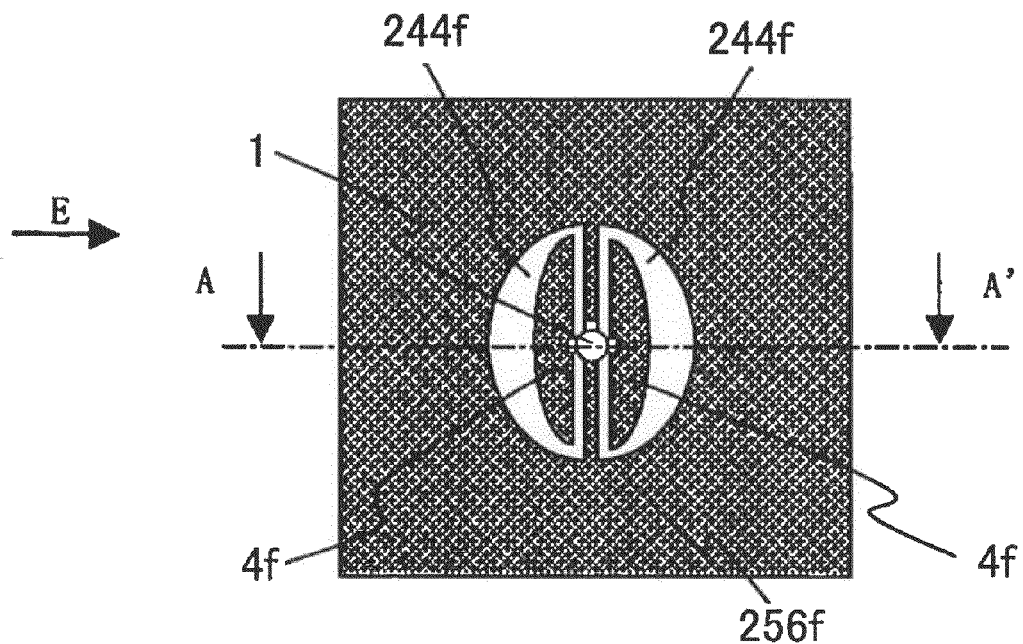
FIG. 31A and FIG. 31B are schematic views of an eighth example structure including resonating cavities that can be used in the present invention.
Figure 31B:
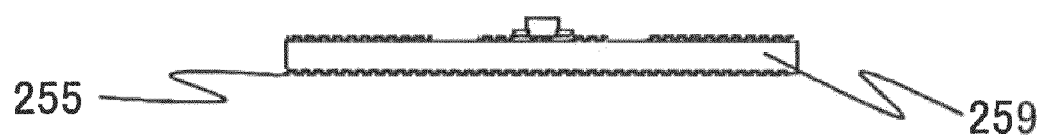

FIG. 31A and FIG. 31B show an eighth modification in which resonating cavities for oscillation are formed with semielliptical conductor patches 4f and a ground conductor face 256f that is placed to keep appropriate spaces 244f from the conductor patches 4f. The width of each of the spaces 244f is varied with locations, so as to satisfy an oscillation condition.

The shapes of conductor patches and spaces are not limited to those in the above described example structures shown in FIG. 28A through FIG. 31B, and any structures that satisfy an oscillation condition can be used in the present invention. The conductor patches, the spaces, the GND conductor face, and the dielectric substrate form part of the feedback circuit for oscillating operations. However, if the feedback can be properly obtained, there is no need to prepare the dielectric substrate 259 and the GND conductor face 255. Where the GND conductor face 255 does not exist, the radiation is performed in the directions of both sides of the conductor patch plane.

Figure 32A:
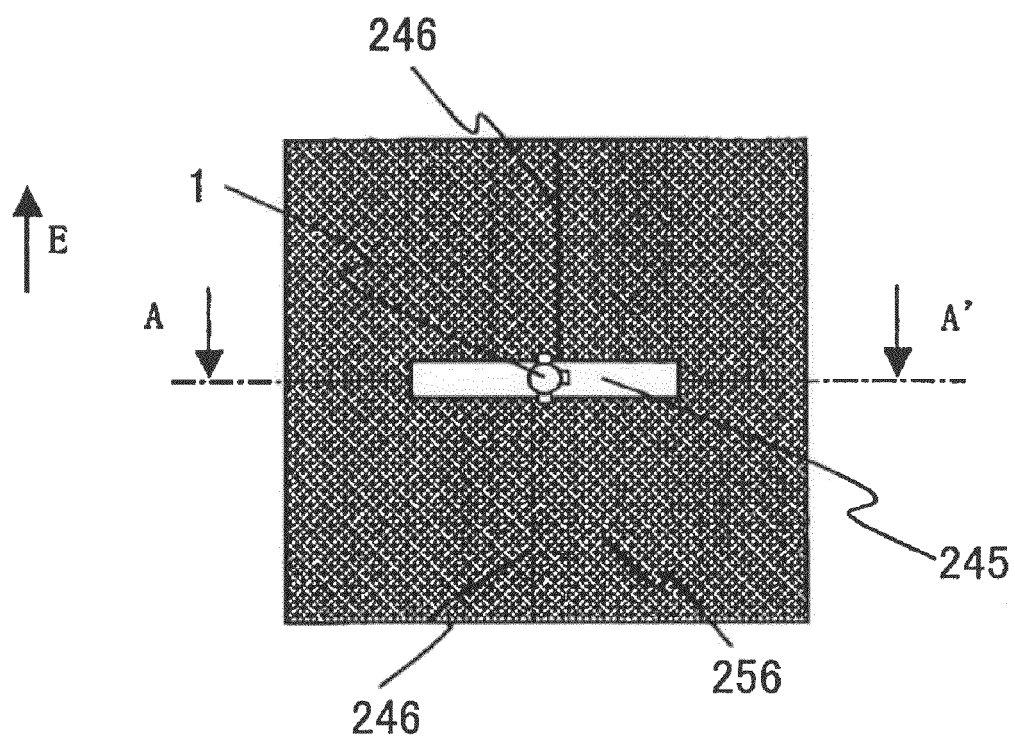
FIG. 32A and FIG. 32B are schematic views of a ninth example structure including resonating cavities that can be used in the present invention.
Figure 32B:

FIG. 32A and FIG. 32B show a ninth modification in which resonating cavities for oscillation are formed with a slot 245 and a ground conductor face 256. The slot 245 is in a complementary relationship with the rectangular conductor patches 4a shown in FIG. 24A, and satisfies an oscillation condition. As long as an oscillation condition is satisfied, the shape of the slot 245 is not particularly limited. In this example structure, to apply different direct-current bias voltages to the gate and drain of the high-frequency transistor 1, the gate and the drain are galvanically-isolated from each other, and a capacitance coupling unit 246 for high-frequency conduction is provided. This capacitance coupling unit 246 may be realized with the use of a capacitance formed with a space, a MIM (Metal-Insulator-Metal) capacitance, a capacitor component, or the like. The dielectric substrate 259 and the GND conductor face 255 are not necessarily provided. Where the GND conductor face 255 does not exist, the radiation is performed in the directions of both sides of the conductor patch plane.

The above conductor patches are provided in pairs on the high-frequency transistor 1 in a symmetrical manner. However, it is possible to use conductor patches having asymmetrical shapes.

Figure 33A:
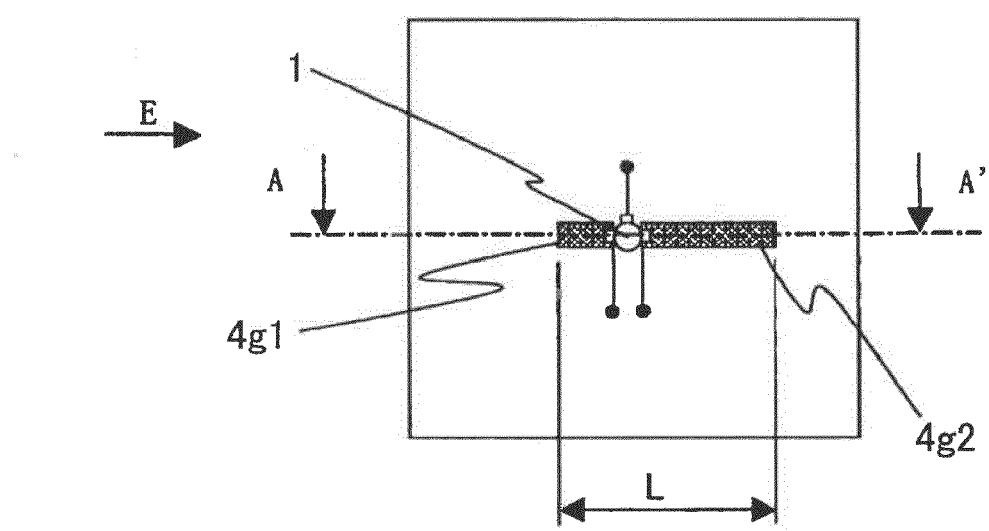
FIG. 33A and FIG. 33B are schematic views of a tenth example structure including resonating cavities that can be used in the present invention.
Figure 33B:
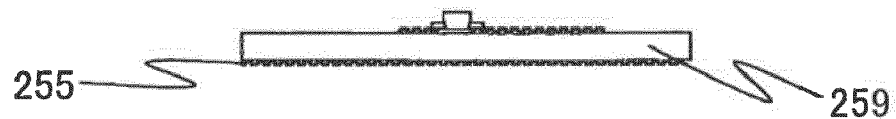

FIG. 33A and FIG. 33B show a tenth modification in which a rectangular first conductor patch 4g1 and a rectangular second conductor patch 4g2 are formed in an asymmetric manner. Even if the first conductor patch 4g1 and the second conductor patch 4g2 are asymmetric with respect to each other as in this modification, the resonance frequency is basically determined by the size of the entire conductor patch unit (represented by L in FIG. 33A). Therefore, this structure can function as a radiation type oscillator having an antenna and an oscillating circuit in an integrated manner, as long as an oscillation condition is satisfied.

Figure 34A:
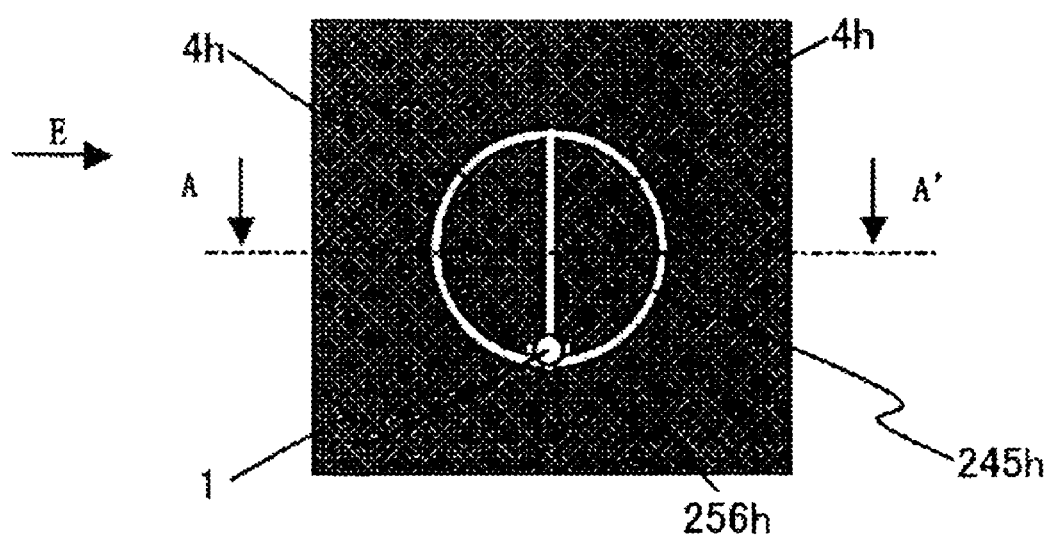
FIG. 34A and FIG. 34B are schematic views of an eleventh example structure including resonating cavities that can be used in the present invention.
Figure 34B:

FIG. 34A and FIG. 34B show an eleventh modification in which resonating cavities for oscillation are formed by providing a ring-slot antenna on the radiation face side. This ring-slot antenna is formed with half-round conductor patches 4h and a ground conductor face 256h placed to keep a appropriate space 245h from the conductor patches 4h.

Figure 35A:
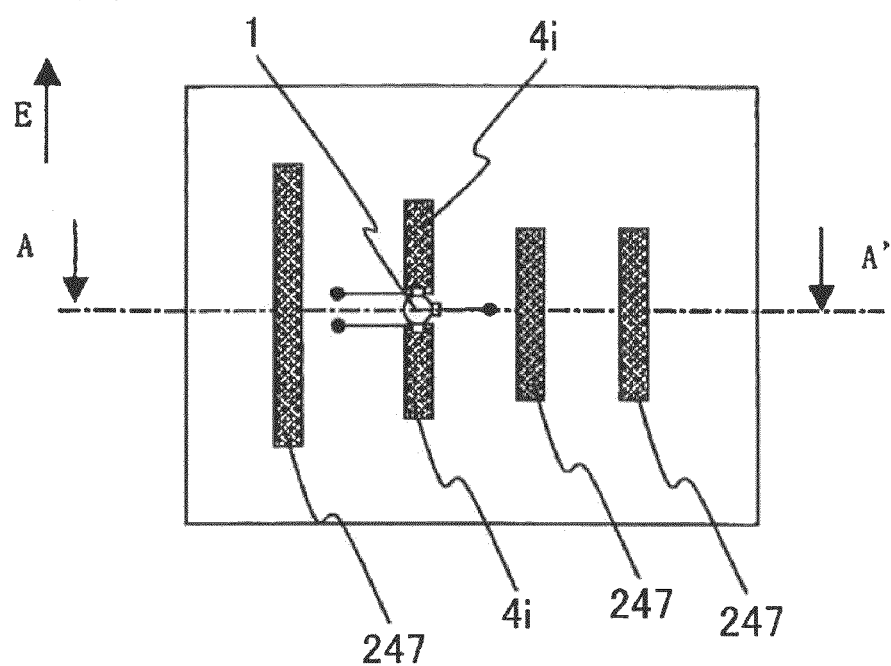
FIG. 35A and FIG. 35B are schematic views of a twelfth example structure including resonating cavities that can be used in the present invention.
Figure 35B:
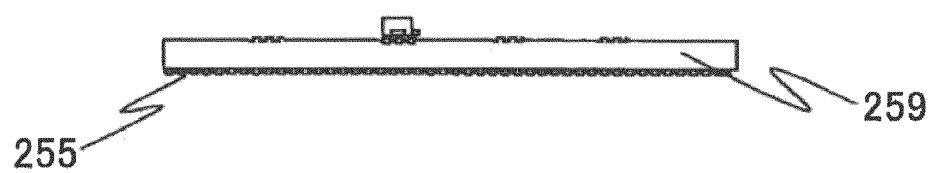

FIG. 35A and FIG. 35B show a twelfth modification in which conductor patches 247 not connected to the high-frequency transistor 1 are appropriately placed around rectangular conductor patches 4, so that the radiation directivity can be controlled. The positional and size relationships between the conductor patches 4i and the conductor patches 247 are suitably set, so that this structure can function like a Yagi antenna.

(Twenty-First Embodiment)

Figure 36A:
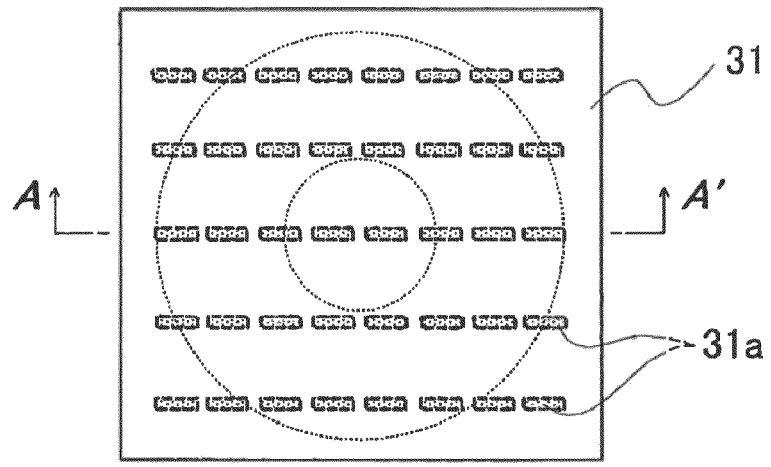
FIG. 36A, FIG. 36B, and FIG. 36C are schematic views of a microwave/millimeter wave sensor apparatus according to a twenty-first embodiment.
Figure 36B:
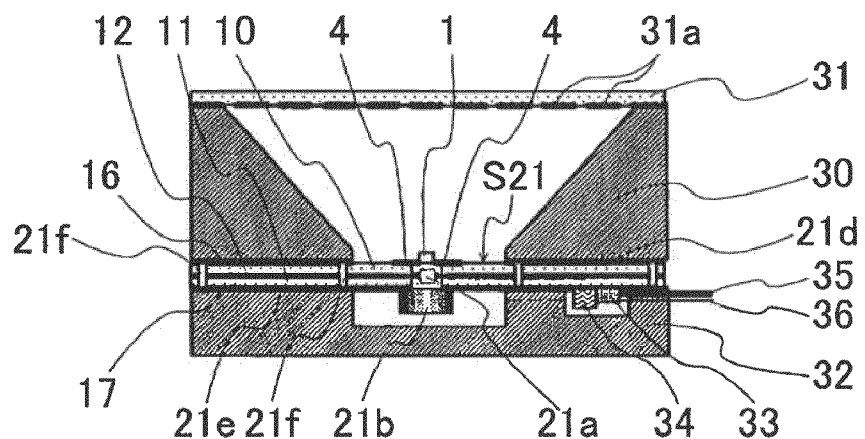
Figure 36C:
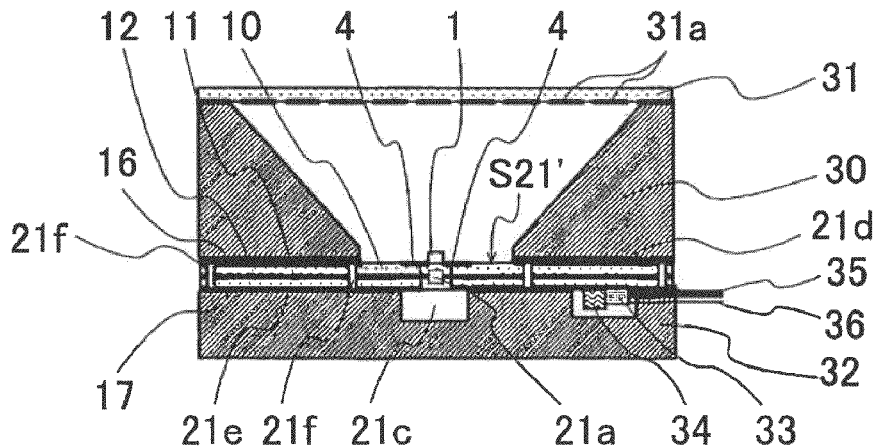
Figure 37:
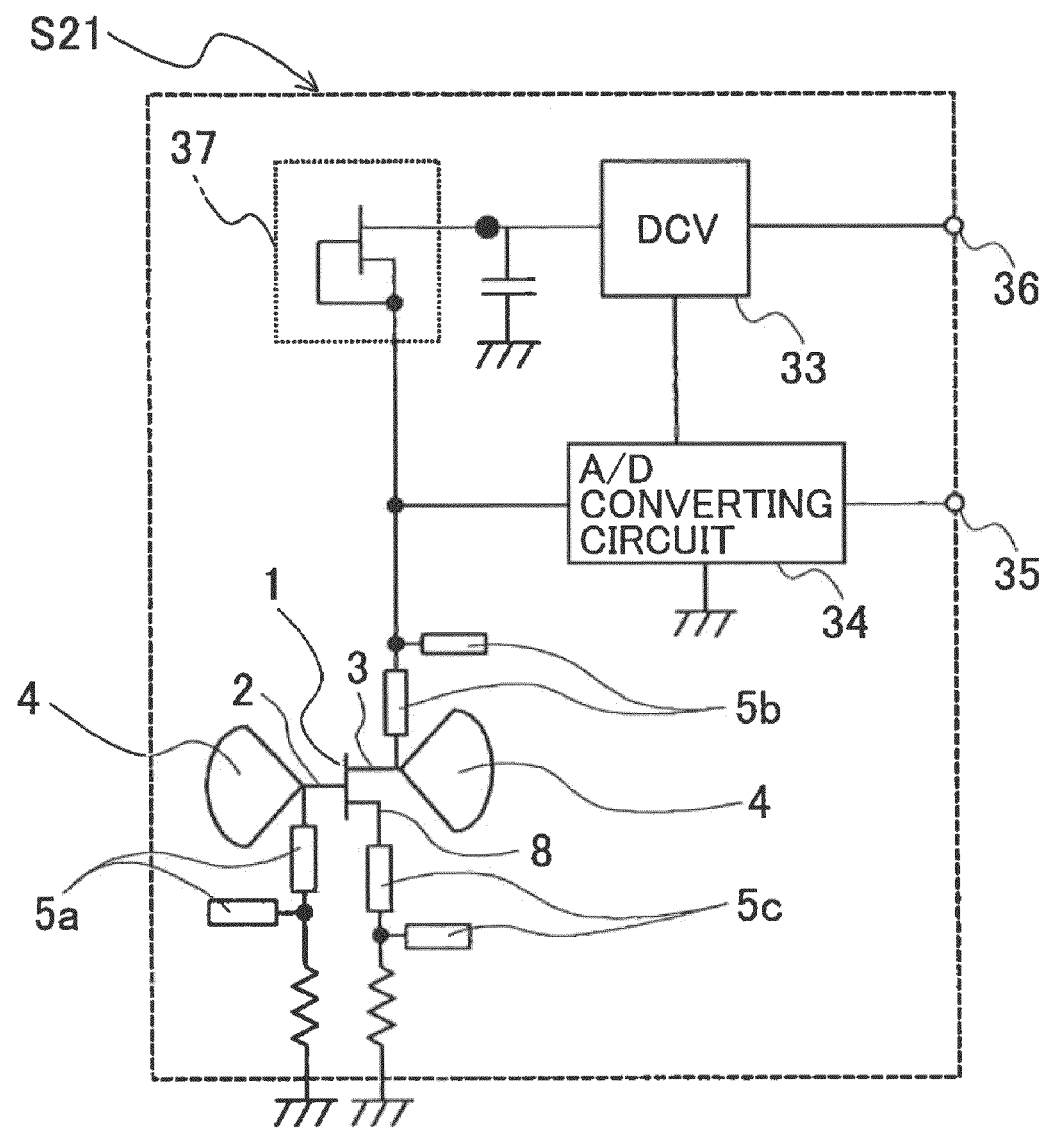
FIG. 37 is a circuit structure diagram of the microwave/millimeter wave sensor apparatus according to the twenty-first embodiment.

Referring now to FIG. 36A through FIG. 37, a twenty-first embodiment of a microwave/millimeter wave sensor apparatus according to the present invention is described. FIG. 36B and FIG. 36C are schematic cross-sectional view of the microwave/millimeter wave sensor apparatus of the twenty-first embodiment, taken along the line A-A' of FIG. 36A. FIG. 37 is a circuit diagram schematically showing the structure of the microwave/millimeter wave sensor apparatus according to the twenty-first embodiment.

In the microwave/millimeter wave sensor apparatus according to this embodiment, a radiation type oscillator substrate S21 is used. This radiation type oscillator substrate S21 also functions as a "radiation type oscillator that integrates a three-electrode high-frequency amplifying device so as to generate negative resistance at resonating cavities, and causes the amplifying device to share the antenna function to emit electromagnetic waves to space". Like the radiation type oscillator substrate S1 according to the first embodiment, this radiation type oscillator substrate S21 is formed with a three-layer substrate that has an inner layer GND 12 as a ground conductor layer interposed between a front surface side dielectric substrate 10 and a rear surface side dielectric substrate 11. A slot 21a is formed in the inner layer GND 12 near the high-frequency transistor 1 and the conductor patches 4 provided on the radiation face of the radiation type oscillator substrate S21. With this structure, electromagnetic coupling is caused between a dielectric resonator 21b and each of the conductor patches 4 (see FIG. 36B).

By causing electromagnetic coupling between the dielectric resonator 21b and each of the conductor patches 4, the oscillation frequency is stabilized. As shown in FIG. 36C, the oscillation frequency may also be stabilized by coupling a cavity resonator 21c to the slot. The oscillation frequency can also be stabilized by supplying an external stable RF signal as an external injection lock signal to the slot 21a through a microstrip line or the like, and causing the oscillation of the radiation type oscillator to be locked to the external injection lock signal. Also, by providing various resonators on the side of the front surface layer 16 on which the conductor patches 4 are formed, electromagnetic coupling can be directly performed without the slot 21*a*.

On the radiation face side of the radiation type oscillator substrate S21, a horn-like radiation structure unit 30 is provided. The radiation structure unit 30 is formed with a metal conductor or a plastic resin material or the like that has appropriate portions coated with a metal conductor. The opening on the radiation face side of the radiation structure unit 30 is blocked with a substrate 31 that has a frequency selective circuit pattern formed thereon. In the microwave/millimeter wave sensor apparatus according to this embodiment, a horn-like structure is formed by placing the horn-like radiation structure unit 30 on the radiation face side of the radiation type oscillator substrate S21, so that a predetermined opening is secured to sharpen the radiation beam. In this manner, the detection sensitivity can be made higher. Further, the substrate 31 having the frequency selective circuit pattern formed thereon functions as a frequency selective filtering unit that selectively filters radio waves of predetermined frequency, so as to prevent emission of unnecessary signals.

To attenuate unnecessary harmonic outputs at frequency twice as high as the oscillation frequency, for example, the substrate 31 to function as the frequency selective filtering unit can be realized by patterning rectangular strip conductors 31*a* at appropriate intervals. The strip conductors 31*a* each have a long side that is equal to the electric length of ½ of the harmonic wavelength. Accordingly, the strip conductors 31*a* resonate and trap the harmonic, so as to prevent harmonic radiation. In this case, the frequency selective filtering unit functions as a band rejection filter.

Here, the frequency selective circuit pattern is a so-called FSS (Frequency Selective Surface). Other than the band rejection filter formed with the rectangular strip conductors 31*a* shown in FIG. 36A, a bandpass filter, a high-pass filter, a low-pass filter, or the like can be realized by appropriately setting the form of the conductor pattern. In a case where several kinds of unnecessary signals are to be suppressed, for example, a filter that is compatible with the corresponding frequency may be used.

Meanwhile, a shielding cover 32 that is formed with a metal conductor or a plastic resin material or the like coated with a metal conductor is attached to the side of the rear surface layer 17 of the radiation type oscillator substrate S21 (or the side of the location of the dielectric resonator 21*b*). A front face GND conductor pattern 21*d* provided on the side of the front surface layer 16 of the radiation type oscillator substrate S21, the inner layer GND conductor pattern 12, and a rear surface GND conductor pattern 21*e* provided on the side of the rear surface layer 17 are electrically connected to one another via GND through holes 21*f*. To prevent transmission of oscillation RF signals in the front surface side dielectric substrate 10 or the rear surface side dielectric substrate 11, and emission of the oscillation RF signals from the side faces of the end portions of the substrate, it is preferable that the respective GND conductor patterns 12, 21*d*, and 21*e* are electrically connected around the conductor patches 4 and along the outer periphery of the substrate by forming the GND through holes 21*f* at intervals of approximately ⅒ of the oscillation wavelength.

Further, a power-supply stabilizing circuit 33 and an A/D converting circuit 34 for turning IF signal voltage into digital data are provided on the rear surface side dielectric substrate 11 of the radiation type oscillator substrate S21, so as to prevent degradation of sensing signals due to exogenous noise. An IF signal voltage value that is converted from an analog value to a digital value by the A/D converting circuit 34 is output from a data output terminal 35. The power-supply stabilizing circuit 33 stabilizes the direct current supplied from a direct-current drain voltage supply terminal 35.

Referring now to FIG. 37, the circuit structure forming the radiation type oscillator substrate S21 in the microwave/millimeter wave sensor apparatus according to this embodiment is described. The conductor patches 4 respectively are connected to the gate 2 and the drain 3 of the microwave transistor 1, and RF choke circuits 5*a* through 5*c* are connected to the gate 2, the drain 3, and the source 8, respectively. The power-supply stabilizing circuit 33 is connected to the drain 3 via a constant current circuit 37 that utilizes the gate ground drain current (Idss) of a junction type field effect transistor (JFET). The gate 2 and the source 8 are connected to resistors for self-biasing, and are grounded.

An IF signal voltage is obtained from between the RF choke circuit 5*b* on the side of the drain 3 and the constant current circuit 37, and the A/D converting circuit 34 performs signal processing to convert the analog value to a digital value. The converted signal is then output from the data output terminal 35. In the microwave/millimeter wave sensor apparatus according to this embodiment, the high impedance (several kilo ohms or higher) of the constant current circuit 37 is set as the drain load in the IF band of the transistor. Accordingly, while sufficient IF-band amplification gain is maintained, the power consumption at the drain load is restricted to a smaller amount than in a case where high resistance is only used as the drain load.

To activate the microwave/millimeter wave sensor apparatus of this embodiment, a direct current source is connected to the direct-current drain voltage supply terminal 36, so as to oscillate the radiation type oscillator. The oscillated radiation signal is emitted as a transmit RF signal to the measured object, and the waves reflected from the measured object are input as a receive RF signal to between the gate 2 and the drain 3. An IF signal voltage generated from between the gate 2 and the drain 3 or from between the gate 2 and the source 8 through a homodyne mixing operation changes the drain current in the microwave transistor 1. As a result, an amplified IF signal voltage is generated at the constant current circuit 37 on the side of the RF choke circuit 5*b*. This IF signal voltage is converted into a digital signal by the A/D converting circuit 34, and is output from the data output terminal 35. The output digital signal is analyzed by a signal analyzing unit (not shown).

In the microwave/millimeter wave sensor apparatus according to this embodiment, the structure of the radiation type oscillator substrate S21 is not particularly limited, and the radiation structure unit 30, the shielding cover 32, and the frequency selective circuit pattern may be used together with any of the radiation type oscillator substrates S1 through S20 of the first through the twentieth embodiments. Also, the radiation structure unit 30 and the radiation type oscillator substrate S21 may be integrally formed with a three-dimensional integrated circuit made of LTCC (Low Temperature Co-fired Ceramics) or the like.

(Twenty-Second Embodiment)

Figure 38A:
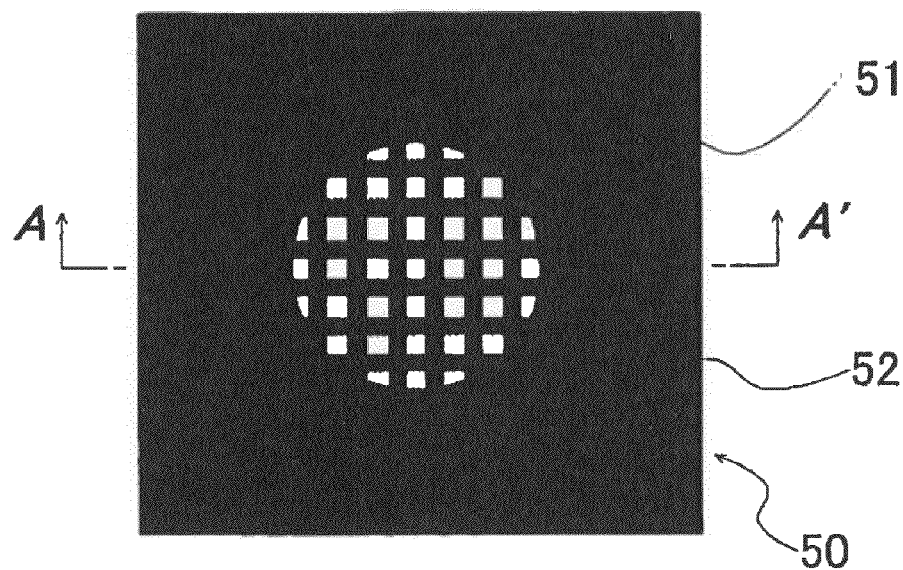
FIG. 38A and FIG. 38B are schematic views of a microwave/millimeter wave sensor apparatus according to a twenty-second embodiment.
Figure 38B:
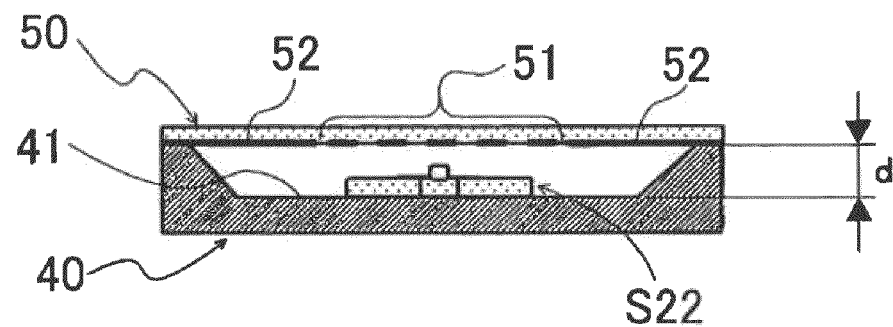

Referring now to FIG. 38A and FIG. 38B, a microwave/millimeter wave sensor apparatus according to a twenty-second embodiment of the present invention is described. In the schematic structure of the microwave/millimeter wave sensor apparatus according to this embodiment, a radiation type oscillator substrate S22 that has the same structure as one of the radiation type oscillator substrates S1 through S21 used in the microwave/millimeter wave sensor apparatuses of the first through the twenty-first embodiments is housed in a beam radiation type resonator. Direct current is supplied from a direct current source (not shown) to the radiation type oscillator substrate S22 in the housing, and an IF signal (an analog signal or a digital signal converted through an A/D conversion) is obtained from the radiation type oscillator substrate S22, and is subjected to appropriate processing.

The radiation type oscillator substrate S22 is mounted on a ground conductor face 41 that is the flat bottom of a mortar-like concave portion extending from the outer periphery of the housing 40 made of a metal conductor or a plastic resin material having appropriate portions coated with a metal conductor. A partially transmissive reflecting substrate 50 as the partially transmissive reflecting unit is placed on the radiation face side at the electric length of a distance d (approximately N/2 of the oscillation wavelength λ, N being 1, 2, 3, . . . ) apart from the ground conductor face 41. The partially transmissive reflecting substrate 50 is designed to have a partially transmissive reflecting face as one of the two faces thereof. The partially transmissive reflecting face is formed with a lattice-like conductor pattern formation region 51 having a lattice-like conductor pattern formed therein (the inner face facing the ground conductor face 41, for example), and a conductor region 52 having no conductive patterns. The partially transmissive reflecting face (the face formed with the lattice-like conductor pattern formation region 51 and the conductor region 52) and the ground conductor face 41 form the beam radiation type resonator.

In this structure, the radiation type oscillator of the radiation type oscillator substrate S22 is housed in the beam radiation type resonator, and oscillation RF signals of the radiation type oscillator are stabilized by the beam radiation type resonator. Since any signals that are other than the resonance frequency are not emitted, unnecessary radiation can be prevented, and unnecessary external radio waves that are other than the resonance frequency are not input. Accordingly, false operations can be effectively prevented. Also, radiation directivity with low sidelobe and high gain can be achieved by appropriately setting the lattice spacing and lattice width of the lattice-like conductor pattern formation region 51, the size and shape of the lattice-like conductor pattern formation region 51, and the like.

The ground conductor face 41 of the housing 40 in this embodiment serves as the reflecting face of the beam radiation type resonator and the ground conductor of the radiation type oscillator substrate S22. However, the ground conductor face 41 may not necessarily serve as those two components, if the radiation type oscillator is housed in an appropriate position inside the beam radiation type resonator, so as to stabilize the oscillation frequency at the resonance frequency of the beam radiation type resonator. The beam radiation type resonator in this embodiment has the partially transmissive reflecting face formed by patterning a metal film on one surface of the partially transmissive reflecting substrate 50. However, there is no particular need to prepare a substrate, as long as the partially transmissive reflecting face can be maintained in a position at the distance d from the ground conductor face 41.

In the microwave/millimeter wave sensor apparatus according to this embodiment, the structure of the radiation type oscillator substrate S22 is not particularly limited, and a partially transmissive reflecting face on which the radiation structure unit 30, the shielding cover 32, and the frequency selective circuit pattern are formed may be used together with any of the radiation type oscillator substrates S1 through S21 of the first through the twenty-first embodiments. Also, the beam radiation type resonator and the radiation type oscillator substrate S22 may be integrally formed with a three-dimensional integrated circuit made of LTCC (Low Temperature Co-fired Ceramics) or the like.

(Twenty-Third Embodiment)

Figure 39A:
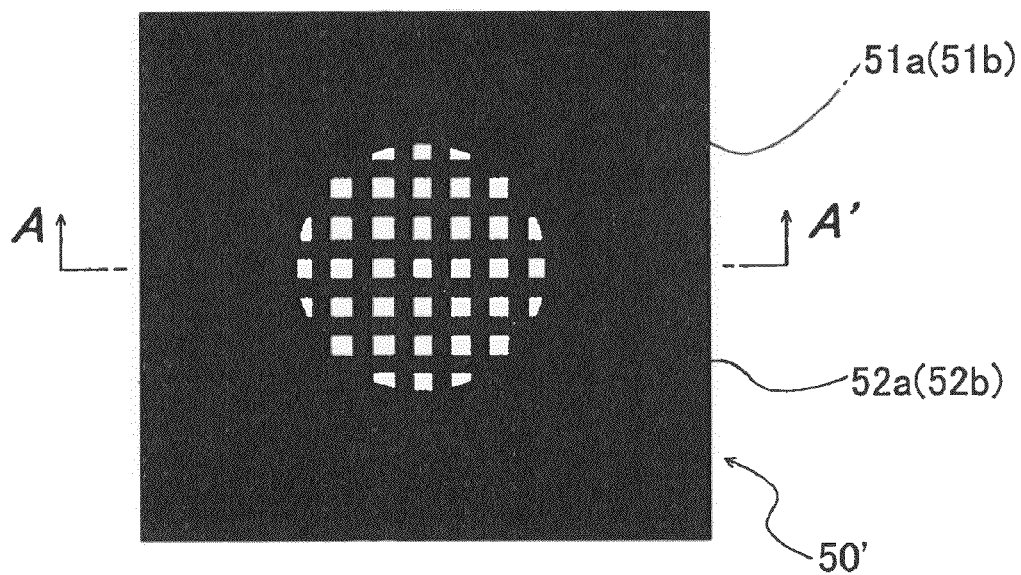
FIG. 39A and FIG. 39B are schematic views of a microwave/millimeter wave sensor apparatus according to a twenty-third embodiment.
Figure 39B:
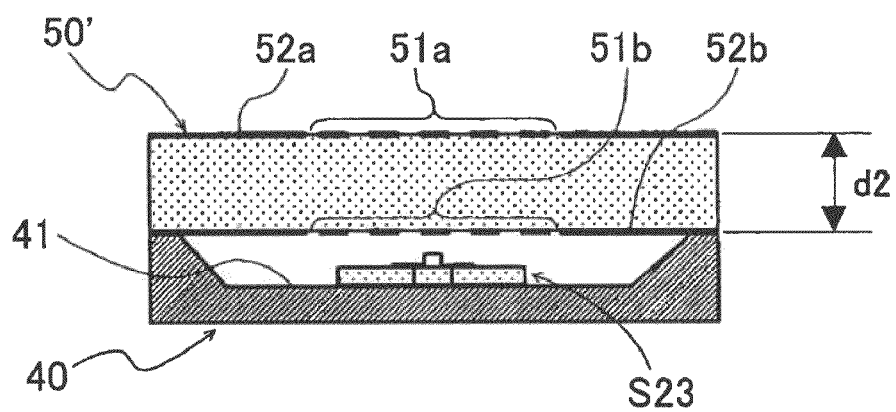

Referring now to FIG. 39A and FIG. 39B, a microwave/millimeter wave sensor apparatus according to a twenty-third embodiment of the present invention is described. In the schematic structure of the microwave/millimeter wave sensor apparatus according to this embodiment, a partially transmissive reflecting substrate 50' is placed on the radiation face side of a radiation type oscillator substrate S23 that has the same structure as one of the radiation type oscillator substrates S1 through S21 used in the microwave/millimeter wave sensor apparatuses of the first through the twenty-first embodiments. In the partially transmissive reflecting substrate 50', a first partially transmissive reflecting face that is formed with a lattice-like conductor pattern formation region 51a and a conductor region 52a faces a second partially transmissive reflecting face that is formed with a lattice-like conductor pattern formation region 51b and a conductor region 52b, with the electric length of a distance d2 (approximately N/2 of the oscillation wavelength λ, N being 1, 2, 3, . . . ) being kept in between. This partially transmissive reflecting substrate 50' forms a beam radiation type resonator. Where R1 represents the reflectivity of the first partially transmissive reflecting face, and R2 represents the reflectivity of the second partially transmissive reflecting face, a requirement, R1>R2, is set, so that electromagnetic coupling is caused between the beam radiation type resonator and the radiation type oscillator from the side of the partially transmissive reflecting face with the lower reflectivity. Direct current is supplied from a direct current source (not shown) to the radiation type oscillator substrate S23 in the housing, and an IF signal (an analog signal or a digital signal formed through an A/D conversion) is obtained from the radiation type oscillator substrate S23. Appropriate signal processing is then performed.

Similar to the above described twenty-second embodiment, the radiation type oscillator substrate S23 of this embodiment is placed on the ground conductor face 41 of the housing 40, and the partially transmissive reflecting substrate 50' is placed on the upper edge of the outer periphery of the housing 40. With this arrangement, an appropriate space is maintained between the radiation type oscillator substrate S23 and the beam radiation type resonator. However, the housing 40 is not relevant to the structure of the resonator. Therefore, any modification may be made to the housing 40, as long as the radiation type oscillator substrate S23 and the transmissive reflecting substrate 50' can be properly supported.

In the partially transmissive reflecting substrate 50' embodying a beam radiation type resonator in this embodiment, the first partially transmissive reflecting face is formed by forming a metal film pattern on one of the surfaces of a dielectric substrate having the thickness of d2, and the second partially transmissive reflecting face is formed by forming a metal film pattern on the other one of the surfaces. However, there is no need to use a dielectric substrate, as long as the distance d2 is maintained between the first partially transmissive reflecting face and the second partially transmissive reflecting face.

Since the microwave/millimeter wave sensor apparatus according to this embodiment includes a beam radiation type resonator embodied by the partially transmissive reflecting substrate 50', electromagnetic coupling is caused between the oscillation RF signal of the radiation type oscillator substrate S23 and the beam radiation type resonator, and frequency stabilization is achieved. Also, since any signals other than the resonance frequency are not emitted, unnecessary radiation can be prevented, and unnecessary external radio waves other than the resonance frequency are not input. Accordingly, false operations can be effectively prevented. Further, radiation directivity with low sidelobe and high gain can be achieved by appropriately setting the lattice spacing and lattice width of the lattice-like conductor pattern formation regions 51a and 51b, the sizes and shapes of the lattice-like conductor pattern formation regions 51a and 51b, and the like.

Similar to the partially transmissive reflecting substrate 50' of the microwave/millimeter wave sensor apparatus according to this embodiment, variations in the oscillation frequency characteristics of the radiation type oscillator substrate S23 to be combined with a beam radiation type resonator, and variations in the oscillation frequency characteristics due to dimension error in assembling can be absorbed by fabricating the beam radiation type resonator as a component having a metal film pattern of high dimensional precision formed through a thin-film technique on a dielectric substrate with low loss and a low thermal expansion rate. With mass production of microwave/millimeter wave sensor apparatuses of the present invention being taken into consideration, this embodiment has the advantage of being stably capable of providing high-quality sensor apparatuses with a high yield.

In the microwave/millimeter wave sensor apparatus according to this embodiment, the structure of the radiation type oscillator substrate S23 is not particularly limited, and a beam radiation type resonator may be provided on the radiation face side of any of the radiation type oscillator substrates S1 through S21 of the first through the twenty-first embodiments. Also, the beam radiation type resonator having the same structure as the partially transmissive reflecting substrate 50' and the radiation type oscillator substrate S23 may be integrally formed with a three-dimensional integrated circuit made of LTCC (Low Temperature Co-fired Ceramics) or the like.

(Twenty-Fourth Embodiment)

Figure 40A:
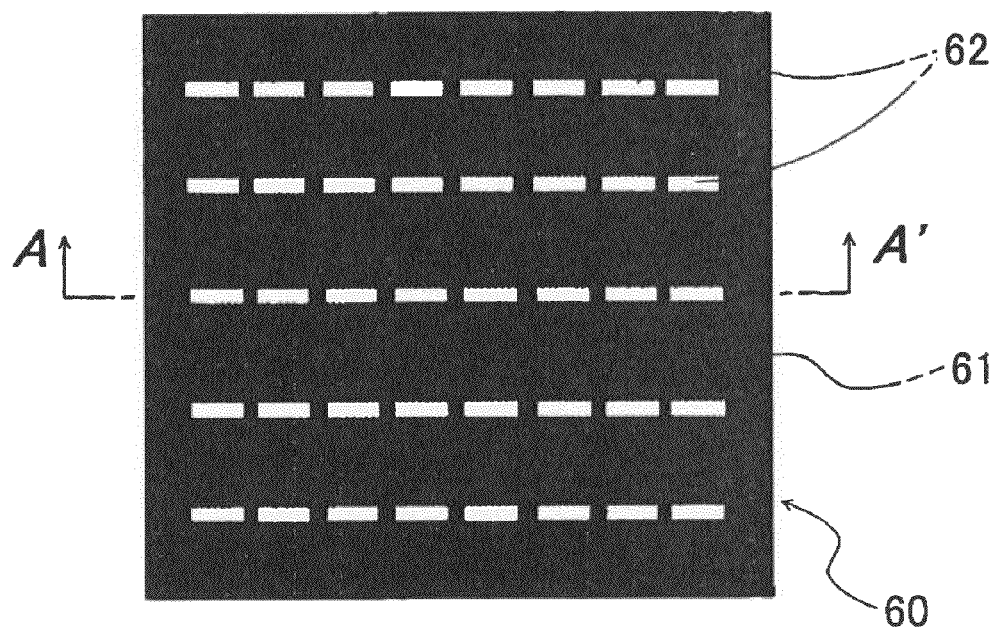
FIG. 40A and FIG. 40B are schematic views of a microwave/millimeter wave sensor apparatus according to a twenty-fourth embodiment.
Figure 40B:
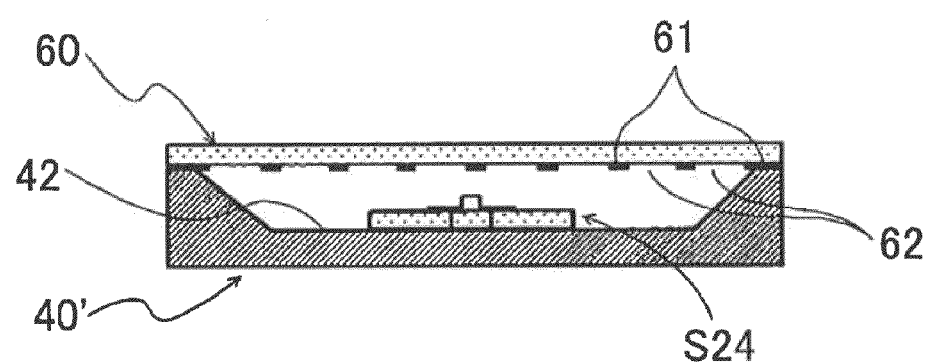

Referring now to FIG. 40A and FIG. 40B, a microwave/millimeter wave sensor apparatus according to a twenty-fourth embodiment of the present invention is described. In the schematic structure of the microwave/millimeter wave sensor apparatus according to this embodiment, a radiation type oscillator substrate S24 that has the same structure as one of the radiation type oscillator substrates S1 through S21 used in the microwave/millimeter wave sensor apparatuses of the first through the twenty-first embodiments is combined with a frequency selecting unit. Direct current is supplied from a direct current source (not shown) to the radiation type oscillator substrate S24 mounted onto a substrate mounting face 42 in a housing 40', and an IF signal (an analog signal or a digital signal formed through an A/D conversion) is obtained from the radiation type oscillator substrate S24. Appropriate signal processing is then performed.

A harmonic selecting substrate 60 functioning as the harmonic selecting unit is placed on the radiation face side of the radiation type oscillator substrate S24, and a desired harmonic of an oscillation RF signal is selected by the harmonic selecting substrate 60. The selected harmonic is emitted as a transmission harmonic signal to the measured object, and a reflected harmonic signal reflected from the measured object is received on the radiation face. Through homodyne harmonic mixing performed by the radiation type oscillator, an IF signal is obtained, and the measured object is sensed. In this embodiment, the harmonic selecting substrate 60 as the harmonic selecting unit and the radiation type oscillator substrate S24 are also held in the housing 40'. However, since the housing 40' is not relevant to the function of the harmonic selecting unit, any modifications may be made to the housing 40', as long as the radiation type oscillator substrate S24 and the harmonic selecting substrate 60 can be held in a suitable manner.

The harmonic selecting substrate 60 has the function of a filter that blocks the fundamental harmonic but allows desired harmonic to pass through. In the harmonic selecting substrate 60, rectangular slot portions 62 are formed as a frequency selective circuit pattern in a conductor region 61 on one of the surface (the inner face facing the substrate mounting face 42, for example) of a dielectric substrate. To emit harmonic twice as high as the oscillation frequency, for example, the slot portions 62 each having a long side that is equal to the electric length of ½ of the harmonic wavelength are arranged at appropriate intervals. Accordingly, the slot portions 62 resonate the harmonic, and allow the harmonic to pass through. In this case, the harmonic selecting unit functions as a bandpass filter.

The frequency selective circuit pattern is a so-called FSS (Frequency Selective Surface). Other than the bandpass filter formed with the rectangular slot portions 61, a band rejection filter or a high-pass filter can be formed by appropriately setting the shape of a conductor pattern. For example, in a case where the twice higher harmonic is to be emitted, and the radiation type oscillator substrate S24 has such radiation output characteristics that the power of the fundamental harmonic and the twice higher harmonic is strong, but the power of the three-times or greater harmonic is very weak, a band rejection filter or a high-pass filter that blocks only the fundamental harmonic should be used, and there is no need to always use a bandpass filter like the harmonic selecting substrate 60 used in this embodiment.

If the substrate mounting face 42 of the housing 40' is made of metal, the frequency selective circuit pattern face of the harmonic selecting substrate 60 and the substrate mounting face 42 function as reflecting faces. The same operation as that in the twenty-third embodiment is performed, if the distance between the frequency selective circuit pattern face and the substrate mounting face 42 is made equal to the electric length of approximately N/2 of the oscillation wavelength λ (N being 1, 2, 3, . . . ). In this embodiment, however, the frequency selective circuit pattern face is not necessarily used as the reflecting face of the beam radiation type resonator, and may be simply used as a filter that allows only the desired harmonic to pass. Accordingly, the substrate mounting face 42 of the housing 40' is not necessarily made of metal, and the housing 40' may be merely a holding mechanism.

In the microwave/millimeter wave sensor apparatus of this embodiment, the desired harmonic of an oscillation RF signal is emitted as a transmission harmonic signal to the measured object, and a reflected harmonic signal reflected from the measured object is received on the radiation face. Through homodyne harmonic mixing performed by the radiation type oscillator, an IF signal is obtained, and the measured object is sensed. Accordingly, even if a radiation type oscillator substrate is formed with a low-cost, low-performance transistor having a small fmax, a sensor apparatus of relatively high frequency can be advantageously realized. Although the radiation power becomes weaker than in a case where the fundamental harmonic is used, the sensor apparatus can be used as a close-range sensor apparatus.

In the microwave/millimeter wave sensor apparatus according to this embodiment, the structure of the radiation type oscillator substrate S24 is not particularly limited, and the harmonic selecting substrate 60 having a harmonic selective circuit pattern face may be provided on the radiation face side of any of the radiation type oscillator substrates S1 through S21 of the first through the twenty-first embodiments. Also, the harmonic selecting substrate 60 and the radiation type oscillator substrate S24 may be integrally formed with a three-dimensional integrated circuit made of LTCC (Low Temperature Co-fired Ceramics) or the like.
(Twenty-Fifth Embodiment)

Figure 41A:
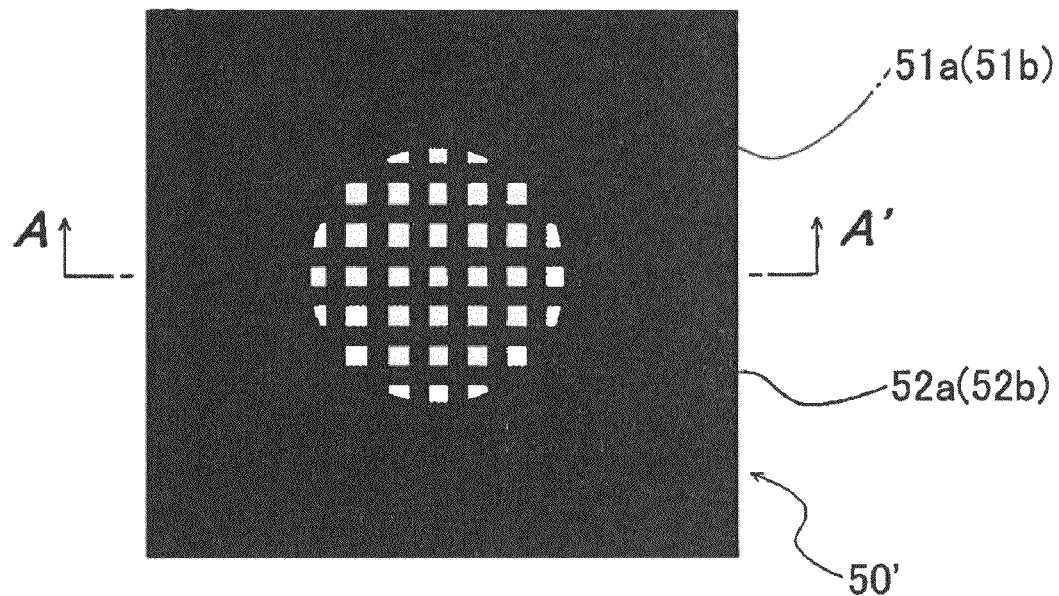
FIG. 41A and FIG. 41B are schematic views of a microwave/millimeter wave sensor apparatus according to a twenty-fifth embodiment.
Figure 41B:
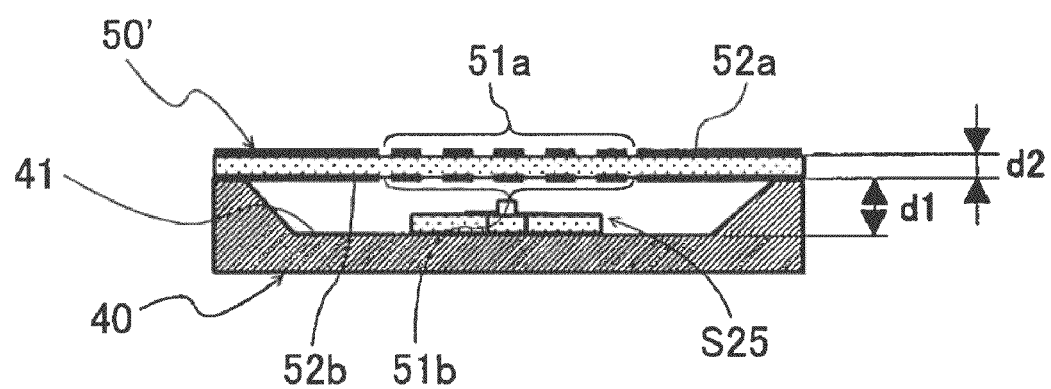

Referring now to FIG. 41A and FIG. 41B, a microwave/millimeter wave sensor apparatus according to a twenty-fifth embodiment of the present invention is described. In the schematic structure of the microwave/millimeter wave sensor apparatus according to this embodiment, a radiation type oscillator substrate S25 that has the same structure as one of the radiation type oscillator substrates S1 through S21 used in the microwave/millimeter wave sensor apparatuses of the first through the twenty-first embodiments is combined with a frequency selecting unit. Direct current is supplied from a direct current source (not shown) to the radiation type oscillator substrate S25 mounted onto a ground conductor face 41 in a housing 40, and an IF signal (an analog signal or a digital signal formed through an A/D conversion) is obtained from the radiation type oscillator substrate S25. Appropriate signal processing is then performed.

Similar to the microwave/millimeter wave sensor apparatus according to the twenty-fourth embodiment, the microwave/millimeter wave sensor apparatus of this embodiment emits the desired harmonic of an oscillation RF signal as a transmission harmonic signal to the measured object, and receives a reflected harmonic signal reflected onto its radiation face from the measured object. Through homodyne harmonic mixing performed by the radiation type oscillator, an IF signal is obtained, and the measured object is sensed. A beam radiation type resonator is used as the frequency selecting unit.

A partially transmissive reflecting substrate 50' is placed on the radiation face side of the radiation type oscillator substrate S25. In the partially transmissive reflecting substrate 50', a first partially transmissive reflecting face that is formed with a lattice-like conductor pattern formation region 51a and a conductor region 52a faces a second partially transmissive reflecting face that is formed with a lattice-like conductor pattern formation region 51b and a conductor region 52b, with the electric length of a distance d2 (approximately N/2 of the harmonic wavelength $\lambda'$ of the oscillation RF signal, N being 1, 2, 3, . . . ) being kept in between. This partially transmissive reflecting substrate 50' forms the beam radiation type resonator. The beam radiation type resonator formed in this way functions as a filter that allows signals in the neighborhood of its resonance frequency to pass. Accordingly, harmonic signals are allowed to pass in this embodiment.

Meanwhile, the radiation type oscillator substrate S25 is mounted on the ground conductor face 41 that is the flat bottom of a mortar-like concave portion extending from the outer periphery of the housing 40 made of a metal conductor or a plastic resin material having appropriate portions coated with a metal conductor. The partially transmissive reflecting substrate 50' is held on the radiation face side at the electric length of a distance d1 (approximately N/2 of the oscillation wavelength $\lambda$, N being 1, 2, 3, . . . ) from the ground conductor face 41. In the partially transmissive reflecting substrate 50' embodying a beam radiation type resonator, the first partially transmissive reflecting face is formed by forming a metal film pattern on one of the surfaces of a dielectric substrate having the thickness of d2, and the second partially transmissive reflecting face is formed by forming a metal film pattern on the other one of the surfaces. However, there is no need to use a dielectric substrate, as long as the distance d2 is maintained between the first partially transmissive reflecting face and the second partially transmissive reflecting face.

Since the ground conductor face 41 of the housing 40 is conductive in this embodiment, the second partially transmissive reflecting face of the partially transmissive reflecting substrate 50' and the ground conductor face 41 function as reflecting faces. By making the distance d1 between the two reflecting faces equal to the electric length of approximately N/2 of the oscillation wavelength $\lambda$ (N being 1, 2, 3, . . . ), a beam radiation type resonator with which oscillation RF signals resonate is formed. Further, the first partially transmissive reflecting face (the face formed with the lattice-like conductor pattern formation region 51a and the conductor region 52a) and the second partially transmissive reflecting face (the face formed with the lattice-like conductor pattern formation region 51b and the conductor region 52b) at the distance d2 from each other form a beam radiation type resonator with which harmonic signals resonate. In this case, the second partially transmissive reflecting face of the partially transmissive reflecting substrate 50' serves as both the partially transmissive reflecting face of the beam radiation type resonator with which oscillation RF signals resonate, and the partially transmissive reflecting face of the beam radiation type resonator with which harmonic signals resonate.

In the microwave/millimeter wave sensor apparatus having the above structure, the oscillation frequency of the radiation type oscillator substrate S25 is stabilized by the beam radiation type resonator formed with the second partially transmissive reflecting face of the partially transmissive reflecting substrate 50' and the ground conductor face 41 of the housing 40. Also, harmonic is selected and output by the beam radiation type resonator formed with the first partially transmissive reflecting face and the second partially transmissive reflecting face of the partially transmissive reflecting substrate 50'. Similar to the microwave/millimeter wave sensor apparatus according to the twenty-fourth embodiment, even if a radiation type oscillator substrate is formed with a low-cost, low-performance transistor having a small fmax, a sensor apparatus of relatively high frequency can be advantageously realized. In a case where the substrate mounting face of the housing that holds the radiation type oscillator substrate S25 is made nonconductive, a beam radiation type resonator is not formed, and there only exists the beam radiation type resonator serving as a filter formed with the first partially transmissive reflecting face and the second partially transmissive reflecting face of the partially transmissive reflecting substrate 50'.

In the microwave/millimeter wave sensor apparatus according to this embodiment, the structure of the radiation type oscillator substrate S25 is not particularly limited, and the beam radiation type resonator with which oscillation RF signals resonate, and the beam radiation type resonator with which harmonic resonates may be used together with any of the radiation type oscillator substrates S1 through S21 of the first through the twenty-first embodiments. Also, the housing 40, the partially transmissive reflecting substrate 50', and the radiation type oscillator substrate S25 may be integrally formed with a three-dimensional integrated circuit made of LTCC (Low Temperature Co-fired Ceramics) or the like.
(Twenty-Sixth Embodiment)

Figure 42:
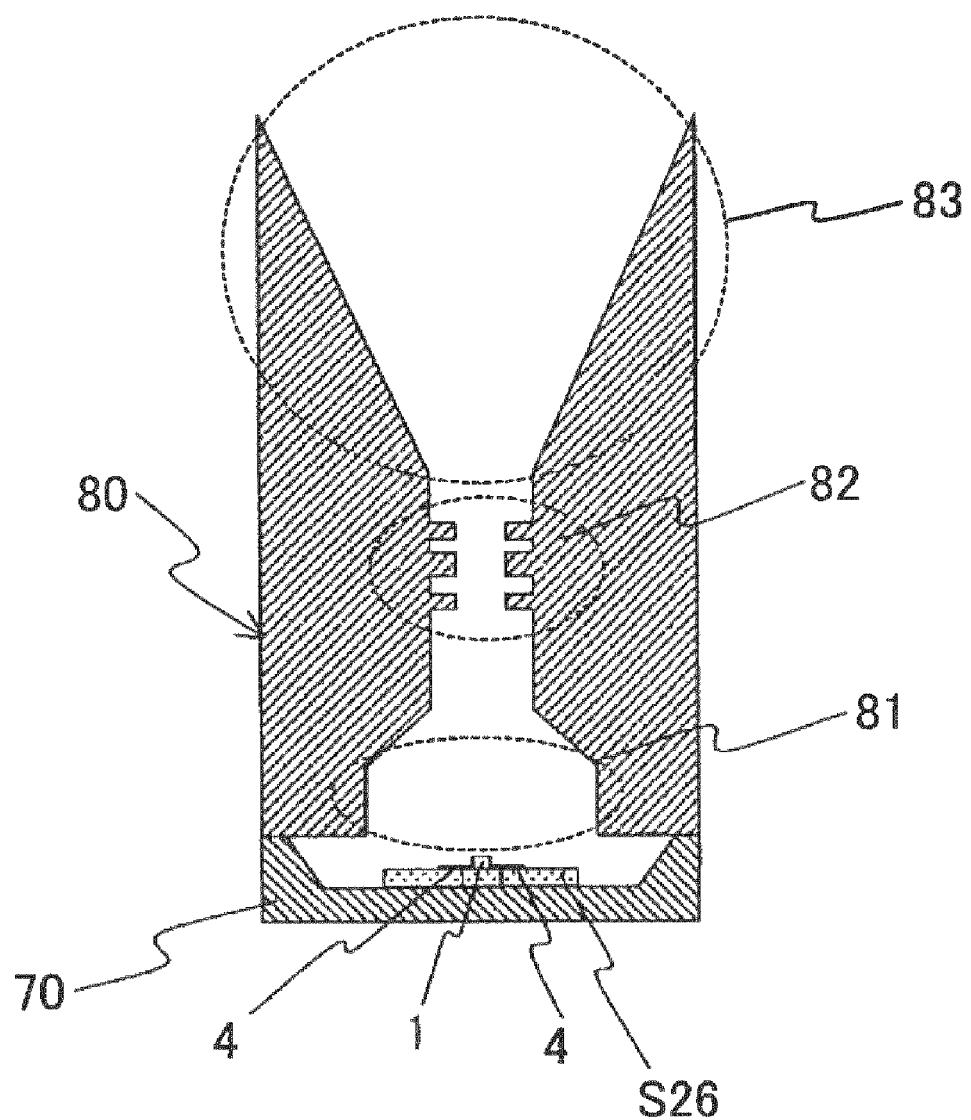
FIG. 42 is a schematic vertical cross-sectional view of a microwave/millimeter wave sensor apparatus according to a twenty-sixth embodiment.

Referring now to FIG. 42, a microwave/millimeter wave sensor apparatus according to a twenty-sixth embodiment of the present invention is described. In the schematic structure of the microwave/millimeter wave sensor apparatus according to this embodiment, a radiation type oscillator substrate S26 that has the same structure as one of the radiation type oscillator substrates S1 through S21 used in the microwave/millimeter wave sensor apparatuses of the first through the twenty-first embodiments is held by a substrate holding plate 70, and a waveguide filter 80 as a frequency selecting unit is placed on the radiation face side of the radiation type oscillator substrate S26.

The waveguide filter 80 includes a converter 81 that converts the radiation wave of a radiation type oscillator into the transmission wave of a waveguide, a filter 82 that is formed with a waveguide circuit such as an iris plate, and a horn antenna 83 that emits desired harmonic selectively filtered by the filter 82. For example, the converter 81 has a tapered structure in which the tube size is gradually varied toward the waveguide outlet having a desired size. If the radiation type oscillator substrate S26 has a smaller size than the waveguide outlet of the desired size, there is no need to prepare the tapered structure. In either way, the converter 81 should have such a structure as to efficiently convert the radiation wave from the radiation type oscillator substrate S26 to the transmission wave of the waveguide.

Similar to the microwave/millimeter wave sensor apparatuses according to the twenty-fourth embodiment and the twenty-fifth embodiment, the microwave/millimeter wave sensor apparatus of this embodiment emits the desired harmonic of an oscillation RF signal as a transmission harmonic signal to the measured object, and receives a harmonic signal reflected from the measured object onto its radiation face. Through homodyne harmonic mixing performed by the radiation type oscillator, an IF signal is obtained, and the measured object is sensed. Accordingly, even if a radiation type oscillator substrate is formed with a low-cost, low-performance transistor having a small fmax, a sensor apparatus of relatively high frequency can be advantageously realized.

(Twenty-Seventh Embodiment)

Figure 43:
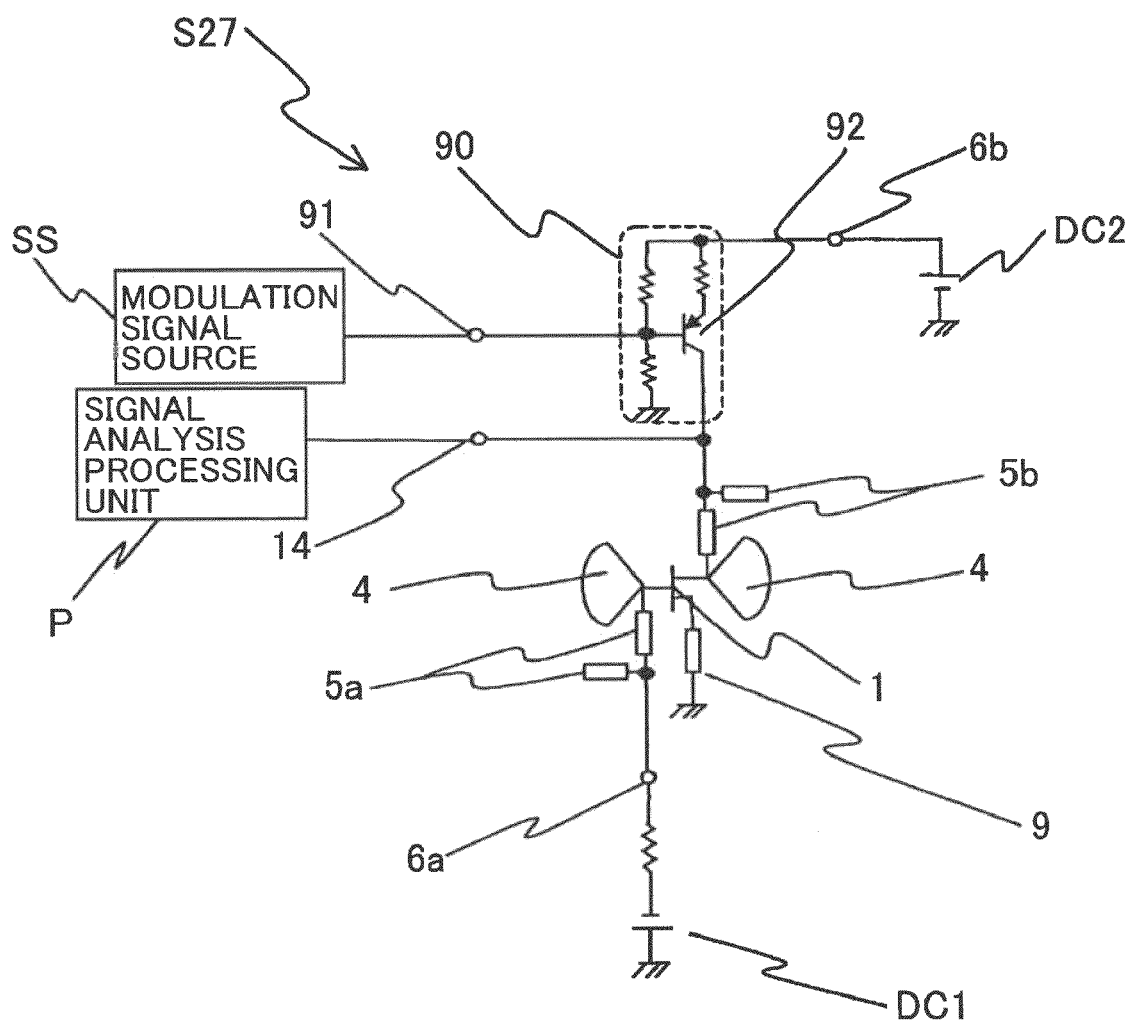
FIG. 43 is a circuit structure diagram of microwave/millimeter wave sensor apparatus according to a twenty-seventh embodiment.

Referring now to FIG. 43, a microwave/millimeter wave sensor apparatus according to a twenty-seventh embodiment of the present invention is described. In the structure of the microwave/millimeter wave sensor apparatus according to this embodiment, the gate voltage or the drain voltage for the high-frequency transistor 1 in a radiation type oscillator substrate S27 is varied, so as to vary the oscillation frequency or the oscillation amplitude.

For example, the radiation type oscillator substrate S27 is the same as the radiation type oscillator substrate S1 of the first embodiment, except that a signal source is used in place of the direct current source DC1 or DC2, and the bias voltage value of the gate or the drain of the high-frequency transistor 1 is varied so as to change the oscillation frequency or the oscillation amplitude to cause modulation. The oscillation frequency is changed by utilizing the bias dependence of the capacitance component or dielectric component of the transistor, and varying the resonance frequency of the resonating cavities. In this manner, frequency modulation is caused. Amplitude modulation is caused by utilizing the bias dependence of the oscillation amplitude.

In the radiation type oscillator substrate S27 shown in FIG. 43, the bias condition of the drain of the high-frequency transistor 1 is changed so as to vary the oscillation frequency or the oscillation amplitude, and cause modulation. This structure is the same as the radiation type oscillator substrate S1 used in the first embodiment, except that a bias control circuit 90 is provided, instead of the resistor 7.

In a modulating operation in the radiation type oscillator substrate S27 having the above structure, a modulation signal from a modulation signal source SS is input to the bias control circuit 90 via a current control terminal 91. In accordance with the modulation signal, the collector current of the transistor 92 forming the bias control circuit 90 varies. In other words, the drain bias of the high-frequency transistor 1 varies. As a result, the oscillation frequency or the oscillation amplitude varies. Similar to the first embodiment, an IF signal is obtained from an IF output terminal 14. However, the bias control circuit 90 also functions as the IF-band loading unit of the high-frequency transistor 1.

As described above, in the microwave/millimeter wave sensor apparatus according to this embodiment, it is possible to perform a FM-CW sensing operation, a pulse sensing operation, and the like that are performed in regular microwave/millimeter wave sensor apparatuses. Thus, this embodiment can provide a sensor apparatus that senses location information and the like about a measured object.

(Twenty-Eighth Embodiment)

Figure 44A:
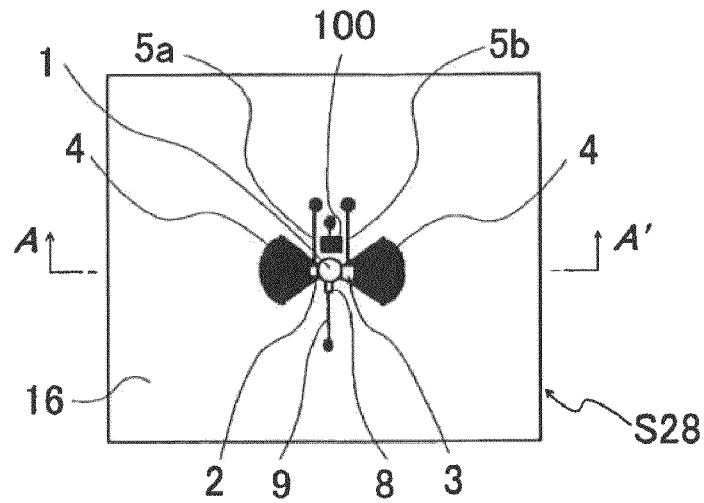
FIG. 44A, FIG. 44B, and FIG. 44C are schematic views of a microwave/millimeter wave sensor apparatus according to a twenty-eighth embodiment.
Figure 44B:
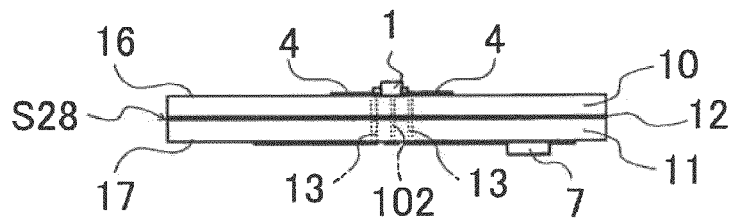
Figure 44C:
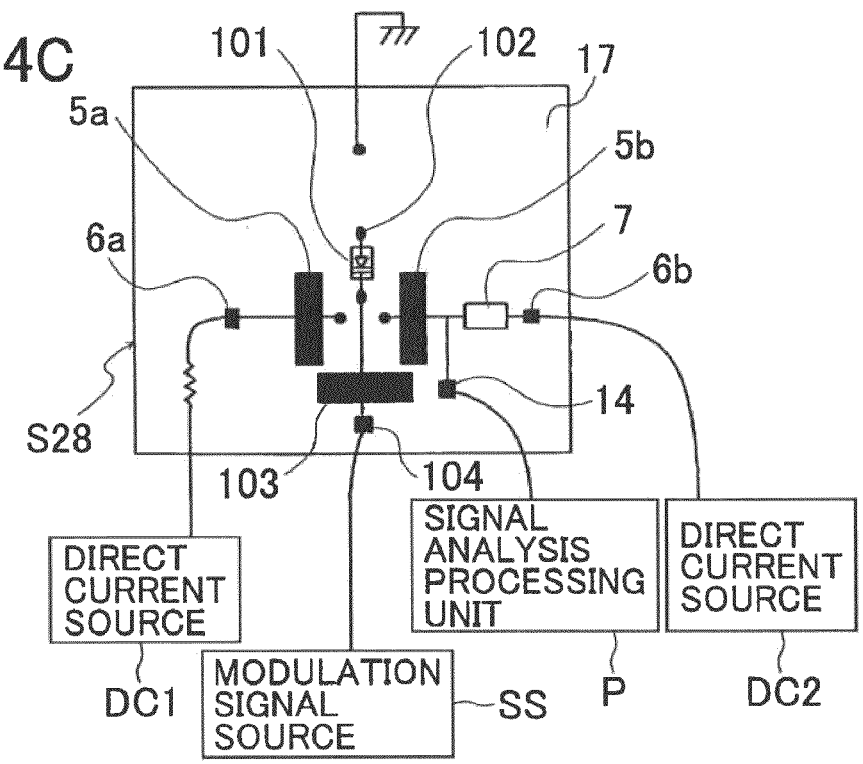

Referring now to FIG. 44A through FIG. 44C, a microwave/millimeter wave sensor apparatus according to a twenty-eighth embodiment of the present invention is described. FIG. 44A is a front view of a radiation type oscillator substrate S28. FIG. 44B is a cross-sectional view of the radiation type oscillator substrate S28, taken along the line A-A' of FIG. 44A. FIG. 44C is a rear view of the radiation type oscillator substrate S28. In the microwave/millimeter wave sensor apparatus according to this embodiment, a voltage-control impedance varying unit which is electromagnetically coupled with a radiation type oscillator in the radiation type oscillator substrate S28 is provided. A desired modulation signal voltage is applied to this impedance varying unit, so as to change the oscillation frequency. In this manner, the oscillation RF signal is modulated.

In the microwave/millimeter wave sensor apparatus according to this embodiment, a conductor pattern 100 that has a sufficiently smaller size than the wavelength and does not resonate with oscillation RF signals is provided near the conductor patches 4 of the radiation type oscillator substrate S28, and a varactor diode 101 as a variable capacitance device is connected to the conductor pattern 100. The conductor pattern 100 is not necessarily placed on the side of the front surface layer 16 of the substrate on which the conductor patches 4 are also formed, but may be provided on the inner layer 12 near the conductor patches 4, as long as electromagnetic coupling between the conductor pattern 100 and the radiation type oscillator is established. The cathode of the varactor diode 101 is connected to the conductor pattern 100, and the anode is connected to a through hole 102 formed in the inner layer GND 12. A modulation signal to be applied to the varactor diode 101 is input from a modulation signal source SS to the cathode via a RF choke circuit 103. The modulation signal source SS is connected to a current control terminal 104.

A resonator that determines the oscillation frequency of the microwave/millimeter wave sensor apparatus according to this embodiment is formed with the inner layer GND 12 and the conductor patches 4 having the front surface side dielectric substrate 10 interposed in between. Since the electromagnetic fields of oscillation RF signals concentrate on the neighborhood area of the conductor patches 4 on the front surface side dielectric substrate 10, the oscillation frequency is varied by changing the impedance near the conductor patches 4 with the varactor diode 101. If the conductor pattern 100 has such a size as to resonate with oscillation RF signals, frequency modulation can be performed. However, not to affect the radiation directivity, it is desirable to prepare the conductor pattern 100 having a sufficiently smaller size than the wavelength. Also, frequency modulation performed by a variable capacitance device advantageously causes a smaller variation in the oscillation output power, compared with frequency modulation performed by changing the bias voltage of the microwave transistor 1.

As described above, in the microwave/millimeter wave sensor apparatus according to this embodiment, it is possible to perform a FM-CW sensing operation and the like that are performed in regular microwave/millimeter wave sensor apparatuses. Thus, this embodiment can provide a sensor apparatus that senses location information and the like about a measured object.

(Twenty-Ninth Embodiment)

Figure 45A:
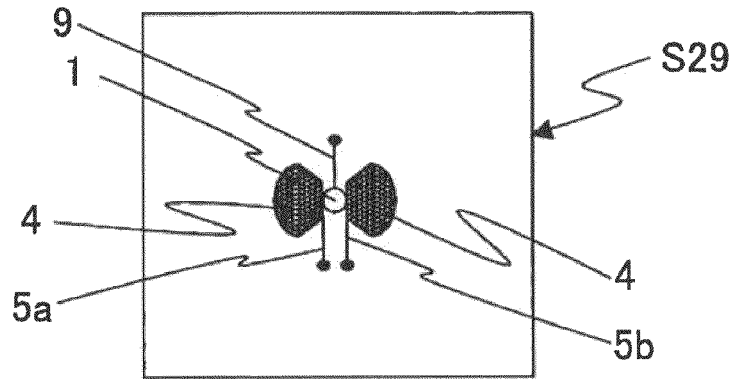
FIG. 45A, FIG. 45B, and FIG. 45C are schematic views of a microwave/millimeter wave sensor apparatus according to a twenty-ninth embodiment.
Figure 45B:
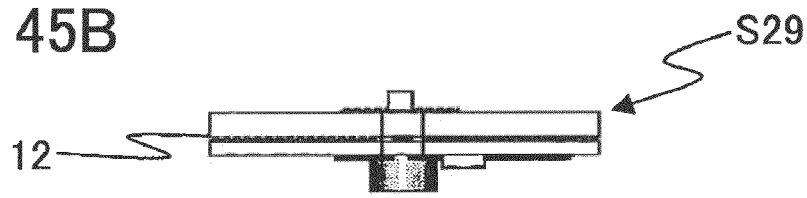
Figure 45C:
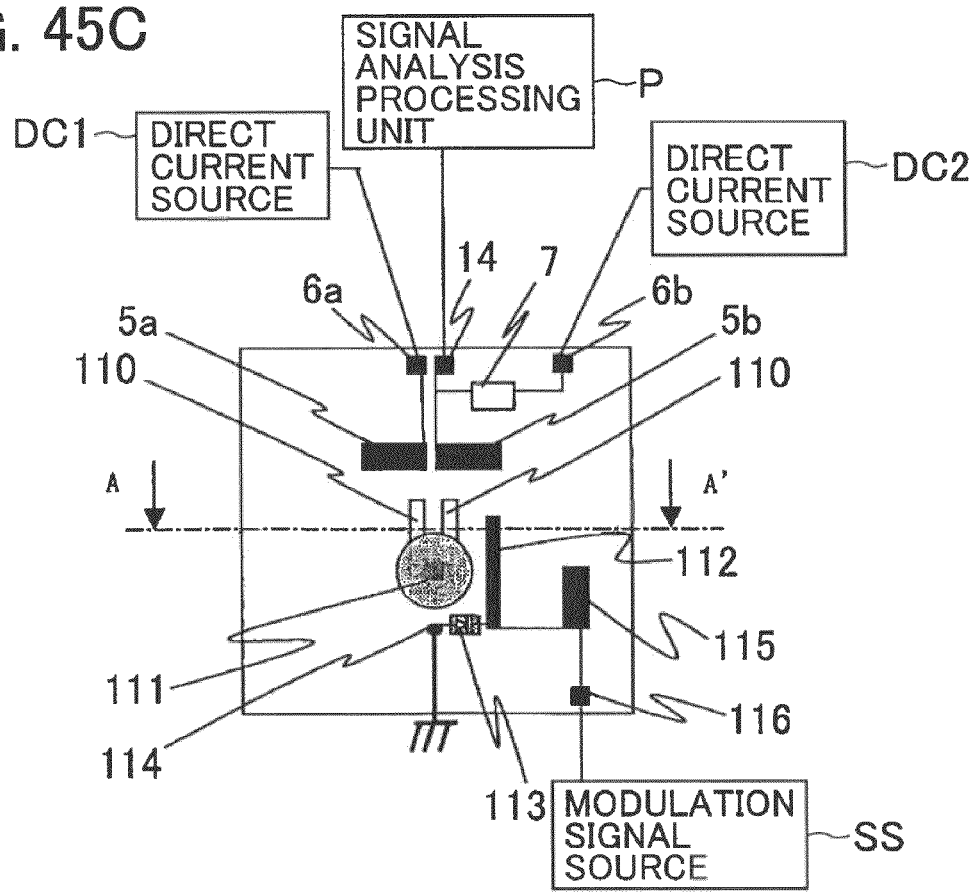

Referring now to FIG. 45A through FIG. 45C, a microwave/millimeter wave sensor apparatus according to a twenty-ninth embodiment of the present invention is described. FIG. 45A is a front view of a radiation type oscillator substrate S29. FIG. 45B is a cross-sectional view of the radiation type oscillator substrate S29, taken along the line A-A' of FIG. 45C. FIG. 45C is a rear view of the radiation type oscillator substrate S29. In the microwave/millimeter wave sensor apparatus according to this embodiment, a dielectric resonator which is electromagnetically coupled with a radiation type oscillator in the radiation type oscillator substrate S29 is provided. Further, a variable capacitance device that varies the impedance near the dielectric resonator is provided. A desired modulation signal voltage is applied to this variable capacitance device, so as to change the oscillation frequency. In this manner, an oscillation RF signal is modulated.

Coupling slots 110 are formed in the inner layer GND 12 near the conductor patches 4 of the radiation type oscillator substrate S29, so as to cause electromagnetic coupling between the dielectric resonator 111 and the conductor patches 4. Further, the dielectric resonator 111 is arranged to be able to electromagnetically couple with a microstrip line 112, and a varactor diode 113 is connected as the variable capacitance device to the microstrip line 112. The cathode of the varactor diode 113 is connected to the microstrip line 112, and the anode is connected to the inner layer GND 12 via a through hole 114. An external modulation signal to be applied to the varactor diode 113 is input to the cathode via a RF choke circuit 115. Power is supplied from a modulation signal source SS to the RF choke circuit 115 via a power supply terminal 116.

In the microwave/millimeter wave sensor apparatus according to this embodiment, the resonator that determines the oscillation frequency of the radiation type oscillator is mainly the dielectric resonator 111. Accordingly, the varactor diode 113 changes the impedance near the dielectric resonator 111, so as to perform frequency modulation. Thus, it becomes possible to perform a FM-CW sensing operation and the like. Further, frequency modulation performed by a variable capacitance device advantageously causes a smaller variation in the oscillation output power, compared with frequency modulation performed by changing the bias voltage of the microwave transistor 1.

As described above, in the microwave/millimeter wave sensor apparatus according to this embodiment, a FM-CW sensing operation and the like that are performed in regular microwave/millimeter wave sensor apparatuses can be performed, similar to the microwave/millimeter wave sensor apparatus according to the twenty-eighth embodiment. Thus, this embodiment can provide a sensor apparatus that senses location information and the like about a measured object.

(Thirtieth Embodiment)

Figure 46A:
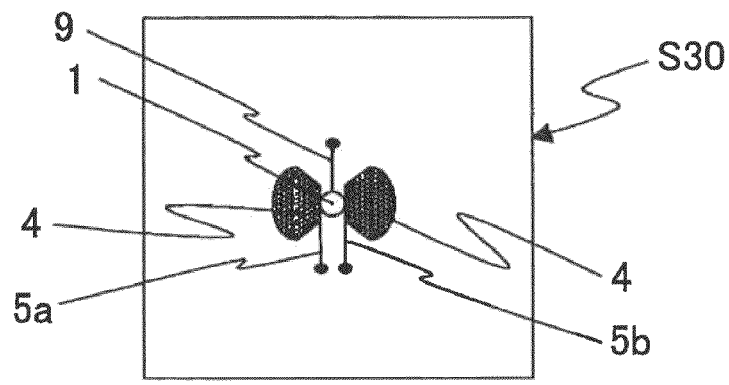
FIG. 46A, FIG. 46B, and FIG. 46C are schematic views of a microwave/millimeter wave sensor apparatus according to a thirtieth embodiment.
Figure 46B:
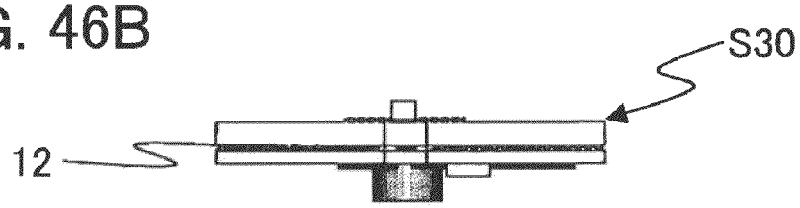
Figure 46C:
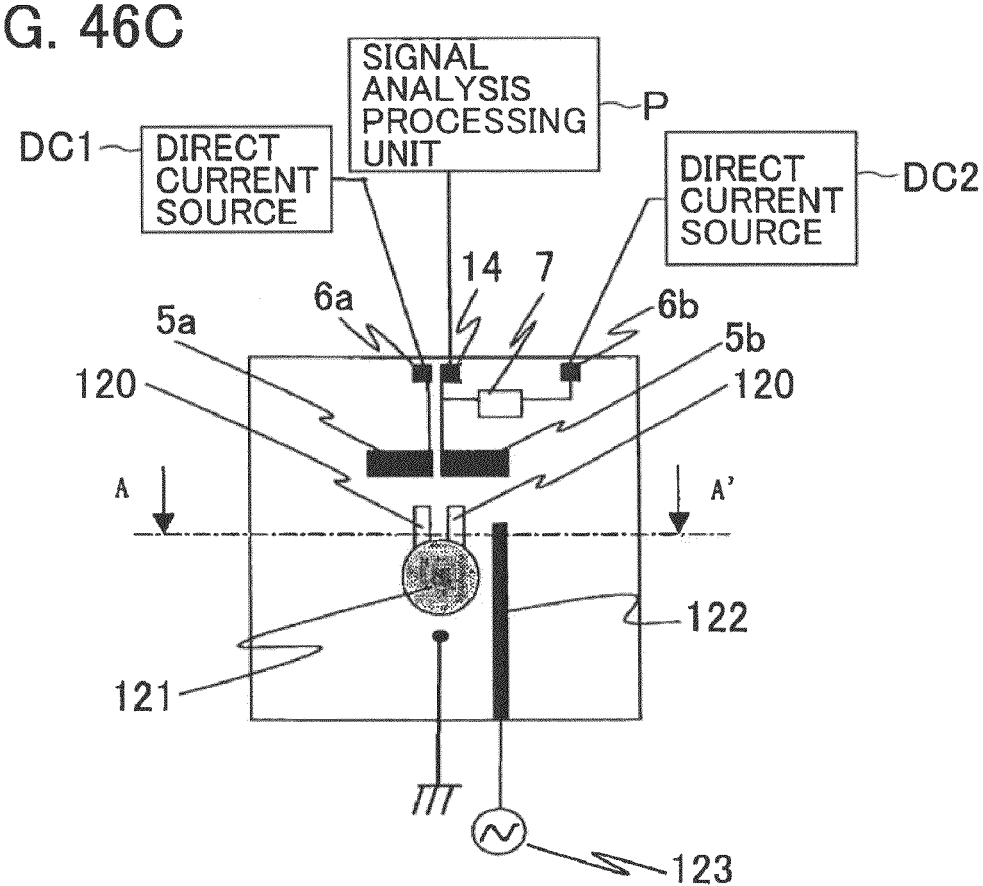

Referring now to FIG. 46A through FIG. 46C, a microwave/millimeter wave sensor apparatus according to a thirtieth embodiment of the present invention is described. FIG. 46A is a front view of a radiation type oscillator substrate S30.
FIG. 46B is a cross-sectional view of the radiation type oscillator substrate S30, taken along the line A-A' of FIG. 46C. FIG. 46C is a rear view of the radiation type oscillator substrate S30. In the microwave/millimeter wave sensor apparatus according to this embodiment, an injection lock signal can be supplied to the radiation type oscillator in the radiation type oscillator substrate S30. An oscillation RF signal is synchronized with the injection lock signal, or the frequency of the injection lock signal is changed, so as to change the oscillation frequency of the synchronized oscillation RF signal.

The radiation type oscillator substrate S30 is designed to cause electromagnetic coupling between a dielectric resonator 121 and the conductor patches 4 via slots 120 formed in the inner layer GND 12. A microstrip line 122 that is coupled to the dielectric resonator 121 through electromagnetic coupling is also provided. The injection lock signal is input from a signal source 123 to the microstrip line 122, so as to synchronize the oscillation RF signal of the radiation type oscillator with the injection lock signal.

The frequency fi of the injection lock signal to be supplied from the signal source 123 to the radiation type oscillator substrate S30 may be 1/N (N being 1, 2, 3 . . . ) of the frequency fo of the oscillation RF signal synchronized with the injection lock signal. In a case where N is 2, 3 . . . , the oscillation RF signal is synchronized with a desired harmonic signal of the injection lock signal generated inside the radiation type oscillator.

As described above, in the microwave/millimeter wave sensor apparatus according to this embodiment, the frequency of the injection lock signal is changed, so as to change the frequency of the oscillation RF signal synchronized with the injection lock signal. In this manner, a FM-CW sensing operation and the like that are performed in regular microwave/millimeter wave sensor apparatuses can be performed, similar to the microwave/millimeter wave sensor apparatuses according to the twenty-eighth and the twenty-ninth embodiments. Thus, this embodiment can provide a sensor apparatus that senses location information and the like about a measured object. Furthermore, a stable injection lock signal is used, and an oscillation RF signal is synchronized with the injection lock signal. Thus, the oscillation frequency can be advantageously stabilized.

(Thirty-First Embodiment)

Figure 47A:
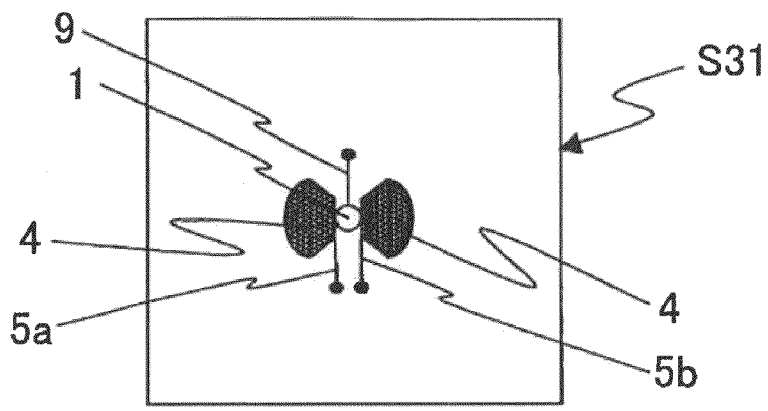
FIG. 47A, FIG. 47B, and FIG. 47C are schematic views of a microwave/millimeter wave sensor apparatus according to a thirty-first embodiment.
Figure 47B:
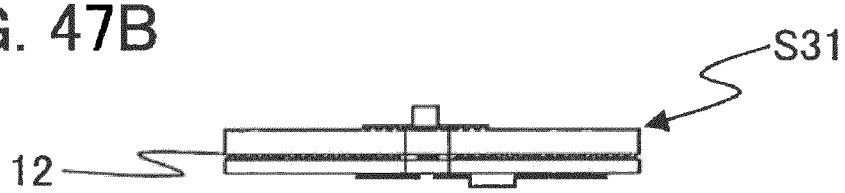
Figure 47C:
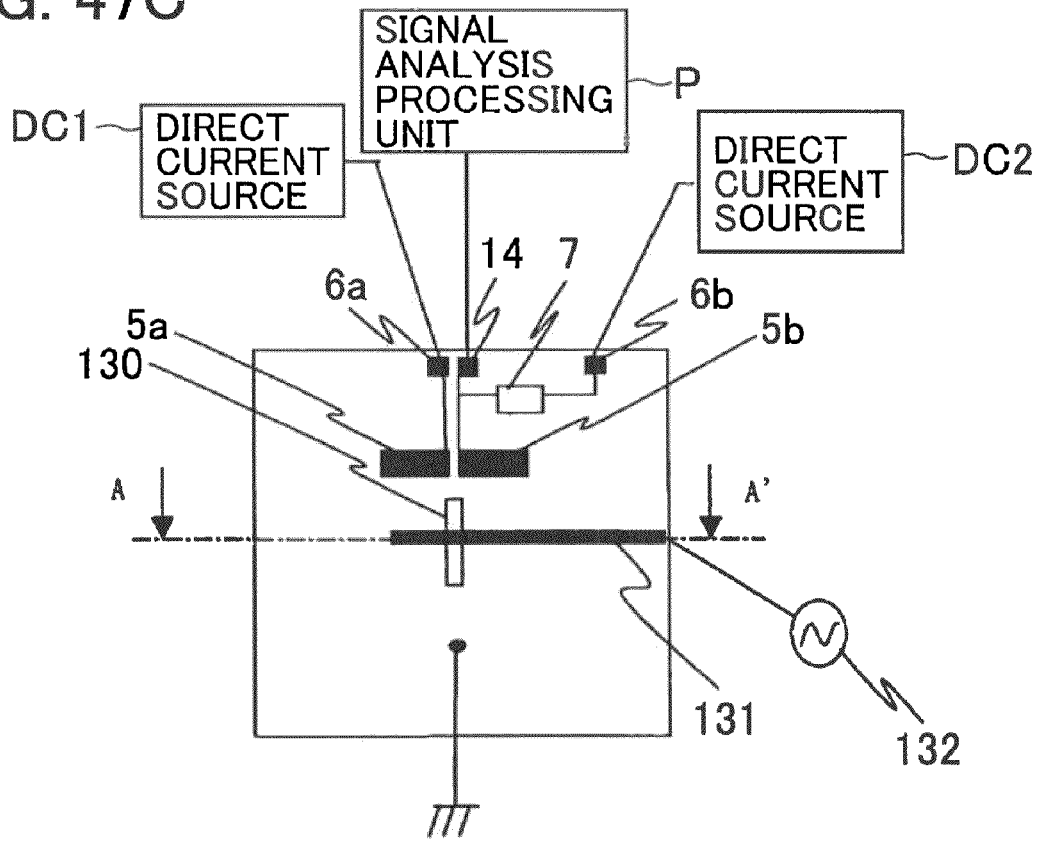

Referring now to FIG. 47A through FIG. 47C, a microwave/millimeter wave sensor apparatus according to a thirty-first embodiment of the present invention is described. FIG. 47A is a front view of a radiation type oscillator substrate S31. FIG. 47B is a cross-sectional view of the radiation type oscillator substrate S31, taken along the line A-A' of FIG. 47C. FIG. 47C is a rear view of the radiation type oscillator substrate S31. In the microwave/millimeter wave sensor apparatus according to this embodiment, an injection lock signal can be supplied to the radiation type oscillator in the radiation type oscillator substrate S31. An oscillation RF signal is synchronized with the injection lock signal, or the frequency of the injection lock signal is changed, so as to change the oscillation frequency of the synchronized oscillation RF signal.

The radiation type oscillator substrate S31 is designed to cause electromagnetic coupling between a microstrip line 131 and the conductor patches 4 via slots 130 formed in the inner layer GND 12. The injection lock signal is input from a signal source 132 to the microstrip line 131, so as to synchronize the oscillation RF signal of the radiation type oscillator with the injection lock signal. The frequency fi of the injection lock signal to be supplied from the signal source 132 to the radiation type oscillator substrate S31 may be 1/N (N being 1, 2, 3 . . . ) of the frequency fo of the oscillation RF signal synchronized with the injection lock signal. In a case where N is 2, 3 . . . , the oscillation RF signal is synchronized with a desired harmonic signal of the injection lock signal generated inside the radiation type oscillator.

As described above, in the microwave/millimeter wave sensor apparatus according to this embodiment, the frequency of the injection lock signal is changed, so as to change the frequency of the oscillation RF signal synchronized with the injection lock signal. In this manner, a FM-CW sensing operation and the like that are performed in regular microwave/millimeter wave sensor apparatuses can be performed, similar to the microwave/millimeter wave sensor apparatuses according to the twenty-eighth through the thirtieth embodiments. Thus, this embodiment can provide a sensor apparatus that senses location information and the like about a measured object. Furthermore, a stable injection lock signal is used, and an oscillation RF signal is synchronized with the injection lock signal. Thus, the oscillation frequency can be advantageously stabilized.

(Thirty-Second Embodiment)

Figure 48A:
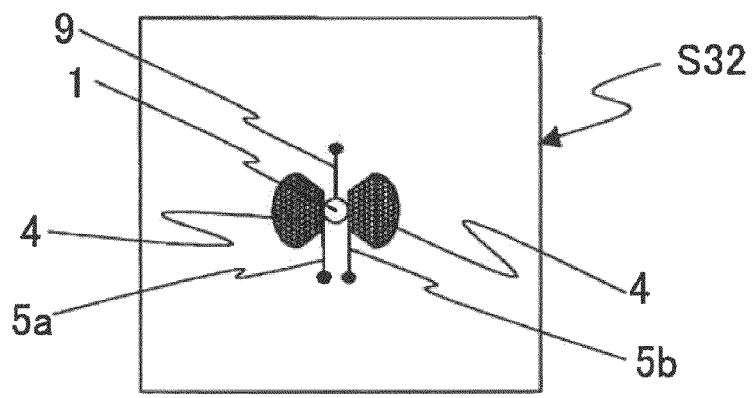
FIG. 48A, FIG. 48B, and FIG. 48C are schematic views of a microwave/millimeter wave sensor apparatus according to a thirty-second embodiment.
Figure 48B:
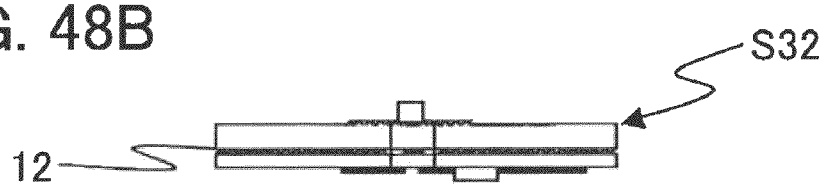
Figure 48C:
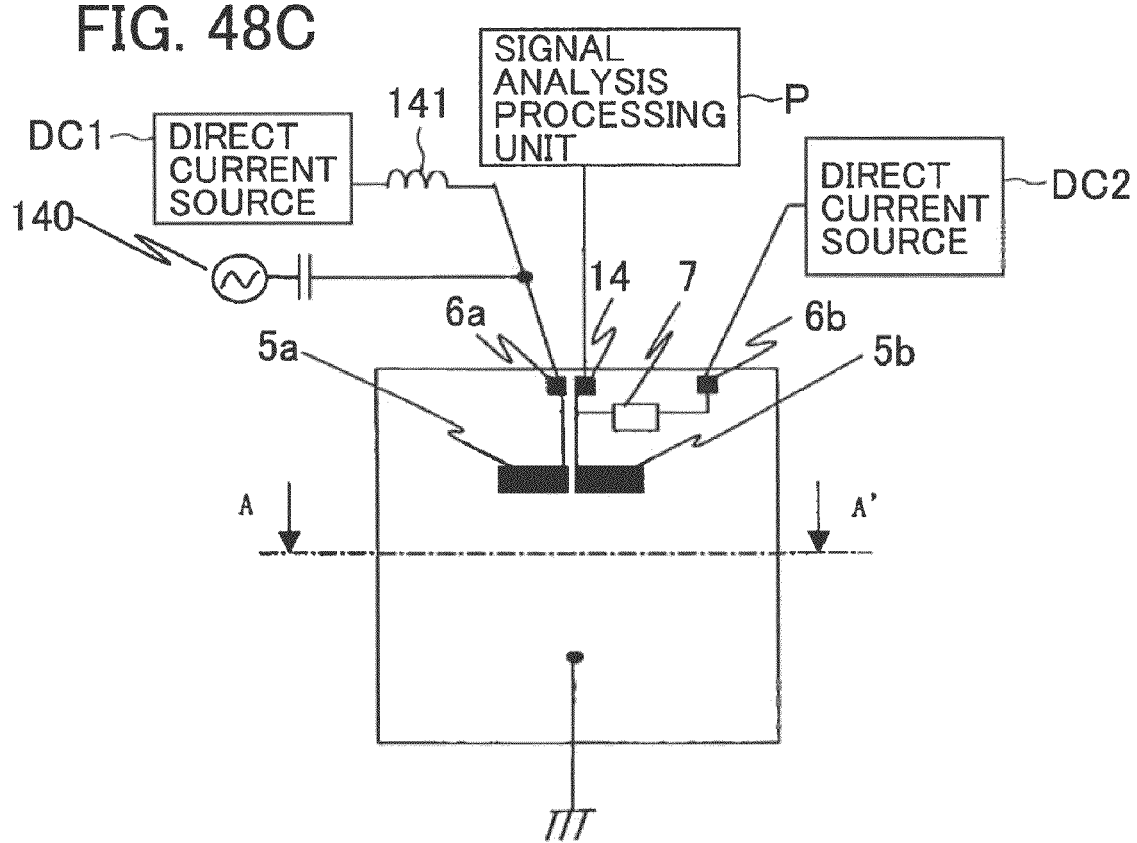

Referring now to FIG. 48A through FIG. 48C, a microwave/millimeter wave sensor apparatus according to a thirty-second embodiment of the present invention is described. FIG. 48A is a front view of a radiation type oscillator substrate S32. FIG. 48B is a cross-sectional view of the radiation type oscillator substrate S32, taken along the line A-A' of FIG. 48C. FIG. 48C is a rear view of the radiation type oscillator substrate S32. In the microwave/millimeter wave sensor apparatus according to this embodiment, an injection lock signal is input to the radiation type oscillator via the direct-current bias circuit of the high-frequency transistor 1 of the radiation type oscillator substrate S32, and the oscillation RF signal of the radiation type oscillator is synchronized with the injection lock signal.

The radiation type oscillator substrate S32 has an injection lock signal source 140 connected between the RF choke circuit 5a and the direct current source DC1, and a choke circuit 141 that is effective at the frequency of the injection lock signal is provided so as to prevent the injection lock signal from entering the side of the direct current source DC1. The injection lock signal is input to the radiation type oscillator accordingly.

The RF choke circuit 5a in the radiation type oscillator substrate S32 is effective at frequencies in the neighborhood of the frequency of the oscillation RF signal of the radiation type oscillator. When an injection lock signal of a frequency in the neighborhood of the oscillation RF signal frequency is input, the injection lock signal is reflected by the RF choke circuit 5a, and is hardly input to the radiation type oscillator. Therefore, the power for the injection lock signal is increased, or the injection lock signal frequency is set at ½ or ⅓ of the oscillation RF signal frequency, so as to synchronize the oscillation RF signal with the harmonic of the injection lock signal.

As described above, in the microwave/millimeter wave sensor apparatus according to this embodiment, the frequency of the injection lock signal is changed, so as to change the frequency of the oscillation RF signal synchronized with the injection lock signal. In this manner, a FM-CW sensing operation and the like that are performed in regular microwave/millimeter wave sensor apparatuses can be performed, similar to the microwave/millimeter wave sensor apparatuses according to the twenty-eighth through the thirty-first embodiments. Thus, this embodiment can provide a sensor apparatus that senses location information and the like about a measured object. Furthermore, a stable injection lock signal is used, and an oscillation RF signal is synchronized with the injection lock signal. Thus, the oscillation frequency can be advantageously stabilized.

(Thirty-Third Embodiment)

Figure 49:
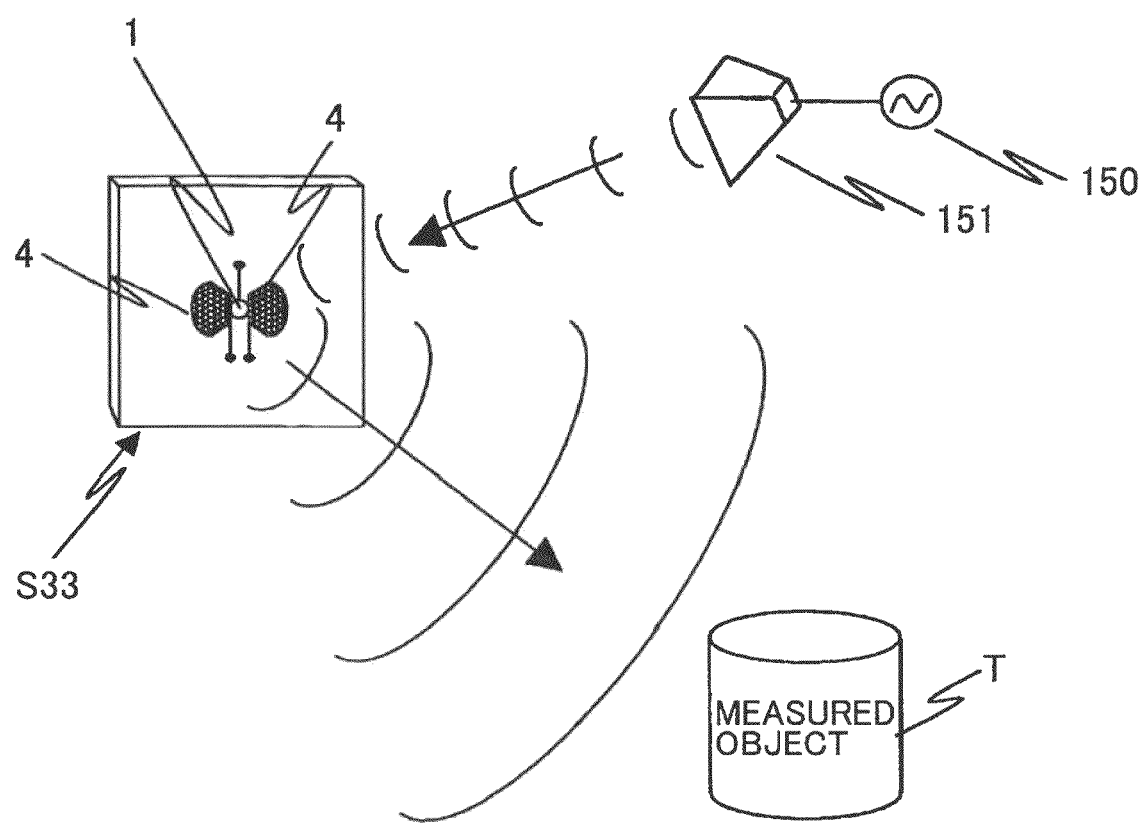
FIG. 49 is a schematic view showing the structure of a microwave/millimeter wave sensor apparatus according to a thirty-third embodiment.

Referring now to FIG. 49, a microwave/millimeter wave sensor apparatus according to a thirty-third embodiment of the present invention is described. In the microwave/millimeter wave sensor apparatus according to this embodiment, an injection lock signal is input to a radiation type oscillator substrate S33 via a space, and the oscillation RF signal of the radiation type oscillator is synchronized with the injection lock signal.

In the microwave/millimeter wave sensor apparatus according to this embodiment, an injection lock signal source 150 and an emitter 151 are placed in positions at appropriate distances from the radiation type oscillator substrate S33 (at least in such positions as not to hinder emission of oscillation RF signals to the measured object T and reception of waves reflected from the measured object T). An injection lock signal is emitted to the radiation type oscillator, and the oscillation RF signal of the radiation type oscillator is synchronized with the injection lock signal.

As described above, in the microwave/millimeter wave sensor apparatus according to this embodiment, the frequency of the injection lock signal is changed, so as to change the frequency of the oscillation RF signal synchronized with the injection lock signal. In this manner, a FM-CW sensing operation and the like that are performed in regular microwave/millimeter wave sensor apparatuses can be performed, similar to the microwave/millimeter wave sensor apparatuses according to the twenty-eighth through the thirty-second embodiments. Thus, this embodiment can provide a sensor apparatus that senses location information and the like about a measured object. Furthermore, a stable injection lock signal is used, and an oscillation RF signal is synchronized with the injection lock signal. Thus, the oscillation frequency can be advantageously stabilized.

(Thirty-Fourth Embodiment)

Figure 50A:
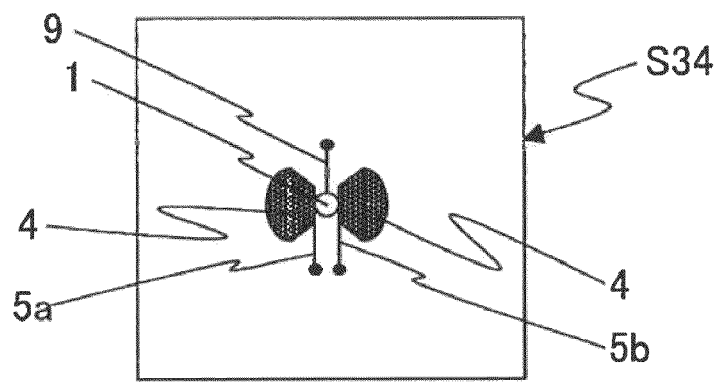
FIG. 50A, FIG. 50B, and FIG. 50C are schematic views of a microwave/millimeter wave sensor apparatus according to a thirty-fourth embodiment.
Figure 50B:
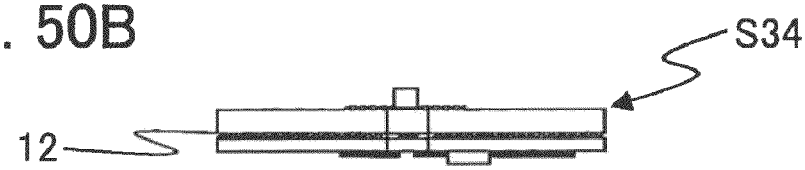
Figure 50C:
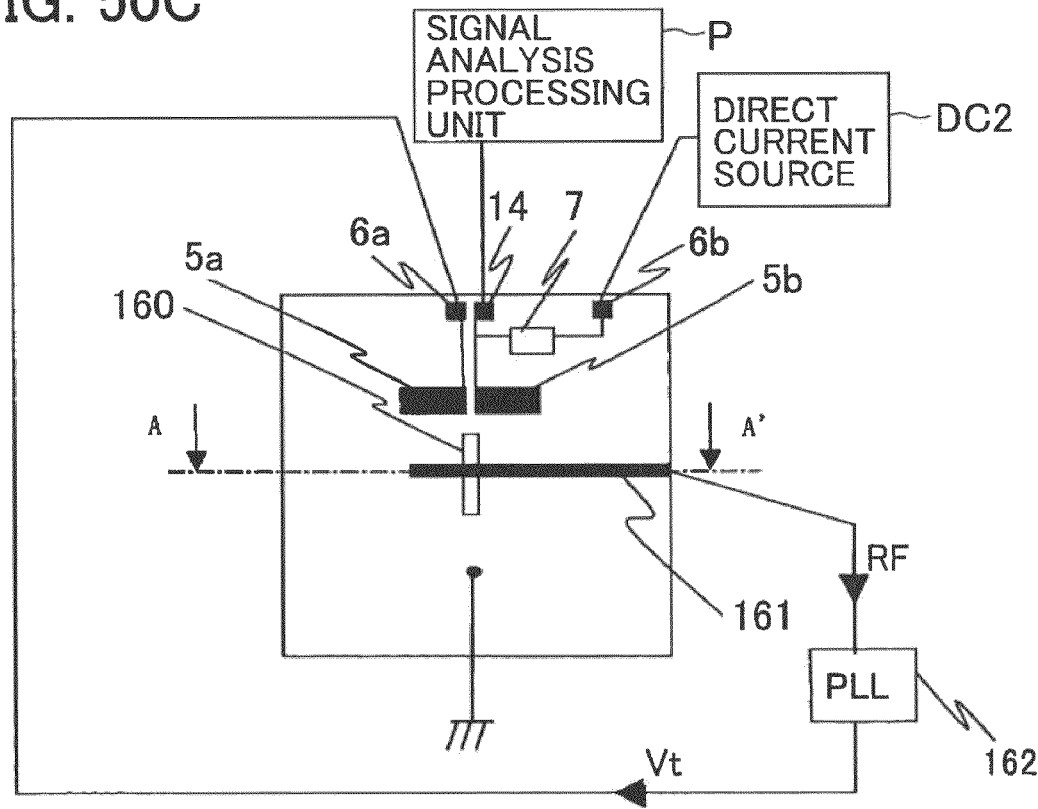

Referring now to FIG. 50A through FIG. 50C, a microwave/millimeter wave sensor apparatus according to a thirty-fourth embodiment of the present invention is described. FIG. 50A is a front view of a radiation type oscillator substrate S34. FIG. 50B is a cross-sectional view of the radiation type oscillator substrate S34, taken along the line A-A' of FIG. 50C. FIG. 50C is a rear view of the radiation type oscillator substrate S34. In the microwave/millimeter wave sensor apparatus according to this embodiment, the radiation type oscillator of the radiation type oscillator substrate S34 is used as a VCO (Voltage Controlled Oscillator), and a PLL (Phase Locked Loop) circuit is formed.

The radiation type oscillator substrate S34 is designed to cause electromagnetic coupling between a microstrip line 161 and the conductor patches 4 via slots 160 formed in the inner layer GND 12. The microstrip line 161 is connected to the PLL unit 162, and the power of the oscillation RF signal of the radiation type oscillator is partially input to the PLL unit 162. A control voltage Vt is applied from the PLL unit 162 to the gate voltage supply terminal 6a. The radiation type oscillator in this case functions as a radiation type VCO that has the oscillation frequency controlled by the gate voltage. The PLL unit 162 may be integrally formed in the radiation type oscillator substrate S34, for example.

Other than the technique utilizing the slots 160 according to this embodiment, there are various techniques to transmit part of the oscillation RF signal power of the radiation type oscillator to the PLL unit 162. For example, oscillation RF signal leakage from the RF choke circuit may be input to the PLL unit. Similar to the radiation type oscillator substrate S28 of the twenty-eighth embodiment, the conductor pattern 100 may be provided, and the oscillation RF signal may be obtained from the electromagnetic coupling portion connected to the radiation type oscillator, and be input to the PLL unit. The oscillation RF signal obtained from the coupling line connected to a dielectric resonator, such as the microstrip line 112 of the radiation type oscillator substrate S29 of the twenty-ninth embodiment, may be input to the PLL unit. Part of the radiation RF signal of the radiation type oscillator may be spatially collected by an external antenna or the like, and be input to the PLL unit.

The circuit structure of the PLL unit 162 is not particularly limited, and various structures may be used for the PLL unit 162. For example, the PLL unit 162 may be formed with a reference frequency oscillating circuit including a crystal oscillator, a phase comparator, a divider circuit, and a loop filter circuit. With this circuit structure, a phase comparison is made between the reference frequency and the frequency obtained by dividing the oscillation RF signal of the radiation type oscillator, and the output of the phase comparator circuit is input as the control voltage Vt to the radiation type oscillator.

As described above, in the microwave/millimeter wave sensor apparatus according to this embodiment, the oscillation RF signal is synchronized with a stable reference frequency signal. In this manner, the oscillation frequency can be stabilized. Also, a programmable divider circuit is used in the PLL unit, so that the dividing ratio can be changed. Accordingly, by changing the frequency of the oscillation RF signal, the frequency of oscillation RF signals in synchronization with that is changed. In this manner, a FM-CW sensing operation and the like that are performed in regular microwave/millimeter wave sensor apparatuses can be performed, similar to the microwave/millimeter wave sensor apparatuses according to the twenty-eighth through the thirty-third embodiments. Thus, this embodiment can also provide a sensor apparatus that senses location information and the like about a measured object.

Although the embodiments of microwave/millimeter wave sensor apparatuses according to the present invention have been described so far, the present invention is not limited only to those embodiments, but concerns all microwave/millimeter wave sensor apparatuses that can be embodied without a change in the structures recited in the claims.

The features of each microwave/millimeter wave sensor apparatus according to the present invention, such as being less expensive and consuming less electric power, are advantageous in practical use where the apparatus is used in a system or a measurement test device involving a large number of sensors. Particularly, each microwave/millimeter wave sensor apparatus according to the present invention is expected to have a clear advantage over millimeter wave band sensor systems and apparatuses that are high in component cost and have lower power efficiency due to increases in transmission loss and poor device performance.

The simple structure of each microwave/millimeter wave sensor apparatus according to the present invention is advantageous particularly in restricting variations in characteristics and securing high production yield in the quality control during the process for manufacturing millimeter wave devices that depend on precise and minute thin-film processing techniques, and millimeter wave band apparatuses using those millimeter wave devices. Each microwave/millimeter wave sensor apparatus of the present invention that has high reliability and is less expensive is suitable for use in an on-vehicle sensor (radar) system, a radio wave monitoring system for security, medical care, and nursing care, a precise vibration sensor system, an active imaging array, and the like.

The on-vehicle sensor system has a plurality of microwave/millimeter wave sensor apparatuses of the present invention mounted on the front and back and at the left and right of a vehicle body, and causes each of the microwave/millimeter wave sensor apparatuses to perform an appropriate modulating operation or the like. The phase information, the delay time difference, and the like about an IF signal obtained from one of the microwave/millimeter wave sensor apparatuses is subjected to collective signal processing and analysis. Automatic control is then performed, and a report or the like is made to the driver. With this system, more diversified and accurate sensing or higher-resolution sensing can be performed, compared with a case where a single sensor apparatus is used. Also, there is no need to use a motor or the like to mechanically change the direction of the sensor, and the direction of a target can be electrically identified at high speed. Particularly, since each microwave/millimeter wave sensor apparatus of the present invention can be provided at low cost and with low power consumption, it is possible to produce a reasonably-priced on-vehicle sensor system that has a safe driving function such as a high-precision anti-collision function using a number of sensor apparatuses, a drive assisting function to be used for parking, and an accident preventing function for preventing accidents caused due to the blind spots around the vehicle.

The radio wave monitoring system for security, medical care, and nursing care has microwave/millimeter wave sensor apparatuses of the present invention placed at a number of locations around a subject residence. Based on the IF signals obtained from the sensor apparatuses placed at the respective locations, information about the existence, location, and movement of a suspicious individual and the like is transmitted. Alternatively, the radio wave monitoring system for security, medical care, and nursing care has microwave/millimeter wave sensor apparatuses of the present invention attached to the ceiling above a large number of beds for patients in a hospital, thereby forming a network. Over the network, the existence and breathing of each patient are monitored, and a warning is issued when a problem is found. To construct such a system involving a large number of sensor apparatuses, it is essential that each sensor apparatus is inexpensive. Accordingly, microwave/millimeter wave sensor apparatuses of the present invention are advantageous. Particularly, each microwave/millimeter wave sensor apparatus of the present invention has high-sensitive characteristics, and accordingly, can be operated with weakened radiation power. Also, each microwave/millimeter wave sensor apparatus of the present invention can be provided at lost costs as a sensor apparatus that uses radio waves of quasi-millimeter wave bands and millimeter wave bands that have less influence on operations of other electronic devices than radio waves of quasi-microwave bands that are widely used by mobile phone handsets and the like in recent years. Accordingly, microwave/millimeter wave sensor apparatuses of the present invention are highly useful in hospitals that need to eliminate external radio waves adversely affecting operations of medical equipment and pacemakers.

In the precise vibration sensor system, output radio waves (a transmit RF signal) from a microwave/millimeter wave sensor apparatus of the present invention is emitted onto a predetermined spot on the surface of a wall of a building or the like, and an IF signal is obtained by receiving the reflected waves (a receive RF signal) from the surface of the wall or the like. In this manner, minute vibration of the surface, and the position, distortion, and flatness of the surface that slowly change over a long period of time are sensed through changes in the IF signal voltage. The zero-beat IF signal of the standing wave between the microwave/millimeter wave sensor apparatus of the present invention and the measured object, or the DC voltage value, is recorded prior to sensing, and calibration is performed. In this manner, a change of a micrometer size in the measured object can be detected. For example, a risk aversion system that monitors the tiles on the wall surfaces of a building and can sensitively detect peeling, cracking, dropping of the tiles due to the age of the wall surfaces can be constructed at low costs. Accordingly, a system that can detect peeling and cracking of the inside of the tiles (the bonding surfaces) undetectable by the human eye or an optical sensor can be constructed at low costs.

In the microwave/millimeter wave sensor apparatus according to the present invention, as for the active imaging array, radiation type oscillators are arranged in a matrix consisting of N rows and M columns, and one or all of the radiation type oscillators are activated to perform scanning under matrix control. IF signals obtained from the respective radiation type oscillators are collectively subjected to signal processing and analysis. In this manner, the shape of a measured object or a change in the shape or the like is imaged.

Industrial Applicability

As described above, each microwave/millimeter wave sensor apparatus according to the present invention has a simple structure and can be realized at low cost, though having high power efficiency and high sensitivity. Accordingly, those microwave/millimeter wave sensor apparatuses according to the present invention are highly useful in measurement test device, on-vehicle sensor systems, various medical devices, and the like.

The invention claimed is:

1. A microwave/millimeter wave sensor apparatus, comprising:
    a radiation type oscillator formed by integrating a three-electrode high-frequency amplifying device to generate negative resistance at resonating cavities, and share an antenna function to emit electromagnetic wave to space;
    wherein oscillated radiation wave of the radiation type oscillator is a transmit RF signal, and reflected wave from a measured object reflecting the transmit RF signal is a receive RF signal, said radiation type oscillator receiving the receive RF signal and obtaining an IF signal through homodyne mixing performed by the radiation type oscillator; and
    a signal analysis processing unit analyzing and processing the IF signal amplified by amplification gain from DC to IF bands of the three-electrode high-frequency amplifying device oscillating in an RF band, thereby sensing the measured object.

2. A microwave/millimeter wave sensor apparatus, according to claim 1, wherein:
    the three electrodes of the three-electrode high-frequency amplifying device of the radiation type oscillator are a controlled-current entering electrode, a controlled-current exiting electrode, and a control electrode,
    an RF choke circuit that allows direct-current bias voltage and IF signals to pass, and blocks RF signals is connected to the controlled-current entering electrode of the three-electrode high-frequency amplifying device, and
    an IF-band loading unit is inserted between the RF choke circuit and a power supply path of a direct current source, so as to obtain the IF signal from between the IF-band loading unit and the RF choke circuit.

3. A microwave/millimeter wave sensor apparatus, according to claim 1, wherein:
    the three electrodes of the three-electrode high-frequency amplifying device of the radiation type oscillator are a controlled-current entering electrode, a controlled-current exiting electrode, and a control electrode,
    an RF choke circuit that allows direct-current bias voltage and IF signals to pass, and blocks RF signals is connected to the controlled-current exiting electrode of the three-electrode high-frequency amplifying device, and
    an IF-band loading unit is inserted between the RF choke circuit and a power supply path of a direct current source, so as to obtain the IF signal from between the IF-band loading unit and the RF choke circuit.

4. A microwave/millimeter wave sensor apparatus, according to claim 1, wherein:
    resonating cavities for oscillation stabilization are formed in the radiation type oscillator, and electromagnetic coupling is caused between the resonating cavities for oscillation stabilization and the radiation type oscillator.

5. A microwave/millimeter wave sensor apparatus, according to claim 1, wherein:
    a horn structure that may improve radiation directivity of a transmit RF signal is provided on a radiation face side of the radiation type oscillator.

6. A microwave/millimeter wave sensor apparatus, according to claim 1, comprising:
    a frequency selective filtering unit that is placed at an appropriate distance from a radiation face of the radiation type oscillator, and selectively filters radio waves of predetermined frequency.

7. A microwave/millimeter wave sensor apparatus according to claim 1, wherein:
    a housing that has a ground conductor face on which the radiation type oscillator can be mounted is provided, and a partially transmissive reflecting face is placed on a radiation face side at a distance equivalent to an electric length of $\lambda/2$ wavelength or an integral multiple of the $\lambda/2$ wavelength from the ground conductor face of the housing, and
    the partially transmissive reflecting face and the ground conductor face that face each other form a beam radiation type resonator.

8. A microwave/millimeter wave sensor apparatus according to claim 1, wherein:
    a beam radiation type resonator that is formed with two partially transmissive reflecting face placed to face each other is provided on a radiation face side of the radiation type oscillator, and
    R1 represents reflectivity of one of the reflecting faces, R2 represents reflectivity of the other one of the reflecting faces, and R1 is greater than R2, the R2 face side having the lower reflectivity is placed to face the radiation face side, so as to cause electromagnetic coupling between the beam radiation type resonator and the radiation type oscillator.

9. A microwave/millimeter wave sensor apparatus according to claim 1, wherein:
    a direct-current bias value to be supplied to the three-electrode high-frequency amplifying device of the radiation type oscillator is varied so as to change oscillation frequency or oscillation amplitude.

10. A microwave/millimeter wave sensor apparatus according to claim 1, wherein:
    an impedance varying unit formed with a variable capacitance device is provided at resonating cavities that determine oscillation frequency of the transmit RF signal, and the oscillation frequency is varied with an external signal applied to the variable capacitance device.

11. A microwave/millimeter wave sensor apparatus according to claim 1, wherein:
an external injection lock signal is allowed to be supplied to the radiation type oscillator, thereby stabilizing oscillation frequency.

12. A microwave/millimeter wave sensor apparatus according to claim 11, wherein:
frequency of the external injection lock signal is changed so as to change the oscillation frequency of the transmit RF signal.

13. A microwave/millimeter wave sensor apparatus, comprising:
a radiation type oscillator formed by integrating a three-electrode high-frequency amplifying device to generate negative resistance at resonating cavities, and share an antenna function to emit electromagnetic wave to space; and
a harmonic selecting unit selectively transmitting desired harmonic of an oscillation RF signal emitted from a radiation face of said radiation type oscillator;
said desired harmonic of said oscillation RF signal being a transmission harmonic signal, and reflected wave from a measured object reflecting said transmission harmonic signal being a reception harmonic signal;
said radiation type oscillator receiving said reception harmonic signal, and obtaining an IF signal through homodyne harmonic mixing performed by said radiation type oscillator; and
a signal analysis processing unit analyzing and processing said IF signal amplified by amplification gain from DC to IF bands of said three-electrode high-frequency amplifying device oscillating in an RF band, thereby sensing the measured object.

14. A microwave/millimeter wave sensor apparatus according to claim 13, wherein:
the harmonic selecting unit is placed at an appropriate distance from the radiation face side of the radiation type oscillator, and serves as a frequency selective circuit pattern face that selectively filters radio waves of predetermined frequency.

15. A microwave/millimeter wave sensor apparatus according to claim 13, wherein:
a beam radiation type resonator formed with two partially transmissive reflecting faces facing each other is placed at an appropriate distance from the radiation face side of the radiation type oscillator, and the harmonic selecting unit adjusts resonance frequency of the beam radiation type resonator to desired harmonic frequency.

16. A microwave/millimeter wave sensor apparatus according to claim 13, wherein:
the harmonic selecting unit is a waveguide filter that selectively passes and emits desired harmonic.

* * * * *